US011360174B2

(12) United States Patent
Lukin et al.

(10) Patent No.: US 11,360,174 B2
(45) Date of Patent: Jun. 14, 2022

(54) PULSE SEQUENCE DESIGN PROTOCOL

(71) Applicant: President and Fellows of Harvard College, Cambridge, MA (US)

(72) Inventors: Mikhail D. Lukin, Cambridge, MA (US); Hengyun Zhou, Cambridge, MA (US); Joonhee Choi, Cambridge, MA (US); Soonwon Choi, El Cerrito, CA (US); Helena Knowles, Cambridge, MA (US); Renate Landig, Seattle, WA (US)

(73) Assignee: President and Fellows of Harvard College, Cambridge, MA (US)

( * ) Notice: Subject to any disclaimer, the term of this patent is extended or adjusted under 35 U.S.C. 154(b) by 286 days.

(21) Appl. No.: 16/812,055

(22) Filed: Mar. 6, 2020

(65) Prior Publication Data

US 2020/0284862 A1 Sep. 10, 2020

Related U.S. Application Data

(60) Provisional application No. 62/814,775, filed on Mar. 6, 2019.

(51) Int. Cl.
*G01R 33/54* (2006.01)
*G01R 33/12* (2006.01)
*G01R 33/46* (2006.01)

(52) U.S. Cl.
CPC ......... *G01R 33/54* (2013.01); *G01R 33/1284* (2013.01); *G01R 33/4608* (2013.01)

(58) Field of Classification Search
CPC . G01R 33/54; G01R 33/1284; G01R 33/4608
See application file for complete search history.

(56) References Cited

U.S. PATENT DOCUMENTS

2018/0031656 A1\* 2/2018 Ordidge ............. G01R 33/4833
2018/0365584 A1\* 12/2018 Li ........................... G06N 10/00

OTHER PUBLICATIONS

Abanin et al., "Many-body localization, thermalization, and entanglement," Reviews of Modern Physics, vol. 91(021001), published May 22, 2019. arXiv:1804.11065v2. 30 pages.
Ajoy et al., "Quantum Simulation via Filtered Hamiltonian Engineering: Application to Perfect Quantum Transport in Spin Networks," Physical Review Letters 110(220503), May 31, 2013. 5 pages.

(Continued)

*Primary Examiner* — Jermele M Hollington
*Assistant Examiner* — Taqi R Nasir
(74) *Attorney, Agent, or Firm* — Wilmer Cutler Pickering Hale and Dorr LLP

(57) ABSTRACT

Systems and methods are disclosed for a pulse sequence that reduces disorder and/or interaction effects in spin systems. A protocol can be used to design a pulse sequence that includes altering the frame orientation of the spin system with each electromagnetic pulse in the pulse sequence. The frame orientations during the sequence can conform to certain conditions. The number positive rotations along each axis can be the same as the number negative rotations along the respective axis. The number of rotations along one axis should be the same as the number of rotations along the other axes.

18 Claims, 30 Drawing Sheets

(56) References Cited

OTHER PUBLICATIONS

Alvarez et al., "Experimental observation of a phase transition in the evolution of many-body systems with dipolar interactions," Science, (2015), vol. 349(846), arXiv:1409.4562v1, submitted Sep. 16, 2014. 7 pages.
Alvarez et al., "Performance comparison of dynamical decoupling sequences for a qubit in a rapidly fluctuating spin bath," Physical Review A, Oct. 7, 2010, vol. 82(042306). 6 pages.
Ambainis et al., "Quantum t-designs: t-wise independence in the quantum world," Twenty-Second Annual IEEE Conference on Computational Complexity (CCC'07), IEEE, Jun. 13-16, 2007. arXiv:0701126v2, Feb. 6, 2007. 19 pages.
Aslam et al., "Nanoscale nuclear magnetic resonance with chemical resolution," Science, Jul. 7, 2017, vol. 357, 67-71. 6 pages.
Bauch et al., "Ultralong Dephasing Times in Solid-State Spin Ensembles via Quantum Control," Physical Review X, Jul. 25, 2018, vol. 8:031025. 11 pages.
Biercuk et al., "Optimized Dynamical Decoupling in a Model Quantum Memory," Nature, Apr. 23, 2009, vol. 458, 996-1000. arXiv:0812.5095v3, Jan. 5, 2009. 7 pages.
Bohn et al., "Cold molecules: Progress in quantum engineering of chemistry and quantum matter," Science, Sep. 8, 2017, vol. 357, 1002-1010. 9 pages.
Buchler et al., "Three-body interactions with cold polar molecules," Nature Physics (2007) vol. 3, 726. arXiv:0703688v1, Mar. 26, 2007. 8 pages.
Burum et al., "Analysis of multiple pulse NMR in solids. III," The Journal of Chemical Physics, Jul. 15, 1979, vol. 71, pp. 944-956.
Bylander et al., "Noise spectroscopy through dynamical decoupling with a superconducting flux qubit," Nature Physics Jul. 2011, vol. 7, pp. 565-570.
Cappellaro et al., "Quantum correlation in disordered spin systems: entanglement and applications to magnetic sensing," Physical Review A (2009, vol. 80(032311). arXiv:0904.2642v1, Apr. 17, 2009. 8 pages.
Carr et al., "Cold and ultracold molecules: science, technology and applications," New Journal of Physics, May 14, 2009, vol. 11(055049). 88pages.
Carr et al., "Effects of Diffusion on Free Precession in Nuclear Magnetic Resonance Experiments," Physical Review, May 1, 1954, vol. 94(3); pp. 630-638.
Casola, et al., "Probing condensed matter physics with magnetometry based on nitrogen-vacancy centres in diamond," Nature Reviews Materials, published online Jan. 4, 2018, vol. 3(17088). 13 pages.
Chancellor et al., "Circuit design for multi-body interactions in superconducting quantum annealing systems with applications to a scalable architecture," Nature Partner Journals: Quantum Information, Jun. 6, 2017, vol. 3, No. 21. 7 pages.
Choi et al., "Depolarization Dynamics in a Strongly Interacting Solid-State Spin Ensemble," Physical Review Letters, Mar. 3, 2017, PRL 118:093601. 6 pages.
Choi et al., "Dynamical Engineering of Interactions in Qudit Ensembles," Physical Review Letters, Nov. 3, 2017, PRL 119:183603. 6 pages.
Choi et al., "Observation of discrete time-crystalline order in a disordered dipolar many-body system," Nature, Mar. 8, 2017, vol. 543(7644), author manuscript, 23 pages.
Choi et al., "Probing Quantum Thermalization of a Disordered Dipolar Spin Ensemble with Discrete Time-Crystalline Order," Physical Review Letters, Feb. 1, 2019, vol. 122(043603). 6 pages.
Choi et al., "Quantum Metrology based on Strongly Correlated Matter," arXiv preprint, Dec. 29, 2017, arXiv:1801.00042v1. 11 pages.
Clevenson et al., "Broadband magnetometry and temperature sensing with a light-trapping diamond waveguide," Nature Physics, May 2015, vol. 11, pp. 393-397 and 878.
Cory et al., "Multiple-pulse methods of 1H N.M.R. imaging of solids: second-averaging," Molecular Physics (1990), vol. 70, No. 2, pp. 331-345.
Cory et al., "Time-Suspension Multiple-Pulse Sequences: Applications to Solid-State Imaging," Journal of Magnetic Resonance, Oct. 15, 1990, vol. 90, pp. 205-213.
Cory, "A New Multiple-Pulse Cycle Homonuclear Dipolar Decoupling," Journal of Magnetic Resonance, Oct. 1, 1991, vol. 94(1), pp. 526-534.
Cory, "Distortions in multiple-pulse solid states NMR imaging: gradient decoupling, time-sequenced second averaging, and oversampling," Solid State Nuclear Magnetic Resonance, Jul. 1996, vol. 6, pp. 347-355.
D'Alessio et al., "From quantum chaos and eigenstate thermalization to statistical mechanics and thermodynamics," Advances in Physics, published online Jul. 31, 2016, vol. 65, pp. 239-362.
Dankert et al., "Exact and approximate unitary 2-designs and their application to fidelity estimation," Physical Review A, Jul. 6, 2009, vol. 80(012304). 6 pages.
De Lange et al., "Controlling the quantum dynamics of a mesoscopic spin bath in diamond," Scientific Reports, Apr. 25, 2012, vol. 2:382. 5 pages.
De Lange et al., "Single-Spin Magnetometry with Multipulse Sensing Sequences," Physical Review Letters, Feb. 25, 2011, PRL 106:080802. 4 pages.
De Lange et al., "Universal dynamical decoupling of a single solid-state spin from a spin bath," Science, Oct. 2010, vol. 330, 60. 16 pages.
Degen et al., "Nanoscale magnetic resonance imaging," Proceedings of the National Academy of Sciences, Feb. 3, 2009, vol. 106, No. 5, pp. 1313-1317.
Degen et al., "Quantum sensing," Reviews of Modern Physics, Jul.-Sep. 2017, vol. 89(035002). 39 pages.
DeVience et al., "Nanoscale NMR spectroscopy and imaging of multiple nuclear species," Nature Nanotechnology, Feb. 2015, vol. 10, pp. 129-134, Erratum. 7 pages.
DiVincenzo et al., "Quantum Data Hiding," IEEE Transactions on Information Theory, Mar. 2002, vol. 48(3), pp. 580-598.
Doherty et al., "The nitrogen-vacancy colour centre in diamond," Physics Reports, vol. 528, pp. 1-45, available online Mar. 4, 2013.
Doherty, et al., "Electronic Properties and Metrology of the Diamond $NV^-$ Center under Pressure," Physical Review Letters, Jan. 31, 2014, vol. 112(047601), arXiv: 1305.2291v3. 6 pages.
Dolde, et al., "Electric-field sensing using single diamond spins," Nature Physics, Jun. 2011, vol. 7, pp. 459-463.
Doria et al., "Optimal Control Technique for Many-Body Quantum Dynamics," Physical Review Letters, May 13, 2011, vol. 106(190501), 4 pages.
Dovzhenko et al., "Magnetostatic twists in room-temperature skyrmions explored by nitrogen-vacancy center spin texture reconstruction," Nature Communications, published online Jul. 13, 2018, 7 pages.
Du et al., "Preserving electron spin coherence in solids by optimal dynamical decoupling," Nature, Oct. 29, 2009, vol. 461, pp. 1265-1268.
Dur et al., "Standard forms of noisy quantum operations via depolarization," Physical Review A, Nov. 22, 2005, vol. 72(052326). 7 pages.
Eckardt, "Colloquium: Atomic quantum gases in periodically driven optical lattices," Reviews of Modern Physics, Mar. 31, 2017, vol. 89(011004). 10 pages.
Edmonds et al., "Production of oriented nitrogen-vacancy color centers in synthetic diamond," Physical Review B, Jul. 5, 2012, vol. 86(035201). 7 pages.
Eichhorn et al., "Optimizing the formation of depth-confined nitrogen vacancy center spin ensembles in diamond for quantum sensing," arXiv preprint: arXiv:1901.11519v1, Jan. 31, 2019. 8 pages.
Else et al., "Floquet Time Crystals," Physical Review Letters, Aug. 25, 2016, PRL 117:090402. 5 pages.
Emerson et al., "Pseudo-Random Unitary Operators for Quantum Information Processing," Science, Dec. 19, 2003, vol. 302, pp. 2098-2100.

(56) References Cited

OTHER PUBLICATIONS

Fang et al., "High-Sensitivity Magnetometry Based on Quantum Beats in Diamond Nitrogen-Vacancy Centers," Physical Review Letters, Mar. 26, 2013, PRL 110:130802. 5 pages.
Feher, "Electron Spin Resonance Experiments on Donors in Silicon. I. Electronic Structure of Donors by the Electron Nuclear Double Resonance Technique," Physical Review, Jun. 1, 1959, vol. 114(5), pp. 1219-1244 and figures (38 pages).
Fradkin et al., "A Chern-Simons effective field theory for the Pfaffian quantum Hall state," Nuclear Physics B, Apr. 20, 1998, vol. 516(3), pp. 704-718.
Fu et al., "Solar nebula magnetic fields recorded in the Semarkona meteorite," Nov. 28, 2014, Science, vol. 346(6213), pp. 1089-1091.
Fukui et al., "Perfect selective alignment of nitrogen-vacancy centers in diamond," Applied Physics Express, published online Apr. 9, 2014, vol. 7(055201). 4 pages.
Garttner et al., "Measuring out-of-time-order correlations and multiple quantum spectra in a trapped-ion quantum magnet," Nature Physics, Aug. 2017, vol. 13, pp. 781-782.
Glenn et al., "High-resolution magnetic resonance spectroscopy using a solid-state spin sensor," Nature, Mar. 15, 2018, vol. 555, pp. 351-354 and Methods. 14 pages.
Gullion et al., "New, Compensated Carr-Purcell Sequences," Journal of Magnetic Resonance, Oct. 1990, vol. 89, pp. 479-484.
Haberle et al., "Nanoscale nuclear magnetic imaging with chemical contrast," Nature Nanotechnology, Feb. 2015, vol. 10, pp. 125-128.
Haeberlen et al., "Coherent Averaging Effects in Magnetic Resonance," Physical Review, Nov. 10, 1968, vol. 175(2), pp. 453-467.
Haeberlen et al., "Resonance Offset Effects in Multiple-Pulse NMR Experiments," The Journal of Chemical Physics, Jul. 1, 1971, vol. 55(1), pp. 53-62.
Hahn, "Spin Echoes," Physical Review, Nov. 15, 1950, vol. 80, No. 4, pp. 580-594 and figures. 22 pages.
Hall et al., "Ultrasensitive diamond magnetometry using optimal dynamic decoupling," Physical Review B—Condensed Matter and Materials Physics, Jul. 29, 2010, vol. 82:045208. 5 pages.
Hayes et al., "Programmable Quantum Simulation by Dynamic Hamiltonian Engineering," New Journal of Physics (2014), vol. 16(083027). arXiv:1309.6736v4, Jun. 18, 2014. 23 pages.
Heyl, "Dynamical quantum phase transitions: a review," Reports on Progress in Physics, Apr. 5, 2018, vol. 81(054001). 22 pages.
Ho et al., "Critical Time Crystals in Dipolar Systems," Physical Review Letters, Jul. 6, 2017, vol. 119(010602). 6 pages.
Hsieh et al., "Imaging stress and magnetism at high pressures using a nanoscale quantum sensor," arXiv preprint, arXiv:1812.08796v1, Dec. 20, 2018. 68 pages.
Iwamiya et al., "Application of Optimal Control Theory in Solid-State NMR. Time-Suspension Multiple-Pulse Sequences," Journal of Magnetic Resonance, Series A, Jul. 1993, vol. 103, pp. 313-322.
Jiang et al., "Majorana Fermions in Equilibrium and in Driven Cold-Atom Quantum Wires," Physical Review Letters, Jun. 2, 2011, vol. 106:220402. 4 pages.
Khaneja et al., "Optimal control of coupled spin dynamics: design of NMR pulse sequences by gradient ascent algorithms," Journal of Magnetic Resonance, available online Dec. 2, 2005, vol. 172, p. 296-305.
Khemani et al., "Phase Structure of Driven Quantum Systems," Physical Review Letters, Jun. 24, 2016, PRL 116:250401. 6 pages.
Khodjasteh et al., "Fault-Tolerant Quantum Dynamical Decoupling," Physical Review Letters, Oct. 26, 2005, PRL 95:180501. 4 pages.
Kitagawa et al., "Squeezed spin states," Physical Review A, Jun. 1993, vol. 47, pp. 5138-5143.
Knowles et al., "Observing bulk diamond spin coherence in high-purity nanodiamonds," Nature Materials, Nov. 24, 2013, vol. 13, 21. 16 pages.
Kucsko et al., "Critical thermalization of a disordered dipolar spin system in a diamond," Physical Review Letters (2018), vol. 121:023601. arXiv: 1609.08216v2, Oct. 25, 2017. 47 pages.

Kucsko et al., "Nanometre-scale thermometry in a living cell," Nature, Aug. 1, 2013, vol. 500, pp. 54-58 and Methods. 6 pages.
Lang et al., "Enhanced Resolution in Nanoscale NMR via Quantum Sensing with Pulses of Finite Duration," Physical Review Applied, May 15, 2017, vol. 7(054009). 12 pages.
Lang et al., "The non-vanishing effect of detuning errors in dynamical decoupling based quantum sensing experiments," Physical Review A, (2019), vol. 99(012110), arXiv:1809.03234v2, Mar. 8, 2019. 11 pages.
Le Sage et al., "Efficient photon detection from color centers in a diamond optical waveguide," Physical Review B, Mar. 23, 2012, vol. 85:121202. 4 pages.
Le Sage et al., "Optical magnetic imaging of living cells," Nature, Apr. 25, 2013, vol. 496, pp. 486-489 and Methods. 6 pages.
Lee, "Floquet engineering from long-range to short-range interactions," Physical Review A, Oct. 10, 2016, vol. 94:040701. 6 pages.
Lesik et al., "Preferential orientation of NV defects in CVD diamond films grown on (113)-oriented substrates," Diamond and Related Materials, available online May 8, 2015, vol. 56, pp. 47-53.
Levin et al., "String-net condensation: A physical mechanism for topological phases," Physical Review B, Jan. 12, 2005, vol. 71(045110). 21 pages.
Li et al., "Generating Unexpected Spin Echoes in Dipolar Solids with pi Pulses", Physical Review Letters, May 10, 2007, vol. 98(190401). arXiv: 0705.0667v1. 4 pages.
Lindner et al., "Floquet Topological Insulator in Semiconductor Quantum Wells," Nature Physics (2011), vol. 7, 490-495. arXiv:1008.1792v2, Sep. 7, 2010. 7 pages.
Loretz et al., "Spurious Harmonic Response of Multipulse Quantum Sensing Sequences," Physical Review X, Apr. 22, 2015, vol. 5(021009). 7 pages.
Magnus, "On the Exponential Solution of Differential Equations for a Linear Operator," Communications on Pure and Applied Mathematics, Nov. 1954, vol. 7, pp. 649-673.
Mamin et al., "Multipulse Double-Quantum Magnetometry with Near-Surface Nitrogen-Vacancy Centers," Physical Review Letters, Jul. 17, 2014, PRL 113:030803. 5 pages.
Mansfield, "Symmetrized pulse sequences in high resolution nmr in solids," Journal of Physics C: Solid State Physics (1971), vol. 4, pp. 1444-1452.
McDonald et al., "An NMR multiple pulse sequence for the imaging of solids using sinusoidally driven magnetic field gradients," Journal of Physics E: Scientific Instruments, Nov. 1, 1989, vol. 22, pp. 948-951.
Meiboom et al., "Modified Spin-Echo Method for Measuring Nuclear Relaxation Times," Review of Scientific Instruments, Aug. 1958, vol. 29, No. 8, pp. 688-691.
Mezzacapo et al. "Many-Body Interactions with Tunable-Coupling Transmon Qubits," Physical Review Letters, Jul. 30, 2014, vol. 113(050501). 5 pages.
Michl et al., "Perfect alignment and preferential orientation of nitrogen-vacancy centers during chemical vapor deposition diamond growth on (111) surfaces," Applied Physics Letters, published online Mar. 12, 2014, vol. 104(102407). 6 pages.
Moessner et al., "Resonating Valence Bond Phase in the Triangular Lattice Quantum Dimer Model," Physical Review Letters, Feb. 26, 2001, vol. 86, pp. 1881-1884.
Mohammady et al., "Low-control and robust quantum refrigerator and applications with electronic spins in diamond," Physical Review A, Apr. 25, 2018, vol. 97:042124. 16 pages.
Moore et al., "Nonabelions in the fractional quantum hall effect," Nuclear Physics B, Aug. 19, 1991, vol. 360, pp. 362-396.
Nandkishore et al., "Many-Body Localization and Thermalization in Quantum Statistical Mechanics," Annual Review of Condensed Matter Physics, Mar. 2015, vol. 6, pp. 15-38.
Naydenov et al., "Dynamical decoupling of a single-electron spin at room temperature," Physical Review B, Feb. 2, 2011, vol. 83(081201). 4 pages.
Neumann et al., "High-Precision Nanoscale Temperature Sensing Using Single Defects in Diamond," Nano Letters, May 30, 2013, vol. 13, pp. 2738-2742.

(56) References Cited

OTHER PUBLICATIONS

O'Keeffe et al., "Hamiltonian Engineering with Constrained Optimization for Quantum Sensing and Control," arXiv:1811.02124v2, Feb. 28, 2019. 30 pages.

Oka et al., "Floquet Engineering of Quantum Materials," Annual Review of Condensed Matter Physics (2018), vol. 10(031218). arXiv:1804.03212v1, Apr. 9, 2018. 17 pages.

Pham et al., "Enhanced solid-state multispin metrology using dynamical decoupling," Physical Review B, Jul. 24, 2012, vol. 86:045214. 5 pages.

Rhim et al., "Analysis of multiple pulse NMR in solids. II," Journal of Chemical Physics, Jun. 1974, vol. 60, pp. 4595-4604.

Rhim et al., "Time-Reversal Experiments in Dipolar-Coupled Spin Systems," Physical Review B, Feb. 1, 1971, vol. 3, pp. 684-696.

Rigol et al., "Thermalization and its mechanism for generic isolated quantum systems," Nature, Apr. 17, 2008, vol. 452, pp. 854-858, Erratum. 6 pages.

Rose et al., "High-Resolution Nanoscale Solid-State Nuclear Magnetic Resonance Spectroscopy," Physical Review X, Feb. 26, 2018, vol. 8(011030). 12 pages.

Rugar et al., "Proton magnetic resonance imaging using a nitrogen-vacancy spin sensor," Nature Nanotechnology, Feb. 2015, vol. 10, pp. 120-124.

Ryan et al., "Robust Decoupling Techniques to Extend Quantum Coherence in Diamond," Physical Review Letters, Nov. 12, 2010, PRL 105:200402. 4 pages.

Sacha et al., "Time crystals: a review," Reports on Progress in Physics (2018), vol. 81(016401), published Nov. 23, 2017, 26 pages.

Schirhagl et al., "Nitrogen-Vacancy Centers in Diamond: Nanoscale Sensors for Physics and Biology," Annual Review of Physical Chemistry (2014), vol. 65, pp. 83-105, published online Nov. 21, 2013.

Schwartz et al., "Robust optical polarization of nuclear spin baths using Hamiltonian engineering of nitrogen-vacancy center quantum dynamics," Science Advances, Aug. 31, 2018, vol. 4(eaat8978). 8 pages.

Suter et al., "Colloquium: Protecting quantum information against environmental noise," Reviews of Modern Physics, Oct.-Dec. 2016, vol. 88:041001. 23 pages.

Taylor et al., "High-sensitivity diamond magnetometer with nanoscale resolution," Nature Physics, vol. 4, pp. 810-816, published online Sep. 14, 2008.

Thiel et al., "Rare-earth-doped materials for applications in quantum information storage and signal processing," Journal of Luminescence, available online Jan. 25, 2011, vol. 131, pp. 353-361.

Tino et al., "Atom interferometers and optical atomic clocks: New quantum sensors for fundamental physics experiments in space," Nuclear Physics B: Proceedings Supplements, Apr. 2007, vol. 166, pp. 159-165.

Toyli et al., "Fluorescence thermometry enhanced by the quantum coherence of single spins in diamond," Proceedings of the National Academy of Sciences, May 21, 2013, vol. 110, pp. 8417-8421.

Tyryshkin et al., "Electron spin relaxation times of phosphorus donors in silicon," Physical Review B, Nov. 20, 2003, vol. 68:193207. 4 pages.

Uhrig, "Keeping a Quantum Bit Alive by Optimized pi-Pulse Sequences," Physical Review Letters, Mar. 9, 2007, vol. 98(100504). 4 pages.

Vandersypen et al., "NMR techniques for quantum control and computation," Reviews of Modern Physics, Oct. 2004, vol. 76, pp. 1037-1069.

Viola et al., "Dynamical Decoupling of Open Quantum Systems," Physical Review Letters (1999), vol. 82, 2417. arXiv:9809071v2, Feb. 11, 1999. 5 pages.

Von Keyserlingk et al., "Absolute stability and spatiotemporal long-range order in Floquet systems," Physical Review B, Aug. 8, 2016, vol. 94:085112. 11 pages.

Waugh et al., "Approach to High-Resolution NMR in Solids," Physical Review Letters, Jan. 29, 1968, vol. 20(5), pp. 180-182 and Fig.1. 4 pages.

Webb, "The Clifford Group Forms a Unitary 3-Design," arXiv:1510.02769v3, Nov. 8, 2016. 17 pages.

Wei et al., "Emergent prethermalization signature in out-of-time ordered correlations." arXiv:1812.04776v1, Dec. 12, 2018. 7 pages.

Wei et al., "Exploring Localization in Nuclear Spin Chains," Physical Review Letters, Feb. 12, 2018, vol. 120(070501). 6 pages.

West et al., "Near-optimal dynamical decoupling of a qubit," Physical Review Letters (2010), vol. 104(130501). arXiv:0908.4490v2. 5 pages.

Wolf et al., "Subpicotesla Diamond Magnetometry," Physical Review X, Oct. 5, 2015, vol. 5:041001. 10 pages.

Yan et al., "Observation of dipolar spin-exchange interactions with lattice-confined polar molecules," Nature, Sep. 26, 2013, vol. 501, pp. 521-525 and Methods. 6 pages.

Yao et al., "Discrete Time Crystals: Rigidity, Criticality, and Realizations," Physical Review Letters, Jan. 20, 2017, PRL 118:030401. 6 pages.

Zhang et al., "Observation of a many-body dynamical phase transition with a 53-qubit quantum simulator," Nature, Nov. 30, 2017, vol. 551, pp. 601-604 and Methods. 9 pages.

Zhu, "Multiqubit Clifford groups are unitary 3-designs," Physical Review A, Dec. 29, 2017, vol. 96(062336). 7 pages.

* cited by examiner

PULSE SEQUENCE DESIGN PROTOCOL

CROSS-REFERENCE TO RELATED APPLICATIONS

This application claims the benefit of priority to U.S. Provisional Application No. 62/814,775, entitled "Surpassing the Interaction Limit to Quantum Sensing with Fault-Tolerant Control," filed on Mar. 6, 2019, the disclosure of which is hereby incorporated by reference in its entirety.

STATEMENT OF GOVERNMENTAL INTEREST

This invention was made with Government support under Grant # N00014-15-1-2846 awarded by the United States Department of Defense and the Office of Naval Research and Grant # W911NF-15-1-0548 awarded by the United States Army and the Army Research Office. The government has certain rights in the invention.

TECHNICAL FIELD

The invention relates to spin systems, and more particularly to design protocols to produce pulse sequences to control interacting spin ensembles.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

BACKGROUND

The ability to robustly control and manipulate the dynamics of a quantum system, such as a single quantum spin, is an important aspect of devices or methods that take advantage of quantum dynamics, such as ranging from quantum metrology and quantum simulation. Increasing the accuracy and robustness of control of quantum dynamics can increase the sensitivity and number of applications of such quantum dynamics. However, robust control and manipulation of quantum dynamics are limited by noise.

Among efforts to improve control of quantum dynamics, the application of periodic control pulses, sometimes referred to as Floquet driving, has emerged as a tool for the control and engineering of quantum dynamics. One example of such approaches is dynamical decoupling of a target spin from its environment, in which a series of pulses manipulates a quantum spin and cancels the effects of interactions with environmental noise. The periodic structure of these pulse sequences can give rise to frequency-selective resonances, enabling high sensitivity to external signals measured by the quantum system (e.g. magnetic fields).

In addition to manipulating the dynamics of a single spin and applying such techniques to a plurality of spins, periodic control pulses also allow for control of interactions between spins, even when only global control (i.e., control over the plurality of spins without specific addressing of individual spins) is available, as is typically the case for large-scale quantum systems with many degrees of freedom. One example is the WAHUHA pulse sequence and its extension MREV-8, each of which can cancel the dipolar interaction between spin-½ particles to leading order.

SUMMARY

Systems and methods are disclosed for a pulse sequence that reduces disorder and/or interaction effects in spin systems. A protocol can be used to design a pulse sequence that includes altering the frame orientation of the spin system with each electromagnetic pulse in the pulse sequence. The frame orientations during the sequence can conform to certain conditions. The number positive rotations along each axis can be the same as the number negative rotations along the respective axis. The number of rotations along one axis should be the same as the number of rotations along the other axes.

According to some embodiments, a method of reducing disorder and interaction effects in a spin system includes: applying a sequence of n electromagnetic pulses to the spin system, the spin system having a frame orientation in an evolution period $\tau_0$ before a first pulse k=1 of the sequence of electromagnetic pulses; and altering the frame orientation of the spin system with each electromagnetic pulse in the sequence of pulses, each electromagnetic pulse being one or more of a π/2 rotation or a π rotation, the frame orientations during the sequence conforming to the following relations:

$$\sum_k F_{\mu k} \tau_k = 0, \text{ and}$$

$$\sum_k |F_{xk}|\tau_k = \sum_k |F_{yk}|\tau_k = \sum_k |F_{zk}|\tau_k,$$

where $F_{\mu k}$ represents the frame orientation of the spin system in a respective evolution period of duration $\tau_k$ after pulse k for each spin direction μ=x, y, z for 0≤k≤n, and where k=0 corresponds to the frame orientation $F_{\mu 0}$ in the evolution period before the first pulse k=1.

In some embodiments, the sequence of electromagnetic pulses is periodic, and the pulses are equally spaced.

In some embodiments, at least one electromagnetic pulse of the sequence of electromagnetic pulses includes two or more π/2 rotations, and the spin system further comprises intermediary frame orientations representing the frame orientation of the spin system after each but a final π/2 rotation, the intermediary frame orientations conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction μ=x, y, z.

In some embodiments, for each π rotation, the frame orientation of the spin system further comprises an intermediary frame orientation representing the frame orientation of the spin system after the first π/2 rotation of the π rotation, intermediary frame orientations together conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction $\mu$=x, y, z.

In some embodiments, for each pair of axes $\mu,\mu$=x, y, z, the parity of frame changes sums to zero such that $$\sum_k F_{\mu,k} F_{v,k+1} + F_{\mu,k+1} F_{v,k} = 0,$$

for ($\mu$, v)=(x, y), (x, z), (y, z).

In some embodiments, the chirality of frame changes sums to zero such that the cyclic sum $$\sum_k \vec{F}_k \times \vec{F}_{k+1} = \vec{0},$$

where $\vec{F}_k = \Sigma_\mu F_{\mu,k} \vec{e}_\mu$ and $\vec{e}_\mu$ are the unit vectors along axis directions.

In some embodiments, the method further includes generating an effective magnetic field $\vec{B}_{eff}$ as seen by the driven spins; and initializing the frame orientation of the spin system to be perpendicular to the effective magnetic field.

In some embodiments, the sequence of electromagnetic pulses is used to increase the coherence time of an ensemble of nitrogen-vacancy (NV) centers in diamond beyond a spin-spin interaction sensitivity limit.

In some embodiments, the sequence of electromagnetic pulses is used to increase the coherence time of a magnetic field sensing ensemble of nitrogen-vacancy (NV) centers in diamond such that a sensitivity of the magnetic field sensing ensemble of NV centers overcomes a spin-spin interaction sensitivity limit.

According to some embodiments, a system can include: a quantum sensor comprising an ensemble of spins in solid state, the ensemble of spins having a density in which the interactions between the spins limit a coherence time of the ensemble of spins in solid state; and a pulse generator configured to apply electromagnetic radiation to the quantum sensor, the electromagnetic radiation decoupling the interactions between the spins to increase the coherence time beyond a spin-spin interaction sensitivity limit of the ensemble of spins when measuring a target signal.

In some embodiments, the quantum sensor comprising an ensemble of NV centers in diamond of density r ppm, and the coherence time is increased to be longer than a value of 72/r us (as determined from the scaling of the interaction limit), up to 1 ms.

In some embodiments, the pulse generator applies electromagnetic radiation to the quantum sensor according to the method of claim 1.

According to some embodiments, a spin system can include: a pulse generator configured to a sequence of n electromagnetic pulses to the spin system, the spin system having a frame orientation in an evolution period $\tau_0$ before a first pulse k=1 of the sequence of electromagnetic pulses, each electromagnetic pulse corresponding to a frame of the sequence of pulses, and each electromagnetic pulse being one or more of a $\pi/2$ rotation or a $\pi$ rotation, the frame orientations during the sequence conforming to the following relations:

$$\sum_k F_{\mu k} \tau_k = 0, \text{ and}$$

$$\sum_k |F_{xk}|\tau_k = \sum_k |F_{yk}|\tau_k = \sum_k |F_{zk}|\tau_k,$$

where $F_{\mu k}$ represents the frame orientation of the spin system in a respective evolution period of duration $\tau_k$ after pulse k for each spin direction $\mu$=x, y, z for 0≤k≤n, and where k=0 corresponds to the frame orientation $F_{\mu 0}$ in the evolution period before the first pulse k=1.

In some embodiments, the sequence of electromagnetic pulses is periodic, and the pulses are equally spaced.

In some embodiments, at least one electromagnetic pulse of the sequence of electromagnetic pulses includes two or more $\pi/2$ rotations, and the spin system further comprises intermediary frame orientations representing the frame orientation of the spin system after each but a final $\pi/2$ rotation, the intermediary frame orientations conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction $\mu$=x, y, z.

In some embodiments, for each $\pi$ rotation, the frame orientation of the spin system further comprises an intermediary frame orientation representing the frame orientation of the spin system after the first $\pi/2$ rotation of the $\pi$ rotation, intermediary frame orientations together conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction $\mu$=x, y, z.

In some embodiments, for each pair of axes $\mu,\mu$=x, y, z, parity of frame changes experienced by the spin system sums to zero such that $$\sum_k F_{\mu,k} F_{v,k+1} + F_{\mu,k+1} F_{v,k} = 0,$$

for ($\mu$, v)=(x, y), (x, z), (y, z).

In some embodiments, the chirality of frame changes experienced by the spin system sums to zero such that the cyclic sum $$\sum_k \vec{F}_k \times \vec{F}_{k+1} = \vec{0},$$

where $\vec{F}_k = \Sigma_\mu F_{\mu,k} \vec{e}_\mu$ and $\vec{e}_\mu$ are the unit vectors along axis directions.

These and other capabilities of the disclosed subject matter will be more fully understood after a review of the following figures, detailed description, and claims. It is to be understood that the phraseology and terminology employed herein are for the purpose of description and should not be regarded as limiting.

BRIEF DESCRIPTION OF THE FIGURES

For a more complete understanding of various embodiments of the disclosed subject matter, reference is now made to the following descriptions taken in connection with the accompanying drawings, in which.

DESCRIPTION

Figure 1:
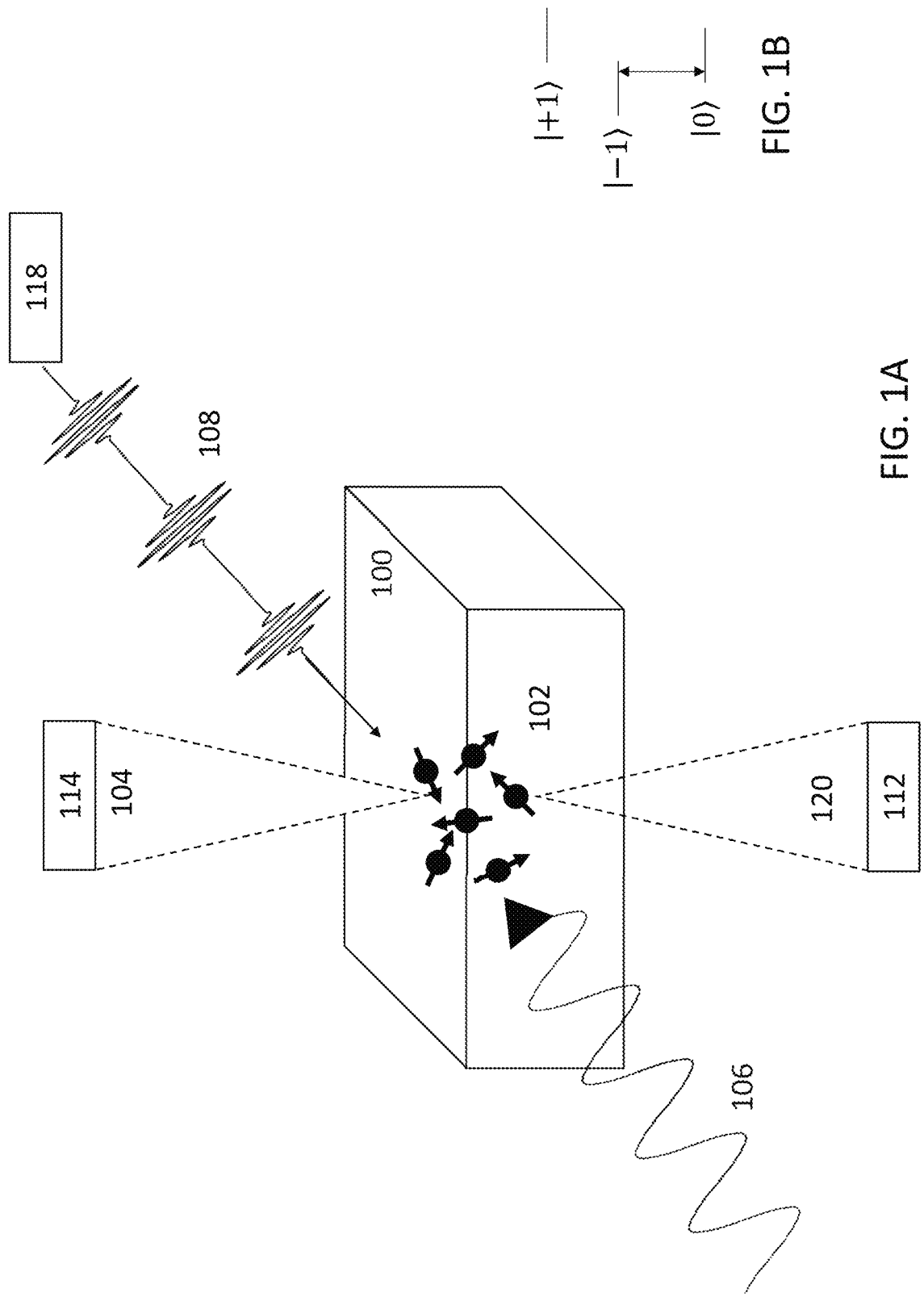
FIG. 1A is an illustrating of a spin ensemble quantum sensor, according to some embodiments.
FIG. 1B is an illustration of magnetic sublevels, according to some embodiments.

Quantum sensors, such as nitrogen vacancies in diamond, can be used to detect small fields, such as weak magnetic fields with, high sensitivity and/or precision. Such high sensitivity and/or precision sensing can enable myriad applications ranging from nanoscale nuclear magnetic resonance spectroscopy of biomolecules to local probing of exotic condensed matter phenomena. In some applications, the magnetic field sensitivity can be improved by increasing the density of sensors in a given volume. However, increasing the density of sensors may not always increase sensitivity to the same degree beyond a critical density. For example, in some applications, beyond a critical density (or, more generally, as density increases) this improvement in sensitivity is hindered by interactions between the sensors themselves (e.g., between a sensor and its nearest neighbors), which can be referred to as "interaction effects" or simply "interactions." In some applications, sensitivity improvement can also or alternatively be hindered by increasing inhomogeneity that can result from a higher sensor density, which can be referred to as "disorder" or "inhomogeneity." Interactions and disorder are described in more detail throughout the present disclosure, for example as described below in the Disorder and Interactions section. In some embodiments, control errors can also give rise to inhomogeneities in the response of individual sensors in the ensemble and result in a further decrease in sensitivity.

Existing techniques for designing pulse sequences to be applied to quantum sensors do not address all of the above limitations on sensitivity and other important performance measures. Accordingly, there is a need for a systematic design protocol for designing pulse sequences that can simultaneously addresses sensor-sensor interactions, on-site disorder, and control imperfections, in order to surpass the interaction limit and exploit the full potential of ensemble quantum sensors. In some embodiments, higher sensitivity and spin density can be achieved without being limited by the interaction limit.

In some embodiments of the present disclosure, the sensitivity and/or precision of a dense ensemble of sensors, such as interacting electronic spins in diamond, can be improved beyond the sensitivity at the critical density. For example, in some embodiments, a pulse sequence can be designed according to the disclosed design protocol such that, when applied to quantum sensors, decouples (reduces the effects to) the sensors from interactions and disorder. In some embodiments, such a pulse sequence can also be fault-tolerant to the leading-order control imperfections of the system. In some embodiments, pulse sequences designed according to the disclosed protocol can enable a five-fold enhancement in coherence time (which refers to the time during which a quantum state remains stable, where longer coherence times expose the quantum sensors to a field to be measured for a longer time, thereby increasing sensitivity thereto) compared to the conventional XY-8 sequence. In some embodiments, the effective field experienced by the driven sensors can be tailored by pulse sequences designed according to the disclosed protocol and/or the disclosed sensor initialization and readout protocol can be used to achieve high magnetic-field sensitivity. Example results from non-limiting applications of the disclosed techniques demonstrate a 30% enhancement in sensitivity relative to the XY-8 sequence, breaking the sensitivity limit set by inter-sensor interactions.

In some embodiments, the disclosed protocol is based on robust periodic manipulation (Floquet engineering) of ensemble spin dynamics. Pulse sequences developed with the disclosed protocol deliver a sequence with high sensitivity to an external signal of interest, while simultaneously decoupling the effects of interactions and disorder, and remaining fault-tolerant against the leading-order effects of finite pulse width and control imperfections. In some non-limiting example applications using a dense ensemble of nitrogen-vacancy (NV) centers in diamond, a five-fold enhancement of the spin coherence time has been observed compared to the conventional XY-8 sensing sequence that does not decouple interactions. The disclosed design protocol can be used to design a sequence such that the driven spins experience a maximal effective sensing field in a particular direction (e.g., the [1,1,1]-direction). The spins can be prepared in a plane orthogonal to the effective field to be measured to attain increased sensitivity. The combination of extended coherence time produced by example pulse sequences designed using the disclosed protocol and optimal sensing have shown an example, non-limiting 30% enhancement in absolute sensitivity over the XY-8 sequence, achieving a volume-normalized sensitivity of $28(1)\,\mathrm{nT}\cdot\mu\mathrm{m}^{3/2}/\sqrt{\mathrm{Hz}}$, among the best to date in the solid state sensor systems.

Embodiments of the instant application relates generally to design of pulse sequences for interacting spin ensembles. For example, the disclosed embodiments provide a formalism that enables a design protocol for the pulse sequence. The design protocol includes one or more design conditions for one or more pulses in the pulse sequence. The design conditions suppress undesired effects in the spin ensembles. For example, design conditions can be imposed to suppress disorder of the spin ensembles and/or interaction effects within the spin ensembles. Using the described formalism and design protocol, described herein are also specific pulse sequences meeting design protocols described herein to achieve these benefits. Additional design conditions can be imposed according to some embodiments to account for or suppress other effects, such as finite frame widths, interaction cross-terms, rotation angle errors, or higher order effects.

For example, as described in further detail below, each frame of a pulse sequence includes an electromagnetic pulse that acts on the spin system. The pulses, for example, can be a sequence of π pulses and/or π/2 pulses. Each pulse causes a positive or negative rotation of spin orientations along x, y, or z axes. The design protocol includes design conditions regarding one or more pulses in the pulse sequence. For example, in some embodiments, a design condition is that the number positive rotations along each axis should be the same as the number negative rotations along the respective axis. This design condition suppresses disorder in the spin ensemble. In addition, for example, some embodiments, a design condition is that the number of rotations along one axis should be the same as the number of rotations along the other axes. This design condition suppresses interaction effects in the spin ensemble. Further exemplary design conditions of the design protocol of some embodiments are described in further detail, below.

In some embodiments, the disclosed protocol can be based on a description of the ensemble spin dynamics and average Hamiltonian in terms of time-domain transformations of local Pauli spin operators. The disclosed simple algebraic conditions imposed on the transformations can provide a systematic way to describe the engineering of interactions and disorder, as well as the cancellation of dominant system imperfections, including errors in spin rotation as well as undesirable disorder and interaction effects during the finite pulse durations. Moreover, embodiments of the disclosed protocol provide a recipe to develop system-specific pulse sequences adapted to relevant parameters and timescales in the Hamiltonian, and is also applicable to a wide range of interaction Hamiltonians beyond the conventional dipolar interaction. This enables the fault-tolerant implementation of target Hamiltonians using the disclosed protocol, enabling a variety of applications.

In some embodiments, an interaction-decoupling sequences can be tailored to system characteristics and dominant energy scales in order to protect quantum coherence. In some additional or alternative embodiments, spin dynamics can be engineered in the presence of an external AC target magnetic field into an effective evolution under a vectorial DC magnetic field as seen by the driven spins, enabling optimal quantum sensing in the presence of interactions. In some additional or alternative embodiments, the disclosed protocol can be used to engineer Hamiltonians with a range of thermalization properties for quantum simulation.

Quantum sensors, such as nitrogen vacancy centers in diamond, can take advantage of quantum mechanical interactions to achieve superior spatial resolution, spectral resolution and sensitivity as opposed to classical sensors. Such sensors can be used in a number of applications including, but not limited to serving as a powerful tool for the exploration of fundamental physics and for applications in material science and biochemical analysis. Other quantum sensors would benefit form the pulse sequences described herein, as would be apparent to one of skill in the art.

FIG. 1A is an illustration showing a spin ensemble quantum sensor, according to some embodiments. The spin ensemble quantum sensor includes a plurality of quantum spins, such as nitrogen vacancy (NV) centers 102, that together form an ensemble quantum sensor. Although the present disclosure describes quantum sensors embodied as NV centers, other types of quantum sensors are contemplated, and the examples listed herein are not limited to NV centers. For example, the disclosed design is generally applicable to many different spin systems, ranging from interacting electronic spin ensembles, such as NV centers in diamond, phosphorus donors in silicon and rare earth ions, to conventional NMR systems, and even to platforms of cold molecules. These different systems have a variety of competing energy scales that dominate the dynamics, which can be addressed with the use of the disclosed design protocol to address the dominant effects. In some embodiments, a dense ensemble of NV centers are used, such as an ensemble having an NV center density of 45 ppm. The NV centers 102 can be contained within a material 100, such as a in a black diamond beam having nanometer dimensions ("nano-beam"). Microwave 108 and optical excitation 104 are delivered to the spins to control and read out their spin states using at least one microwave source 118 at least one laser 114, respectively. In some embodiments, the at least one laser 114 can produce optical excitation 114 at different wavelengths. An external magnetic field 106, such as an AC magnetic field, can be used as a target sensing signal to be sensed by the NV centers 102. Fluorescence 112 from NV centers 102 can be detected by an optical detector 120.

In some embodiments, the NV centers 102 can exhibit long-range magnetic dipolar interactions between the spins as well as strong on-site disorder originating from paramagnetic impurities and inhomogeneous strain in the diamond lattice. The bulk diamond 100 can be etched into a nano-beam to improve control homogeneity and to confine the probing volume to $V=0.018\,\mu\mathrm{m}^3$. Other spin systems are contemplated.

FIG. 1B shows three magnetic sublevels, $|0\rangle$ and $|\pm1\rangle$, in the ground state of example spins, such as NV centers, according to some embodiments. In some embodiments, two levels, $|0, -1\rangle$ can be addressed using resonant microwave driving using, for example, the microwave source 118. In some embodiments, excitation from the external magnetic field 106 can cause a transition from the level |−1⟩ to |+1⟩. The NV center 102 can then transition back to the level |−1⟩, by emitting fluorescence 120, which can be detected by an optical detector 112. In some embodiments, measurements can be performed at room temperature under ambient conditions.

In some embodiments, each NV center 102 ground state can be an electronic S=1 spin. A static magnetic field can be applied to isolate an ensemble of effective two-level systems formed of NV centers with the same crystallographic orientation. The spin states can be initialized and detected optically, and resonant microwave excitation can be used to drive coherent spin dynamics. An external AC magnetic field can also be used as a target sensing signal.

Figure 2:
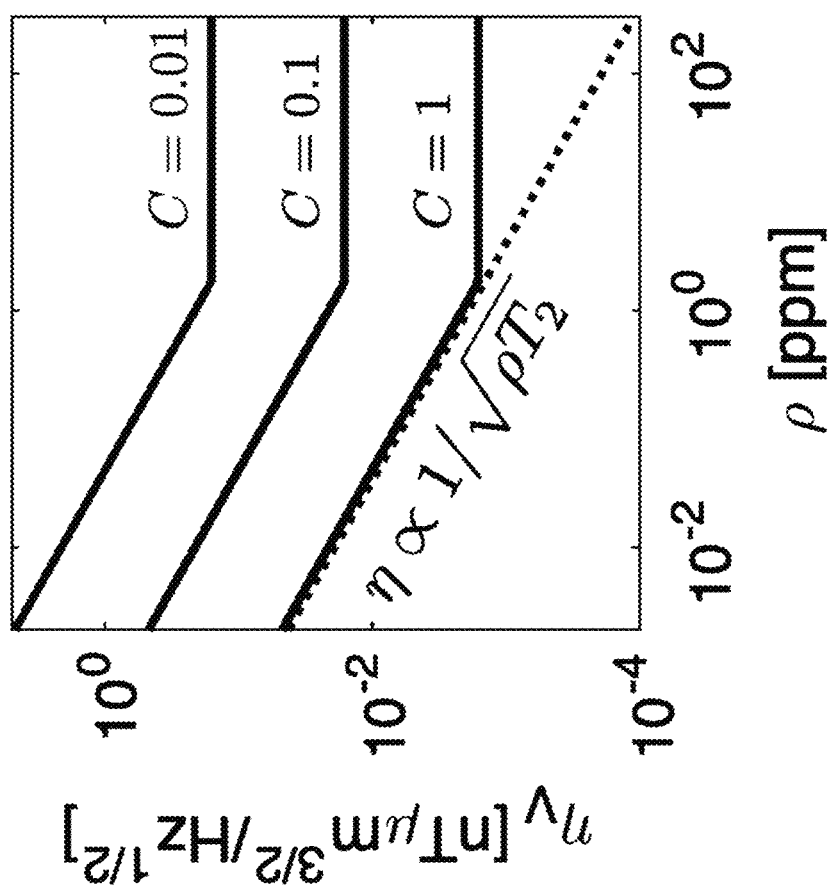
FIG. 2 is a graphical illustration of volume-normalized magnetic field sensitivity ($\eta\_v$) as a function of spin density, $\rho$, according to some embodiments.

FIG. 2 shows the volume-normalized magnetic field sensitivity ($\eta_v$) as a function of spin density, $\rho$, according to some embodiments. The dashed line denotes the standard quantum limit scaling and solid curves show the behavior when interactions between spins are taken into account for different readout efficiency factors C. Beyond a critical density the enhancement in sensitivity plateaus due to a reduction in coherence time for all values of C.

General Formalism

According to some embodiments, pulse sequences are described in terms of interacting picture spin frame orientations. Instead of thinking of a periodic driving sequence in terms of the control pulses applied, the average Hamiltonian evolution is described using toggling spin frames, which correspond to going into the interacting picture with respect to control pulses. Without being bound by theory, describing pulse sequences as such provides a simple formalism for describing the decoupling performance for pulses meeting the design protocol described herein. In addition, it also allows the formulation of concise criteria for pulse imperfections described herein.

Without being bound by theory, in some embodiments, the design protocol and associated design conditions described herein is based on average Hamiltonian theory. This theory provides a framework to analyze the dynamics of an interacting spin ensemble under periodic manipulations.

In some embodiments, an interacting spin ensemble has a Hamiltonian given by the following relation $$H = H_f + H_c(t), \quad (1)$$

where $H_f$ is the free evolution Hamiltonian of the internal dynamics of the spin ensemble, involving on-site disorder and spin-spin interactions, and $H_c(t)$ describes the periodic control field. As described herein, the periodic control field includes an external stimulus such as a pulse sequence (for example, of electromagnetic pulses) that is applied to the spin ensemble.

Figure 3:
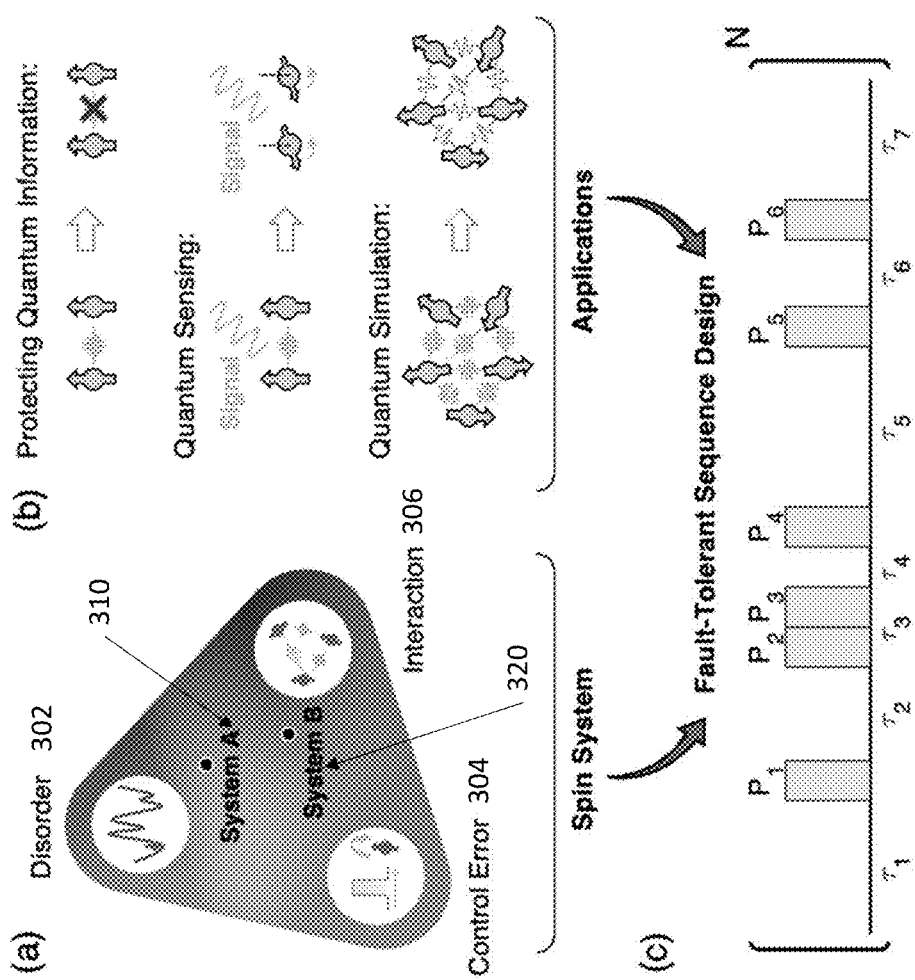
FIG. 3 views (a) through (c) illustrate example aspects of a fault-tolerant sequence design, according to some embodiments.

In some embodiments, a sequence of periodic control pulses are applied to the spin ensemble. For example, a sequence of periodic control pulse, such as that shown in FIG. 3 view (c), is applied to a spin ensemble with a total period τ. In some embodiments, the unitary transformation induced by the pulses is written as $$\mu_c(t) = \Sigma \exp[-i\int_0^t H_c(t_1) dt_1], \quad (2)$$

where τ denotes time-ordering as shown in FIG. 3 view (c). In the interacting picture representation with respect to the control field unitary $U_c(t)$, the full evolution in one period of the sequence of periodic pulses is given by $$U(T) = \tau \exp[-i\int_0^T \tilde{H}_f(t_1) dt_1], \quad (3)$$

where $\tilde{H}_f(t_1) = U_c^\dagger(t_1) H_f U_c(t_1)$ is the interacting picture Hamiltonian of the system, also known as the toggling frame Hamiltonian. In some embodiments, the unitary evolution operator can be expanded using the Magnus expansion as follows:

$$U(T) = \exp[-iT(H^{(0)} + H^{(1)} + \ldots)], \quad (4)$$

where $$H^{(0)} = \frac{1}{T}\int_0^T \tilde{H}_f(t_1) dt_1 \quad (5)$$

$$H^{(1)} = -\frac{i}{2T}\int_0^T dt_2 \int_0^{t_2} dt_1 [\tilde{H}_f(t_2), \tilde{H}_f(t_1)]. \quad (6)$$

In certain embodiments, the above series is truncated to the zeroth order, for example, as is consistent with Average Hamiltonian theory. Without being bound by theory, this is a good approximation in the regime of fast periodic driving, where each Hamiltonian term is cancelled at a rate faster than the characteristic timescale of its corresponding dynamics.

In some embodiments, the pulse sequence is a discrete pulse sequence as illustrated in FIG. 3 view (c). The integral for the average Hamiltonian $\overline{H}_{ave}$ in Equation (5) of the discrete pulse sequence can be rewritten as a summation over different evolution periods shown in FIG. 3 view (c)

$$\overline{H}_{ave} = \frac{1}{T}(\Sigma_k \tau_k H_k + \Sigma_k t_p H'_{k,k+1}), \quad (7)$$

where $\tau_k$, $H_k$ are the duration and toggling frame Hamiltonian $\tilde{H}_f(t)$ in the kth free evolution period, respectively, $t_p$ is the finite pulse duration, and $H'_{k,k+1}$ is the average Hamiltonian corresponding to the pulse between the kth and k+1th free evolution period.

The above discussion is fully general, and may be applied to systems with arbitrary spins. Some embodiments focus on an effective two-level system, which can appear either in spin-½ systems, or as two levels off-resonant from other transitions in a higher spin system. In some embodiments, the form of the Hamiltonian is not restricted to the spin-½ dipolar interaction Hamiltonian with on-site disorder, and instead uses generic Hamiltonians under the secular approximation, such that the only constraint is that the Hamiltonian commutes with a strong magnetic field that sets the quantization axis in the z-direction, as described further herein. Some embodiments involve Hamiltonians with only single-body and two-body terms, although other embodiments involve interactions with three-body operators. In this case, the Hamiltonian can generically be written as $$H_0 = H_{dis} + H_{int} = \Sigma_i \Delta_i S_i^z + \Sigma_{i,j}[J_{ij}^{ex,r}(S_i^x S_j^x + S_i^y S_j^y) + J_{ij}^{ex,i}(S_i^x S_j^y - S_i^y S_j^x) + J_{ij}^{is} S_i^z S_j^z], \quad (8)$$

where the first term $H_{dis}$ is the disorder Hamiltonian and the second term $H_{int}$ is a generic interaction Hamiltonian, $\Delta_i$ is a random on-site disorder strength, $S_{i,j}$ are spin-½ operators, and $J_{ij}^{ex,r}$, $J_{ij}^{ex,i}$, $J_{ij}^{is}$ are arbitrary interaction strengths for the spin-exchange interaction with real and imaginary hopping phase and the Ising interaction. The real spin-exchange interaction and Ising interaction are widely found in different interacting spin systems, and the imaginary spin-exchange interaction can also emerge in experimental systems of certain embodiments. In some embodiments, it is assumed that the periodic control field satisfies $$H_c(t) = \Sigma_i (i + \delta_i)(\Omega_x(t) S_i^x + \Omega_y(t) S_i^y), \quad (9)$$

where $\delta_i$ describes the control field strength inhomogeneity and $\Omega_x(t)$, $\Omega_y(t)$ are the instantaneous Rabi frequencies. In some embodiments it is assumed that the pulses are applied along the $\vec{x}$ or $\vec{y}$ directions only, with a rotation angle that is an integer multiple of $\pi/2$. However, those skilled in the art will recognize that the formalism and design protocol can also be applied to other pulses without these assumptions.

Frame Representation

Described herein is a frame representation that is used to describe design conditions of the design protocol for a pulse sequence acting on, for example, a spin ensemble. In some embodiments, a pulse sequence includes a series of frames. Each frame includes one or more pulses, or pulses that can be described as one or more pulses.

In some embodiments, each frame can be represented based on the interacting picture transformations of the $S^z$ operator: $\tilde{S}^z(t)=U_c^\dagger(t)S^zU_c(t)=\Sigma_{\mu=x,y,z}F_\mu(t)S^\mu$, hereinafter referred to as the toggling frame spin operator. The functions $F_\mu(t)$ are vector generalizations of the modulation function employed in the analysis of sensing sequences. Without being bound by theory, in the presence of a strong field that sets the quantization axis in the z direction and under the secular approximation, according to certain embodiments, the Hamiltonian described in equation (8) is invariant under rotations around the z axis that mix $S^x$ and $S^y$. Under such conditions, the Hamiltonian does not depend independently on transverse components, and information about $\tilde{S}^z(t)$ is sufficient to fully recover the interacting picture Hamiltonian.

Figure 4:
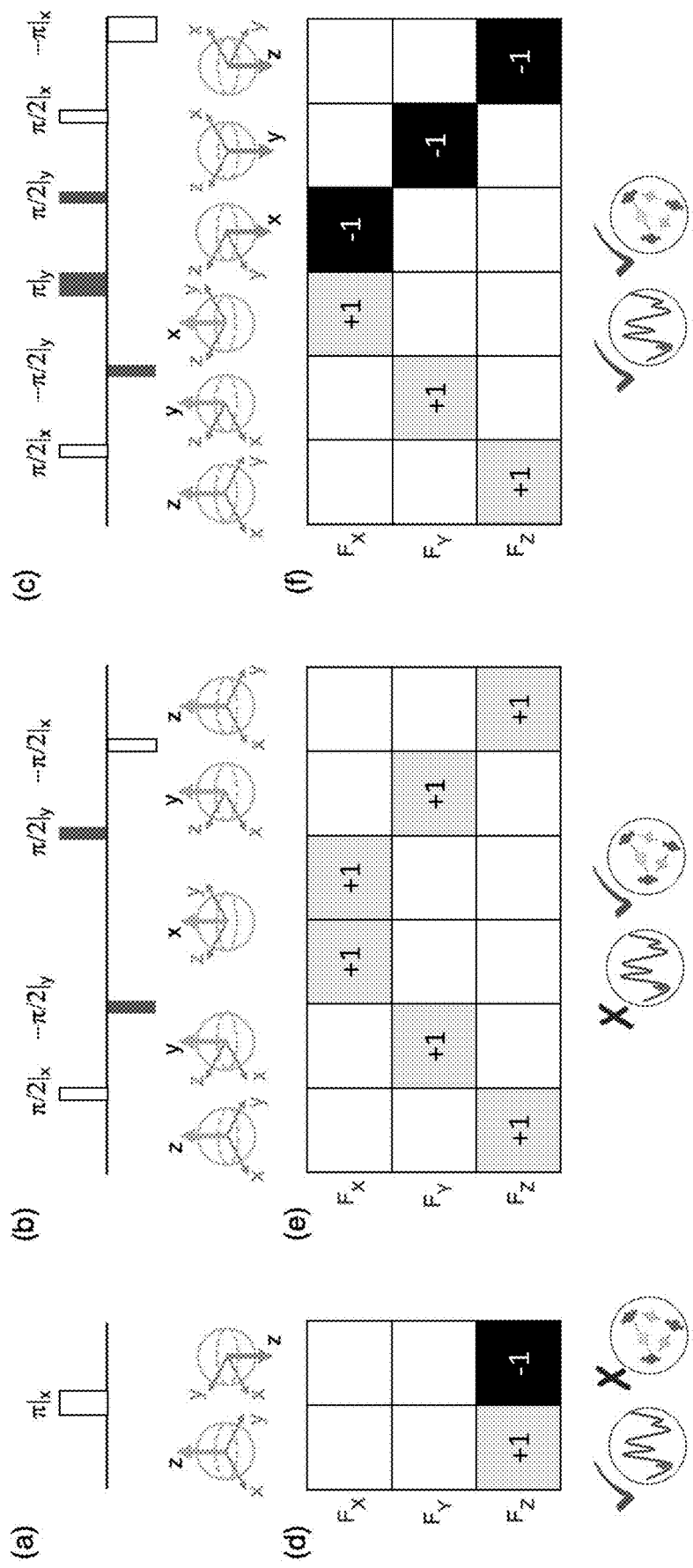
FIG. 4 views (a) through (f) illustrate example pulse sequences, according to some embodiments.

An example of this representation is illustrated for various pulse sequences, such as decoupling pulses, in FIG. 4. Pulses in the sequence are applied as $\pi$ and $\pi/2$ pulses, as shown in the top parts of FIG. 4 views (a)-(c). These pulses lead to rotations of the spin operators on the Bloch sphere as shown in the bottom parts of FIG. 4 views (a)-(c). The pulses can be viewed in an alternative representation, as shown in the top part of FIG. 4 views (d) to (f). Each cell represents a free evolution period before or after the pulses above in FIG. 4 views (a) to (c). The grey cells represent positive rotations in the respective $F_x$, $F_y$, and $F_z$ direction, whereas the black cells represent negative rotations in the respective direction. The bottom part of FIG. 4 views (d) to (f) shows the effects of each sequence on the system. The first circle in the bottom part of FIG. 4 views (d) to (f) represents whether the sequence suppresses disorder, with a check indicating that disorder is suppressed and an "X" indicating no suppression. The second circle in the bottom part of FIG. 4 views (d) to (f) represents whether the sequence suppresses interaction effects, with a check indicating that interaction effects are suppressed and an "X" indicating no suppression.

The first pulse sequence, which corresponds to FIG. 4 views (a) and (d), represents a spin echo pulse sequence. Such a pulse sequence can cancel the effects of on-site disorder, but leaves interactions unchanged. FIG. 4 views (b) and (e) represents a WAHUHA pulse sequence, which suppresses dipolar interactions, but leaves on-site disorder intact. FIG. 4 views (c) and (f) represents a sequence according to some embodiments. The sequence of FIG. 4 views (c) and (f) cancels both on-site disorder and dipolar interactions to leading order in the ideal pulse limit.

The top parts of FIG. 4 views (a) to (c) represent the pulses that are applied in the sequence. According to some embodiments, the pulses are either $\pi$ pulses or $\pi/2$ pulses. Positive pulses are shown above the axis and negative pulses are shown below the axis. $\pi$ pulses are shown thicker than $\pi/2$ pulses.

The bottom parts of FIG. 4 views (a) to (c) represent the evolution of the toggling frame spin operators after each pulsed rotation in the sequence. In this representation, the pulses specify rotations around an external axis, i.e. an $\hat{x}$ rotation is applied around the $\hat{x}$ axis in a fixed external reference frame, as opposed to rotating around the modified 2-arrow direction. The arrows that point in the $\hat{x}$, $\hat{y}$, $\hat{z}$ directions in the external frame then correspond to the interacting picture $\tilde{S}^x(t)$, $\tilde{S}^y(t)$, $\tilde{S}^z(t)$ operators at each time. For example, in the second Bloch sphere in FIG. 4 view (b), the $\hat{y}$ arrow is pointing in the $\hat{z}$ direction, indicating that $\tilde{S}_z(t)=S^y$ during this free evolution period.

FIG. 4 views (d) to (f) are further representations of the rotations caused by the pulses in the pulse sequences of FIG. 4 views (a) to (c). In these views, the location of the filled square in each column indicates the axis direction that $\tilde{S}^z(t)$ points in, and the color indicates a positive (gray) or negative (black) direction along this axis. These cells in these views correspond to the Bloch spheres shown in the bottom part of FIG. 4 views (a) to (c).

The representations in FIG. 4 views (d) to (f) can be expressed mathematically as a matrix F, with different rows characterizing the operator pointing during each free evolution block, and ±1 indicate that the operator is pointing in the positive or negative direction in each block. For instance, for the example illustrated in FIG. 4 view (f) can be mathematically expressed as:

$$F = \begin{pmatrix} 0 & 0 & +1 & -1 & 0 & 0 \\ 0 & +1 & 0 & 0 & -1 & 0 \\ +1 & 0 & 0 & 0 & 0 & -1 \end{pmatrix}. \tag{10}$$

In the following, it is assumed that free evolution times are an integer multiple of a base duration. However, the representation above and design protocol of design conditions according to this disclosure is not limited thereto, and is readily generalizable to arbitrary pulse separations, for example, by additionally specifying the duration spent in each free evolution block, as would be understood by one of ordinary skill in the art.

Exemplary Decoupling Design Conditions

As described in this section, in some embodiments, pulse sequences a design protocol can be constructed with design conditions based on ideal pulses, i.e., without considering pulse imperfections. Embodiments dealing with pulse imperfections are described in further sections.

Using the frame representation described herein, each $S^z$ operator can be described vt $\Sigma_{\mu=x,y,z}F_{\mu k}S^\mu$ in the Hamiltonian for the $k^{th}$ free evolution block, where $F_{\mu k}$ denotes the $(\mu,k)$ element of the matrix F. Using this, each of the average Hamiltonian terms in the ideal pulse limit can be determined. In some embodiments, it is assumed that each free evolution block has equal duration $\tau$. With this assumption, the disorder Hamiltonian can be expressed as $$\overline{H}_{dis} = \frac{1}{N}\sum_{i,k,\mu}\Delta_i F_{\mu k}S_i^\mu, \tag{11}$$

while the three types of interaction terms can be respectively expressed as $$\bar{H}_{ex,r} = \frac{1}{N} \sum_{i,j,k} J_{ij}^{ex,r} \sum_{\mu} (1 - F_{\mu k}^2) S_i^\mu S_j^\mu, \quad (12)$$

$$\bar{H}_{ex,i} = \frac{1}{N} \sum_{i,j,k} J_{ij}^{ex,i} \sum_{\mu,\nu,\sigma} \epsilon_{\mu\nu\sigma} F_{\mu k} (S_i^\nu S_j^\sigma - S_i^\sigma S_j^\nu), \quad (13)$$

$$\bar{H}_{is} = \frac{1}{N} \sum_{i,j,k} J_{ij}^{is} \sum_{\mu} F_{\mu k}^2 S_i^\mu S_j^\mu, \quad (14)$$

where N is the total number of free evolution blocks in the sequence and $\epsilon_{\mu\nu\sigma}$ is the Levi-Civita symbol.

There are two types of functional dependencies on $F_{\mu k}$ in Equations (11)-(14): the disorder Hamiltonian $\bar{H}_{dis}$ and imaginary spin-exchange Hamiltonian $\hat{H}_{ex,i}$ involve terms linear in $F_{\mu k}$, while the real spin-exchange Hamiltonian $\bar{H}_{ex,r}$ and Ising Hamiltonian $\bar{H}_{is}$ involve terms quadratic in $F_{\mu k}$. Since each element $F_{\mu k}$ takes on values 0, ±1, the quadratic term can also be written as $F_{\mu k}^2 = |F_{\mu k}|$.

In some embodiments, the disorder can be reduced by setting a design condition of the design protocol to require that the positive rotations are the same as the number of negative rotations in each of x, y, and z. For example, based on the linear dependence on $F_{\mu k}$ of $\bar{H}_{dis}$ and $\bar{H}_{ex,i}$, these average Hamiltonian contributions can be cancelled when each row μ has an equal number of positive and negative elements, such that they sum to 0. Physically, in some embodiments, this corresponds to guaranteeing, in which each disorder precession around a positive axis is compensated by one in the opposite direction. Applying this criteria to the sequences in FIG. 4, the spin echo represented in FIG. 4 views (a) and (d) and sequence of FIG. 4 views (c) and (f) cancel disorder, while the WAHUHA sequence does not (as shown in FIG. 4 views (b) and (e)). That is, in each of these sequences, for every positive rotation in x, y, or z in the spin echo and the sequence in FIG. 4 views (c) and (f) there is also a negative rotation in x, y, or z, whereas this is not the case in the WAHUHA sequence.

In some embodiments, interaction effects can be suppressed by setting a design condition of the design protocol to require that the rotations in each of x, y, and z are the same. This can be described as symmetrizing interactions. Despite the quadratic dependence on $F_{\mu k}$ of $\bar{H}_{ex,r}$ and $\bar{H}_{is}$ the interactions can be symmetrized into a Heisenberg Hamiltonian by choosing the sum $\Sigma_k |F_{\mu k}|$ to be the same for each μ. In some embodiments, this preserves coherence, for example, because globally polarized initial states that can be prepared experimentally constitute an eigenstate of the Heisenberg interaction, and consequently there will be no dephasing under the Heisenberg Hamiltonian. Therefore, the spin echo represented in FIG. 4 views (a) and (d) does not symmetrize interactions, while the WAHUHA sequence as represented in FIG. 4 views (b) and (e) and the sequence of FIG. 4 views (c) and (f) symmetrize the interaction Hamiltonian into a Heisenberg form.

According to the above, according to some embodiments, a design protocol can be expressed with the following two design conditions on the matrix F for dynamical decoupling (disorder and interactions) as:

Disorder $\bar{H}_{dis}$ and imaginary spin-exchange $\bar{H}_{ex,i}$ suppression: each row sums to 0, i.e.

$$\sum_k F_{\mu k} = 0, \text{ for } \mu = 1, 2, 3. \quad (15)$$

Ising interaction $\bar{H}_{is}$ and real spin-exchange $\bar{H}_{ex,r}$ symmetrized into Heisenberg form: each row should have an equal number of nonzero elements, i.e.

$$\sum_k |F_{1k}| = \sum_k |F_{2k}| = \sum_k |F_{3k}|. \quad (16)$$

These design conditions can be extended to the case where different free evolution blocks have different length by weighting each of the terms by their corresponding evolution time. In addition, while the above focuses on single-body and two-body interactions, the design conditions can be extended to an interaction involving more spins, as described further herein. For example, as described herein, in some embodiments results from unitary t-designs prove that the same design conditions described above also guarantee decoupling three-body interaction effects for polarized initial states.

Decoupling Design Conditions for Finite Pulse Imperfections

According to some embodiments, design protocols can also include design conditions that take into account pulse imperfections in the pulse sequences. The formalism and frame representation described herein can also be used to express such design conditions that take into account average Hamiltonian finite pulse imperfections. For example, these correspond to the average Hamiltonian $H'_{k,k+1}$ during the pulse introduced in equation (7), and includes contributions from disorder and interactions, interaction cross-terms, and/or rotation angle errors, according to some embodiments.

Figure 5A:
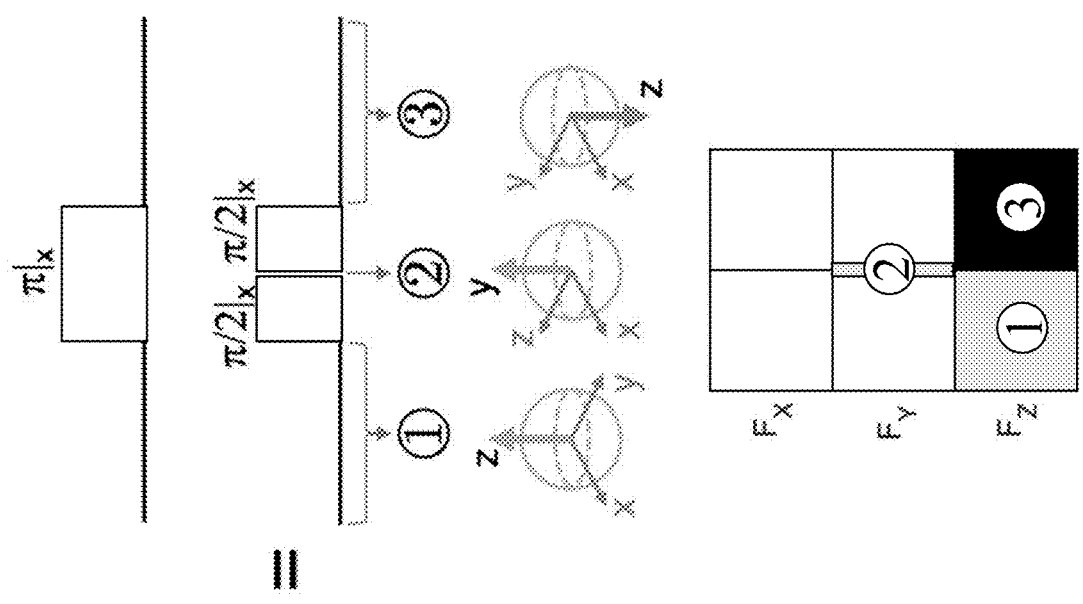
FIG. 5A illustrates intermediate frame orientations, according to some embodiments.

As described in further detail herein, some embodiments of the design protocol can include design conditions to cancel the following pulse duration effects:

Disorder and Direct Interaction Contributions:

In some embodiments, all pulses can be rephrased as all pulses in terms of π/2 pulse building blocks, and intermediate frame orientations between each π/2 pulse of a full π are accounted for (for example as described with reference to FIG. 5A). For example, a π pulse can be treated as a concatenation of two π/2 pulses with no time separation, as shown in the top of FIG. 5A. The middle of FIG. 5A shows the Bloch spheres that result from treating the π pulse as two π/2 pulses. Therefore, in some embodiments, the design protocol can take into account an intermediate frame between the two π/2 pulses (as shown in the bottom of FIG. 5A). Intermediate frames, such as these, can be referred to as patching frames. These patching frames can be represented as a narrow bar between free evolution periods T, as shown for example in FIGS. 5C-5D.

Interaction Cross Terms:

In some embodiments, for each pair of axes, the "parity" of frame changes sums to 0. Mathematically, this can be written as the condition $$\sum_k F_{\mu,k} F_{\nu,k+1} + F_{\mu,k+1} F_{\nu,k} = 0, \quad (17)$$

for (μ, v)=(1, 2), (1, 3), (2, 3), where the summation is a cyclic sum over all evolution blocks. Physically, this expression characterizes whether the operator orientation changed sign.

Rotation Angle Errors:

In some embodiments, for each pair of axes, the "chirality" of frame changes sums to 0. Mathematically, this can be written as the condition $$\sum_k \vec{F}_k \times \vec{F}_{k+1} = \vec{0}, \quad (18)$$

where $\vec{F}_k = \Sigma_\mu F_{\mu,k} \vec{e}_\mu$, $\vec{e}_\mu$ are the unit vectors along the axis directions, and the summation over k is a cyclic sum over all evolution blocks. Physically, this expression is a cross product between neighboring spin operator orientations, which corresponds to the direction of the rotation axis in the toggling frame.

While some embodiments described herein focus on single-body and two-body terms, one of ordinary skill would understand that the description can be generalized to interactions involving three spins.

In some embodiments, frames during the free evolution period also provide a description of imperfections during the driven evolution. In some embodiments, additional effects such as waveform transients and pulse shape imperfections are analyzed in a similar fashion to leading order, although the pulses are assumed to be Markovian (i.e. the unitary operator of one pulse is not modified by its preceding pulses).

Finite Pulse Widths

Figure 5B:
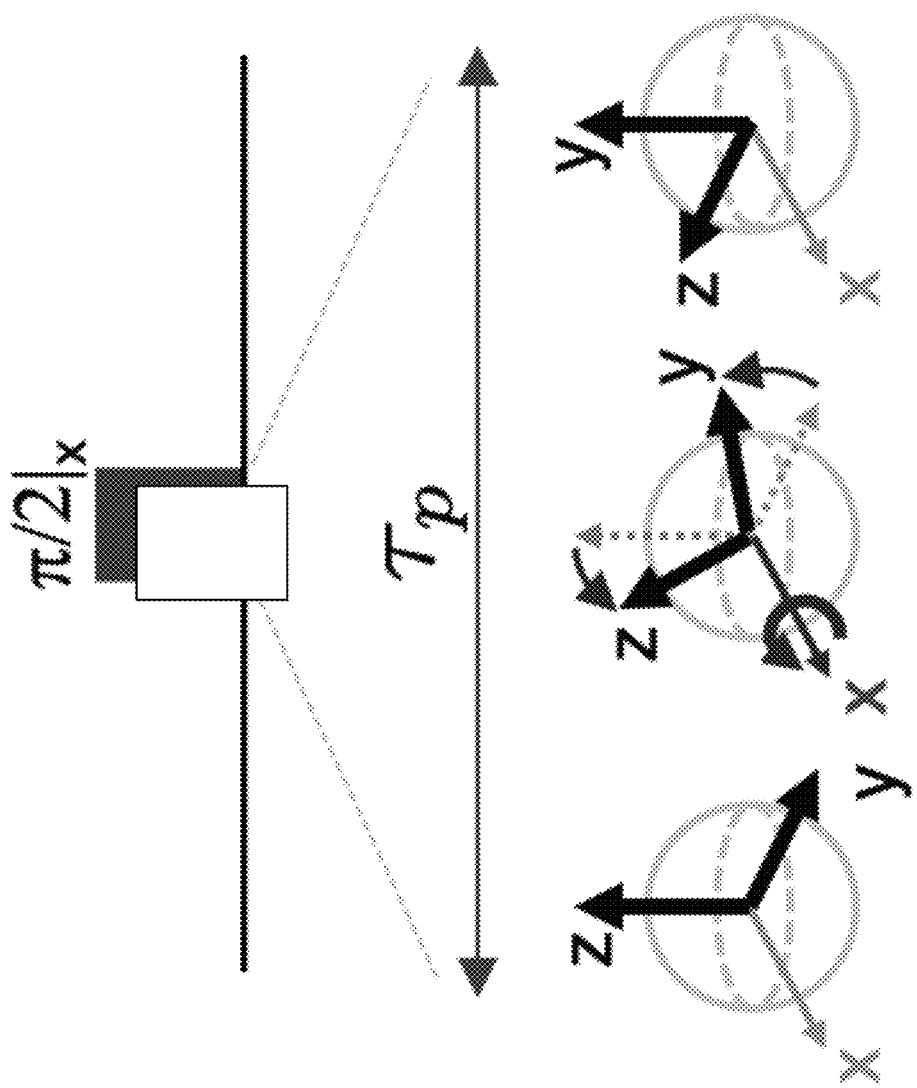
FIG. 5B illustrates interacting picture Hamiltonian evolution during a pulse, according to some embodiments.

In some embodiments, the design protocol includes design conditions that take into account the effects of pulse widths, i.e., finite pulse durations, that take place between the free evolution periods $\mathcal{T}$. In some embodiments, the effects of a finite pulse duration $t_p$ can be determined by calculating the average Hamiltonian, for example, for a π/2 pulse building block. For illustration the average Hamiltonian during π/2 pulse that causes a rotation of the frame from +z into +y can be described as $$\bar{H}_{\pi/2} = \frac{2}{\pi} \int_0^{\pi} U_0^\dagger U(\theta)^\dagger H_f U(\theta) U_0 d\theta, \quad (19)$$

where $U_0$ is the unitary evolution operator due to the preceding pulses, and $U(\theta)$ describes the rotation of the π/2 pulse up to angle θ. Physically, this corresponds to the $S^z$ operator being continuously transformed as $S^z(\theta) = S^z \cos\theta + S^y \sin\theta$ in the toggling frame (FIG. 5B). Carrying out the integral over the angle, the average Hamiltonian during the π/2 pulse can be rewritten as $$\bar{H}_{\pi/2} = \frac{2}{\pi}(H_1^{dis} + H_2^{dis}) + \frac{2}{\pi}(H_1^{ex,i} + H_2^{ex,i}) + \frac{1}{2}(H_1^{is} + H_2^{is}) + \quad (20)$$
$$\frac{1}{2}(H_1^{ex,r} + H_2^{ex,r}) + \sum_{i,j} \frac{J_{ij}^{is} - J_{ij}^{ex,r}}{\pi}(S_i^z S_j^y + S_i^y S_j^z).$$

Thus, the average Hamiltonian during a pulse of finite duration is given by the average of the Hamiltonians in the initial and final frames (i.e., $\frac{1}{2}(H_1^{is} + H_2^{is}) + \frac{1}{2}(H_1^{ex,r} + H_2^{ex,r})$, and as shown in FIG. 5B), plus a cross-term $$\text{(i.e., } \Sigma_{i,j} \frac{J_{ij}^{is} - J_{ij}^{ex,r}}{\pi}(S_i^z S_j^y + S_i^y S_j^z)\text{),}$$

relating to the rotation of the frame from +z to +y. As would be apparent to one of ordinary skill in the art, similar expressions will also hold for other π/2 rotations other than a frame change from +z to +y, such as rotations from +z to +x, +y to +z, +y to +x, +x to +z, and +x to +y. In addition, in some embodiments, this analysis can be applied to other pulses using a π/2 pulse as a building block. For example, in some embodiments this analysis can be applied to π pulses, which can be regarded as a combination of two π/2 pulses with the specification of the patching frame.

Figure 5C:
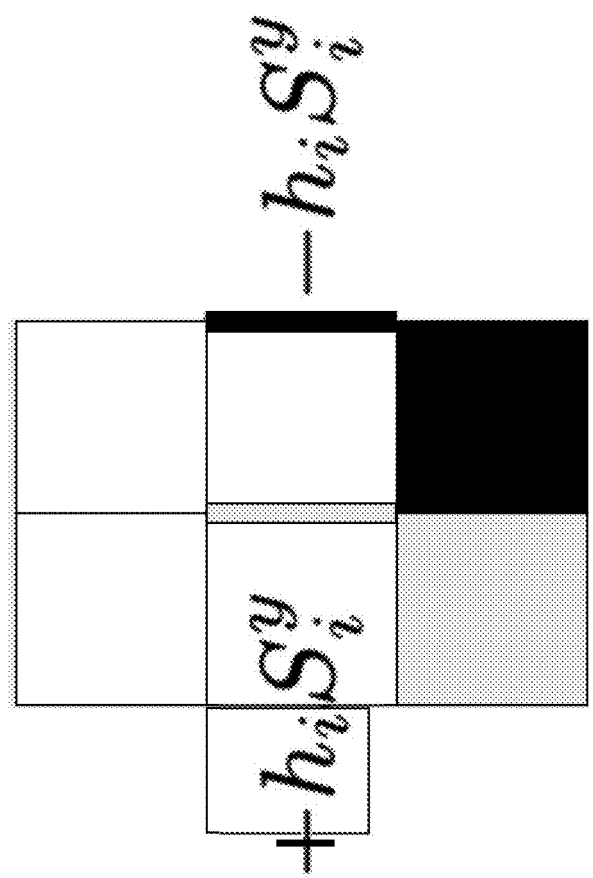
FIG. 5C illustrates an example portion of a pulse sequence, according to some embodiments.
Figure 5D:
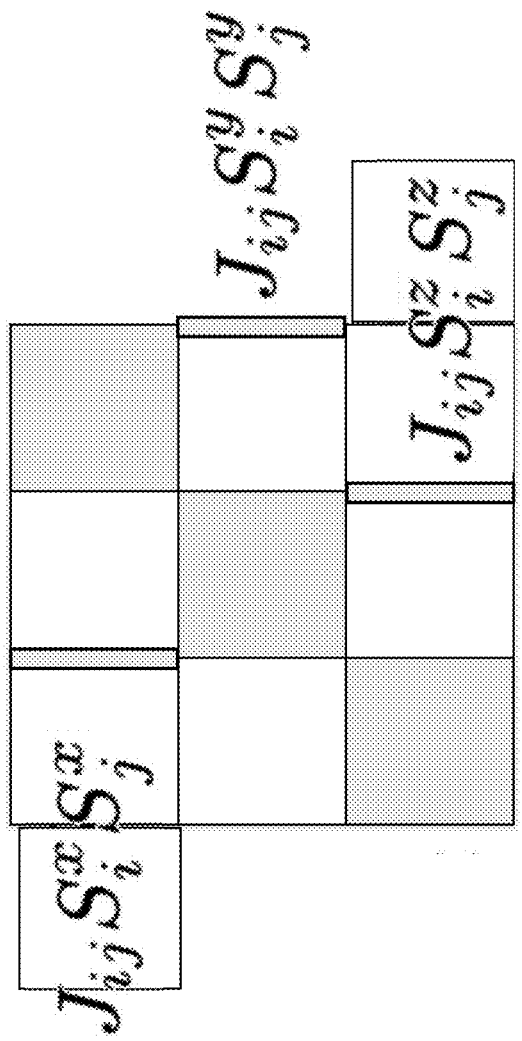
FIG. 5D illustrates an example portion of a pulse sequence, according to some embodiments.

Therefore, in some embodiments, each free evolution period of duration $\mathcal{T}$ as an effective free evolution of duration $\mathcal{T} + 4t_p/\pi$ for disorder and imaginary spin-exchange (as shown in FIG. 5C), and as duration $\mathcal{T} + t_p$ for real spin-exchange and Ising interactions (as shown in FIG. 5D). Therefore, in some embodiments, the design conditions for disorder and interaction decoupling described in equations (15) and (16) can further take into account the average terms in the patching frames (intermediary frames) preceding and following each free evolution period $\mathcal{T}$ that result from finite pulse width, as shown in FIGS. 5C-5D. For example, as shown in FIG. 5C, there is one positive and one negative $h_i S_i^y$ patching frame for $F_y$, satisfying the design condition imposed by equation (15). Applying this design condition to the patching frames resulting from finite pulse duration suppresses disorder. In addition, for example, as shown in FIG. 5D, there is one finite pulse interaction patching frame for each of $F_x$, $F_y$, and $F_z$, satisfying the design condition imposed by equation (16). Applying this design condition to the patching frames resulting from finite pulse duration suppresses interaction effects.

Figure 5E:
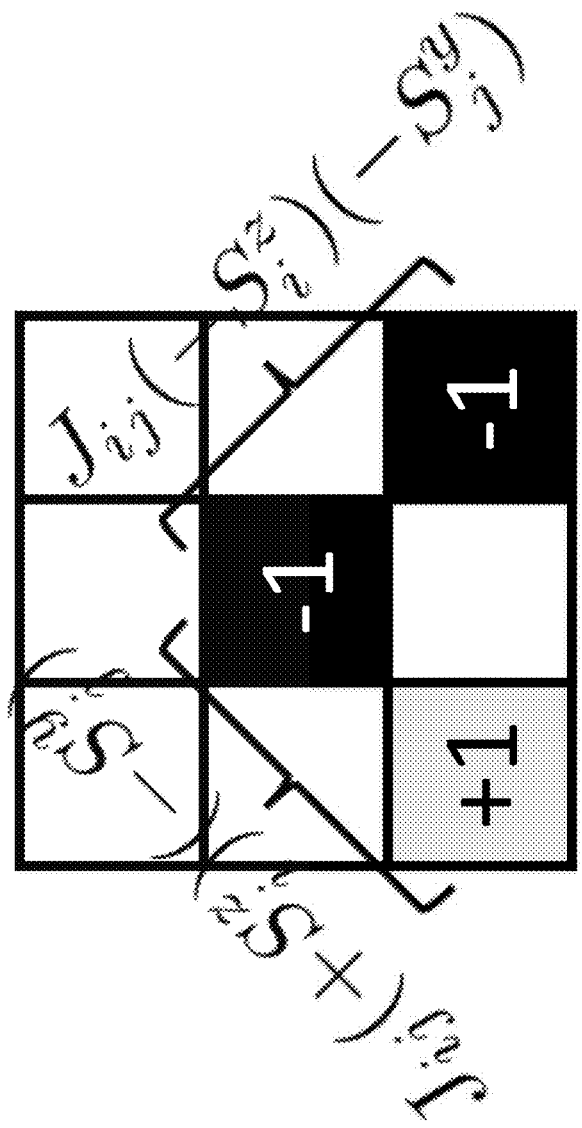
FIG. 5E illustrates an example portion of a pulse sequence, according to some embodiments.

In some embodiments, design conditions can also be included to address the cross term $$\left(\Sigma_{i,j} \frac{J_{ij}^{is} - J_{ij}^{ex,r}}{\pi}(S_i^z S_j^y + S_i^y S_j^z)\right)$$

described above. Since the sign of the interaction cross-term corresponds to the product of the parity of initial and final frames, for each pair of directions, a design condition according to some embodiments requires that the number of neighboring frames with a positive parity product be equal to the number of neighboring frames with a negative parity product (for example as described in equation (17) and illustrated in FIG. 5E).

The frame representation discussed above with respect to the free evolution period can be extended to systematically analyze pulse duration imperfections. In some embodiments, π/2 pulses are used as the basic building block, all other types of pulses are phrased in terms of them. In some embodiments, this representation has the advantage that imperfections become much easier to analyze, as discussed further herein, and that each rotation can be uniquely specified by the frame orientations.

Using π/2 pulses as the basic building block, according to some embodiments, requires the additional specification of "patching" frames for pulses of larger rotation angles. These patching frames keep track of the intermediate spin, for example the spin pointing at the middle of a π pulse. This corresponds to decomposing the π pulse into two π/2 pulses, one right after another (for example as shown in FIG. 5B). In some embodiments, an alternative way to view a π-pulse is a sequence of π/2 pulses with a free evolution period of zero time in between the two π/2 pulses. Therefore, the frame representation can be extended to include these short patching frames by adding an additional row to indicate the duration of free evolution for each frame orientation. For example, the spin echo pulse sequence of FIG. 4 views (a) and (d) can be written as $$F = \begin{pmatrix} 0 & 0 & 0 \\ 0 & +1 & 0 \\ +1 & 0 & -1 \\ \tau & 0 & \tau \end{pmatrix}, \quad (21)$$

where the middle column is the patching frame introduced for the π pulse. The patching frame has duration zero, as shown in the bottom row, whereas the two π/2 pulses have duration τ. Similarly, the pulse sequence of FIG. 4 views (c) and (f) and equation (10) can be written as $$F = \begin{pmatrix} 0 & 0 & +1 & 0 & -1 & 0 & 0 \\ 0 & +1 & 0 & +1 & 0 & -1 & 0 \\ +1 & 0 & 0 & 0 & 0 & 0 & -1 \\ \tau & \tau & \tau & 0 & \tau & \tau & \tau \end{pmatrix}. \quad (22)$$

In some embodiments, a patching frame can also be introduced for π/2 pulses, in which the usual π/2 rotation is implemented by a composite pair of π/2 pulses along different axes, instead of by a single pulse. These patching frames for π/2 pulses can be important, for example, in maximizing sensitivity and maintaining efficient dynamical decoupling as discussed further herein.

Rotation Angle Errors

In some embodiments, the design protocol can also include design conditions that take into account control errors, such as systematic rotation angle error. For example, a rotation angle error around the +x̂ direction can be compensated with another rotation around the −x̂ direction. In some embodiments, rotation angle error effects can be analyzed directly for the average Hamiltonian. This can be different from the rotation axis applied in the lab frame in some embodiments.

For example, for a π/2-pulse $$P_k = \exp\left(-i\frac{\pi}{2}A_k\right)$$

around some axis $A_k$, according to some embodiments, a rotation angle error corresponds to an actual rotation $$\tilde{P}_k = \exp\left[-i\left(\frac{\pi}{2} + \delta\theta\right)A_k\right]$$

being applied. In some embodiments, this can be equivalently regarded as an error term $$\frac{\delta\theta}{t_p} A_k$$

acting during the rotation. The average Hamiltonian in the toggling frame corresponding to this can be calculated as $\overline{H}_{r,k} = U_{l-1}^\dagger H_{r,k} U_{k-1}$. This can be rewritten by making use of the expressions for the initial and final frames of this pulse:

$$U_{k-1}^\dagger S^z U_{k-1} = \sum_\mu F_{v,k-1} S^\mu, \quad (23)$$

$$U_{k-1}^\dagger P_k^\dagger S^z P_k U_{k-1} = U_k^\dagger S^z U_k = \sum_\mu F_{u,k} S^\mu. \quad (24)$$

Inserting $U_{k-1} U_{k-1}^\dagger = I$ into the latter equation gives the following expression $$\left(U_{k-1}^\dagger P_k U_{k-1}\right)^\dagger \left(\sum_v F_{v,k-1} S^v\right)\left(U_{k-1}^\dagger P_k U_{k-1}\right) = \sum_\mu F_{u,k} S^\mu, \quad (25)$$

$U_{k-1}^\dagger P_k U_{k-1}$ is the rotation pulse exp $$\left(-i\frac{\pi}{2}B_k\right)$$

that, in the toggling frame representation, rotates the k−1th frame into the kth one. In some embodiments, the rotation axis direction $B_k$ is obtained from a cross product between the initial and final toggling frame directions, which corresponds to each term in equation (18).

Since $$P_k = \exp\left(-i\frac{\pi}{2}A_k\right),$$

where $A_k$ is proportional to a Pauli matrix, the unitary $U_{k-1}$ can be moved into the exponential $$U_{k-1}^\dagger P_k U_{k-1} = \exp\left(-i\frac{\pi}{2}U_{k-1}^\dagger A_k U_{k-1}\right) = \exp\left(-i\frac{\pi}{2}B_k\right). \quad (26)$$

Thus, the average Hamiltonian can be expressed as $$\overline{H}_{r,k} = U_{k-1}^\dagger \frac{\delta\theta}{t_p} B_k, \quad (27)$$

which is uniquely specified by the initial and final frames of the rotation pulse, as determined by the chirality of the frame change Equation (18).

In some embodiments, an alternative geometric picture of the preceding derivation is as follows: the analysis starts with an internal frame coordinate system on the Bloch sphere (arrows) that coincides with the external reference coordinate system, as shown, for example, in the first Bloch sphere of the bottom panel of FIG. 4 view (c). Rotations are applied along the axes of the fixed external coordinate system, which rotate the toggling frame coordinate system. The direction of the toggling frame coordinate system that coincides with the external +z direction corresponds to $\tilde{S}_z(t)=U_c^\dagger S^z U_c$. To specify the axis of rotation in the toggling frame however, it is conjugated by all of the preceding pulses (this corresponds to following into the toggling frame coordinate system, and determining which axis the rotation is being applied around in this coordinate system). Since the initial and final frame directions in the toggling frame coordinate system are known, the rotation effect is uniquely specified and can be easily characterized by the chirality of the rotation connecting the initial and final frames.

Figure 5F:
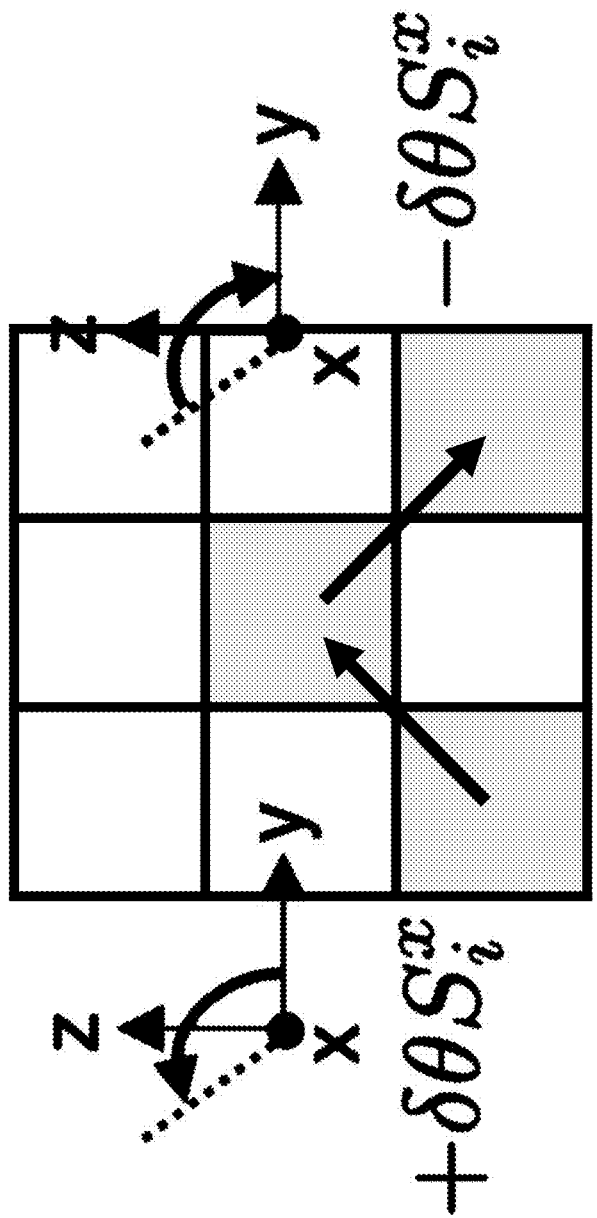
FIG. 5F illustrates an example portion of a pulse sequence, according to some embodiments.

Therefore, in some embodiments, cancellation of rotation angle errors is well-captured by the chirality of each frame change. For example, as shown in FIG. 5F, systematic rotation angle errors are suppressed by choosing opposite chirality between frame changes. Note that since the above discussion considers single-body terms, the analysis applies to both a uniform rotation angle error as well as cases with a field inhomogeneity, according to some embodiments. Rotation axis errors can also be incorporated, as discussed further herein.

Exemplary Sequence Design

The embodiments discussed herein describe algebraic rules (design conditions) for the suppression of disorder, interactions, and one or more kinds of finite pulse duration effects that together make up a design protocol, according to some embodiments. The formalism and frame representation discussed above greatly simplifies the design procedure and enables versatile pulse sequences depending on the dominant effects in the system. According to some embodiments, general statements about sequence optimality and the benefit of certain structures in the pulse sequence can be made.

For example, the minimal number of free evolution blocks required to achieve full suppression of certain effects can be constrained, in some embodiments. Without being bound by theory, in the case of ideal pulses, full cancellation of interactions, for instance, requires at least 3 free evolution blocks in order to achieve the necessary symmetrization, while full cancellation of both interactions and disorder requires 6 free evolution blocks to cover the $\pm\hat{x}$, $\pm\hat{y}$, $\pm\hat{z}$ directions.

In some embodiments, to suppress all average Hamiltonian terms in the presence of pulse imperfections, at least 12 free evolution blocks are required. This is because the parity condition equation (17) for interaction cross terms requires one of the frame orientations to appear twice with the same sign, so in order to achieve the symmetrization between all directions, at least 12 free evolution blocks are required. One embodiment of such a pulse sequence, for example, can be represented as $$F = \begin{pmatrix} 0 & 0 & 1 & 0 & 0 & -1 & 0 & 0 & -1 & 0 & 0 & 1 \\ 0 & 1 & 0 & 0 & -1 & 0 & 0 & 1 & 0 & 0 & -1 & 0 \\ 1 & 0 & 0 & -1 & 0 & 0 & -1 & 0 & 0 & 1 & 0 & 0 \end{pmatrix}, \quad (28)$$

(with the fourth row time label not included as all pulses are of equal duration). According to some embodiments, this pulse sequence decouples all average Hamiltonian terms with only 12 free evolution blocks.

Suppressing Higher Order Effects

Although some embodiments described herein focus on average Hamiltonian theory, higher-order effects can also be incorporated. For example, in some embodiments the Magnus expansion, as described in equations (4)-(6), can be utilized. Without being bound by theory, in this case the average Hamiltonian theory corresponds to truncating the Magnus expansion to zeroth order. However, some embodiments retain more orders of the Magnus expansion and thereby higher-order effects can be suppressed.

First, in some embodiments, combining a pulse sequence with its time-reversed counterpart automatically suppresses all first-order Magnus expansion contributions. In some embodiments, such as with applications such as AC sensing, design protocols are designed so that the time-reversed counterpart does not cancel the desired sensing field contributions.

Second, in some embodiments, the magnitude of higher-order contributions can be reduced by taking into account the dominant energy scales in the system and designing pulse sequences to suppress such effects first, as one of ordinary skill would understand in light of this disclosure. Without being bound by theory, this can be because the commutators of other evolution pieces with the dominant Hamiltonian terms cancel. In some embodiments, this type of higher-order suppression can be extended to disorder-dominated or control-inhomogeneity-dominated systems, as discussed further herein. In some embodiments, the technique of second-averaging in NMR can also allow engineering a dominant term in the Hamiltonian, such that the effects of undesired contributions are suppressed. In some embodiments, the fastest timescale of the pulse sequence is designed to suppress the highest priority effect or contribution.

Third, in some embodiments, since the representation described herein can provide a complete description of the Hamiltonian at all times, the design conditions can be rewritten to directly incorporate higher-order Magnus terms. In some embodiments, this design process can be simplified by using techniques such as pulse cycle decoupling, which allows analysis of the higher-order decoupling properties of a sequence based on its individual building blocks, as would be understood by one of ordinary skill in the art in light of this disclosure.

Example Pulse Sequences

Figure 6:
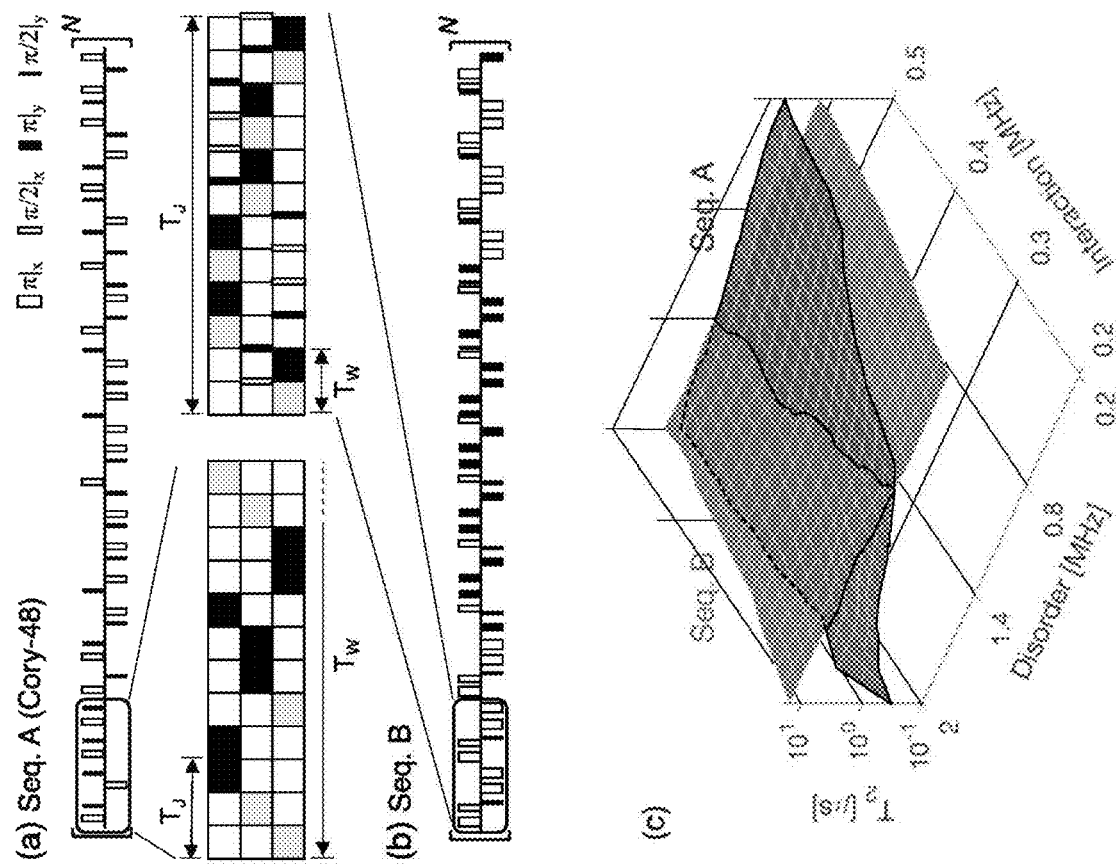
FIG. 6, views (a) through (c) show example aspects of Seq. A and Seq. B pulse sequences, according to some embodiments.

FIG. 6 depicts pulsed decoupling sequences with robustness to different types of dominant energy scales, according to certain embodiments. FIG. 6 view (a) depicts a pulse sequence, Sequence A (Cory-48), according to one embodiment, where axis permutation is performed on the fastest timescale, prioritizing the cancellation of interaction effects. FIG. 6 view (b) depicts a pulse sequence, Sequence B, according to one embodiment, where spin echoes are performed on the fastest timescale, prioritizing disorder decoupling. FIG. 6 views (a) and (b) also show frame representations for the first 12 free precession intervals of each sequence, including the time-scales for interaction decoupling ($T_J$) and disorder decoupling ($T_W$). FIG. 6 view (c) depicts $T_2$-decay time for the sequences in (a) (outlined in black) and (b) (not outlined) as a function of disorder and interaction strength, where a clear crossover of performance is observed. Pulses are assumed to be infinitesimally short and $\tau=20$ ns.

In some embodiments, the techniques described in the present disclosure can be combined with other techniques, such as spin-bath engineering, photon-collection optimization, double-quantum magnetometry, and novel diamond growth techniques, which together can push the volume-normalized sensitivity even lower, for example below the picotesla level in a μm³ volume for spin densities above 50 ppm. Such a sensitivity can be applied, according to some embodiments, to many applications, such as nanoscale nuclear magnetic resonance and investigations of strongly correlated condensed matter systems. In some embodiments, example fault-tolerant sequences designed according to the disclosed protocol can be generate a broad class of many-body Hamiltonians, for example based on a time-domain transformations of local Pauli spin operators, providing a tool to apply non-equilibrium phenomena in driven quantum systems as well as to create highly entangled states for, for example, interaction-assisted quantum metrology.

Example Design Protocol Effects

Without being bound by theory, example embodiments of the disclosed protocol for designing pulse sequences go beyond the limitations of current design methods in the following aspects, as discussed throughout the present disclosure.

Fault-Tolerance:

Different types of average Hamiltonian effects, including those of finite pulse imperfections, can be readily incorporated as concise, intuitive algebraic conditions on the choice of toggling frame orientations, according to some embodiments. This provides, in some embodiments, a protocol to design pulse sequences for interacting spin ensembles that have robustness automatically built in.

Generality of Hamiltonian:

Embodiments of the present disclosure can be used for general spin-½ Hamiltonians under the secular approximation (e.g., rotating wave approximation in a strong external magnetic field). This can include the standard on-site disorder and dipolar interaction terms, and/or can also extend to two-body imaginary spin-exchange interactions, and/or generic interactions involving up to three-body spin operators.

Versatile Adaptation to Different Experimental Systems:

Existing NMR approaches use pairs of π/2 pulses (solid echo pulse block) for interaction decoupling. This approach can decouple interactions first, but may only be effective for systems dominated by dipolar interactions. Embodiments of the disclosed protocol allow for the design of pulse sequences that are specifically tailored to other types of systems, where disorder or control inhomogeneities are dominant, even while interactions still play a role in the dynamics (see FIG. 3, view (a)).

Optimality:

In some embodiments, using simple algebraic conditions described throughout the present disclosure for decoupling of various effects, the shortest length to achieve full decoupling of a given set of terms can be determined. Embodiments of the disclosed combinatorial analysis can be used to provide sequences that can provide optimal sensitivity to AC signals.

Adaptable to Many Applications:

Embodiments of the disclosed protocol can be adapted to many applications beyond magnetometry using NV centers, such as quantum sensing and quantum simulation, which can impose additional requirements that can be input into the disclosed protocol.

Example Design Protocol Applications

Example applications of embodiments of the disclosed protocol include, but are not limited to:

Protecting Quantum Information:

In some embodiments, interacting spin ensembles can be dynamically decoupled to protect the coherence of an initial state. In some example applications, disorder terms in the Hamiltonian can be fully canceled, and interactions can be symmetrized into a Heisenberg form. Since the example polarized initial states are an eigenstate of the Heisenberg Hamiltonian, such embodiments will not experience dephasing under such an interaction, and the coherences will be long-lived, thereby protecting quantum information stored in the initial state.

Quantum Sensing:

In addition to the conditions for dynamical decoupling described throughout the present disclosure, embodiments of sequences developed using the disclosed protocol can have well-defined sensing resonances, such that efficient phase accumulation is incurred due to an external field to be sensed. Without being bound by theory, the Fourier transform of the disclosed toggling frame representation can demonstrate this example property. In some embodiments, optimizing sensitivity can involve aligning the resonance frequency and phase for each of the axes directions to a field to be sensed, as well as or in the alternative to choosing optimal initialization and readout directions described throughout the present disclosure.

Quantum Simulation:

In some embodiments, the conditions for full decoupling can be relaxed, allowing the disclosed protocol to engineer specific types of many-body disorder and interaction Hamiltonians. For example, the same description for the cancellation of certain Hamiltonian terms can be rephrased for the engineering of the Hamiltonian, by changing the condition from being equal to zero into being a finite value, for example as described in the description of Quantum Simulation below.

Disorder and Interactions

FIG. 3, views (a) through (c) show example aspects of a fault-tolerant sequence design, according to some embodiments of the present disclosure. View (a) is a diagram representing the interplay between disorder, interactions, and control errors in different quantum systems, according to some embodiments. As shown in FIG. 3, view (a), quantum systems may exhibit some combination of disorder 302, control error 304, and inter-spin interactions 306, with various amounts. For example, a disorder-dominated system is shown as System A 310 and an interaction-dominated system is shown as System B 320. FIG. 3, view (b) shows example tasks for quantum systems, according to some embodiments. For example, quantum systems can be used for protecting quantum information, quantum sensing (e.g., of magnetic fields), and/or simulation (e.g. as a quantum computer or simulation programmed into a quantum state and evolution). FIG. 3, view (c) shows an example optimized pulse sequence designed to target both the limitations of a given physical system (FIG. 3, view (a)) and the desired operation modality (FIG. 3, view (b)), according to some embodiments. As shown in FIG. 3, view (c), the example pulse sequence comprises pulses $P_1$-$P_6$ are applied with time delays $\tau_1$-$\tau_7$ repeated N times.

Example Pulse Imperfections

Without being bound by theory, for purposes of understanding certain example pulse imperfections, in some embodiments a general form of a Hamiltonian can be given by:

$$H(\theta) = U_0^\dagger U(\theta)^\dagger H_f U(\theta) U_0 = \sum_i \Delta i [S_i^z \cos\theta + S_i^y \sin\theta] + \quad (29)$$

$$\sum_{i,j} J_{ij}^{ex,i} [(S_i^x S_j^y - S_i^y S_j^x)\cos\theta + (-S_i^x S_j^z + S_i^z S_j^x)\sin\theta] +$$

$$\sum_{i,j} J_{ij}^{ex,r} \vec{S}_i \cdot \vec{S}_j + \sum_{i,j} (J_{ij}^{is} - J_{ij}^{ex,r})[S_i^z S_j^z \cos^2\theta + S_i^y S_j^y \sin^2\theta] +$$

-continued $$\sum_{i,j} \frac{1}{2}(J_{ij}^{is} - J_{ij}^{ex,r})(S_i^y S_j^z + S_i^z S_j^y)\sin(2\theta).$$

Finite Pulse Width Effects:

Without being bound by theory, according to some embodiments, the derivation of the average Hamiltonian for a π/2 pulse with finite pulse width can be given as follows. According to some embodiments, in an example in which the initial toggling frame with $\tilde{S}^x(0)=S^x, \tilde{S}^y(0)=S^y, \tilde{S}^z(0)=S^z$ is rotated, such that the rotation brings the frame from +z into +y, in the interaction picture relative to the instantaneous control pulse, the operators are transformed as $\tilde{S}^x(\theta)=S^x, \tilde{S}^y(\theta)=S^y \cos\theta - S^z \sin\theta$, $\tilde{S}^z\theta = S^z \cos(\theta) + S^y \sin\theta$. Plugging this into the form of the average Hamiltonian, the instantaneous interaction picture Hamiltonian discussed above can be found.

Without being bound by theory, the transformation properties of the interaction during the free evolution period can, in some embodiments, also dictate the response during the finite pulse width evolution. For example, the disorder and imaginary spin exchange terms, which transform linearly in $F_{\mu k}$, involve cos θ or sin θ terms and operators that are proportional to the corresponding Hamiltonian terms in the toggling frames preceding and following the pulse. Meanwhile, the real spin exchange and Ising terms, which transform quadratically in $F_{\mu k}$, involve similar terms with $\cos^2 \theta$ and $\sin^2 \theta$ prefactors.

Analysis of Rotation Axis Errors:

In some embodiments, incorporation of axis errors depends on details of experimental implementation. In some embodiments, the Hamiltonian is described by the cross product of the rotation angle error and disorder. In some embodiments, this obtains results conditioning.

Example Three-Body Interactions

Without being bound by theory, example decoupling conditions for three-body interactions are described below, according to some embodiments. Without being bound by theory, in the limit of ideal pulses, the decoupling conditions described throughout the present disclosure can partially or fully suppress dynamics under any three body interactions for a polarized initial state, according to some embodiments. An example extension of the formalism can account for finite pulse duration effects in the presence of three-body interactions.

Some physical systems only involve two-body interactions, while other systems can involve interactions involving more particles, which can lead to a number of physical phenomena, in some embodiments. For example, fractional quantum Hall state wavefunctions can appear as the ground state of Hamiltonians involving three-body interactions, and other examples of topological phases and spin liquids can be constructed as ground states of such many-spin Hamiltonians. Other examples include cold molecules, superconducting qubits, and a higher-order term in the Magnus expansion of a system with only two-body interactions. Thus, transformation of three-body interactions under periodic driving and the application of the disclosed protocol are discussed below.

First, to the complete control and engineering of such interactions, example conditions for dynamical decoupling of such interactions to suppress any dynamics for a polarized initial state are disclosed, according to some embodiments. For example, interactions under the secular approximation can be considered such that all terms in the Hamiltonian commute with a global magnetic field in the z-direction.

Ideal Pulse Limit:

without being bound by theory, before discussing example details of the three-spin coupling, the following nonlimiting lemma for interactions under the secular approximation can be proved.

Lemma: For any interaction under the secular approximation, averaging under the spin-½ single qubit Clifford group can be equivalent to averaging under unitary operators that cover the six axis directions.

Proof: without being bound by theory, the lemma can be proved by first considering a generic n-body interaction Hamiltonian H and a set of unitary operators $U_k$ (k=1, 2, . . . ,N) to average over, then $$H_{ave} = \frac{1}{N}\sum_k (U_k^\dagger)^{\otimes n} H U_k^{\otimes n}. \tag{30}$$

The elements of the Clifford group can be grouped by how they transform the $S^z$ operator, such that each set contains elements that satisfy $U^\dagger S^z U = (-1)^\nu S^\mu$, but $U^\dagger S^x U$ can take four distinct values that are orthogonal to the $S^\mu$ operator direction. In the disclosed frame representation, these can correspond to a single term specified by $(-1)^\nu S^\mu$. Thus, proving the lemma reduces to proving that the four Clifford elements above give identical Hamiltonians.

Given two elements $U_1$ and $U_2$ in the set, there can exist a rotation $U_z$ around the $\hat{z}$ axis such that $U_1 = U_z U_2$ (this leaves the interaction picture $\tilde{S}^z$ invariant, but changes $\tilde{S}^x$). The Hamiltonian under conjugation by $U_1$ can then be given by $$H_1 = (U_1^\dagger)^{\otimes n} H U_1^{\otimes n} = (U_2^\dagger)^{\otimes n}(U_z^\dagger)^{\otimes n} H U_z^{\otimes n} U_2^{\otimes n}. \tag{31}$$

Under the secular approximation, a rotation around the $\hat{z}$ axis does not modify the Hamiltonian, since the Hamiltonian can commute with the global $S^z$. Consequently, the preceding average Hamiltonian after conjugating by $U_1$ can be equal to that conjugating by $U_2$, proving the lemma.

In some embodiments, without being bound by theory, given this lemma, mathematical results from unitary t-designs can show that after symmetrizing along the six axis directions, as can be guaranteed by the conditions described in the present disclosure, a polarized initial state can be an eigenstate of the resulting symmetrized Hamiltonian.

In some embodiments, a Unitary t-design is a set of unitary operators $\{U_k\}$, such that for every polynomial $P_{(t,t)}(U)$ of degree at most t in U and at most t in U*, the average over $\{U_k\}$ can be equivalent to the average over the Haar measure of all unitaries of the same dimension. Without being bound by theory, this can imply that for any N-body operator $\mathcal{O}$ with N≤t, the expectation values after performing a global conjugation by the unitaries are the same $$\frac{1}{K}\sum_{k=1}^K (U_k^\dagger)^{\otimes N} \mathcal{O} U_k^{\otimes N} = \int_{\mathcal{U}(2)} dU (U^\dagger)^{\otimes N} \mathcal{O} U^{\otimes N} \triangleq \mathcal{O}_U, \tag{32}$$

where $\mathcal{U}(2)$ is the unitary group of dimension 2. This can imply that the effect of averaging over the finite set of unitary operators $\{U_k\}$ can be equivalent to averaging over all random unitaries, up to observables of order t.

Without being bound by theory, the symmetrizing properties of the right-hand-side of Equation (32), where the average is taken over all elements of the unitary group over the Haar measure, can imply that the resulting average operator $O_U$ can only contain terms proportional to elements of the symmetric group $S_t$ of order t, according to some embodiments. This can be because all other terms can be transformed and symmetrized out by the average, but elements of the symmetric group, which permute the labels of the states, can be invariant due to the product structure of the unitary operators, in some embodiments.

The Clifford group can form a unitary 3-design. Without being bound by theory, in some embodiments, this, combined with the lemma presented above, can imply that for any sequence that equally covers all six axis directions, all interactions involving three particles or less can be symmetrized into a form that only contains terms proportional to elements of the symmetric group. In some embodiments, any initial state with all spins polarized in the same direction can then be an eigenstate of this symmetrized interaction, since this state can be invariant under any permutation of the elements. Correspondingly, a polarized initial state does not experience decoherence under this interaction, according to some embodiments.

As a nonlimiting example of this result, the interaction $H_{int}=J(S^xS^yS^z)-S^yS^xS^z$ can be considered. The symmetrized Hamiltonian can be calculated to be $$H_{int} = \frac{J}{3} \sum_{i,j,k} \in_{ijk} S^i S^j S^k,$$

where $\in_{ijk}$ is the Levi-Civita symbol. Without being bound by theory, in some embodiments it has been verified that any globally polarized initial state can be an eigenstate of the symmetrized Hamiltonian with eigenvalue 0.

Without being bound by theory, in some embodiments, the preceding procedure can also suggest that four-body interactions can still induce dynamics after symmetrization, since the Clifford group is not a unitary 4-design. It has been verified that this is the case by considering the symmetrized interaction $(S^x)^{\otimes 4}+(S^y)^{\otimes 4}-(S^z)^{\otimes 4}$, which is found to act nontrivially on a generic polarized initial state.

Finite Pulse Duration Effects:

Without being bound by theory, in some embodiments, to achieve robust dynamical decoupling of the interaction Hamiltonian, finite pulse duration effects for three-body interactions can be considered. For this purpose, the disclosed representation of the transformation properties of an interaction term based on the matrix F can be used, which can provide a complete description of the Hamiltonian under the secular approximation, according to some embodiments. Without being bound by theory, in some embodiments, considering up to three-body interactions, similar to equations (11-14), the transformation properties of a generic n-body interaction can be written as a polynomial in $F_{\mu k}$:

$$\tilde{H} = \sum_{l=0}^{3} F_{\mu k}^l G_l,$$  (34)

where $G_l$ includes the spin operators and remaining coefficients. For example, without being bound by theory, any nontrivial three-body interaction can be written as a sum of terms, each composed of a product of nontrivial Pauli operators. The $S^x$ and $S^y$ operators can change the total magnetization by 1, so that under the secular approximation there can be an even number of them. Consequently, the interaction can either be of the form $S^zS^zS^z$, or involve the tensor product of an $S^z$ operator and a polarization-conserving two-body operator, which can be $S^xS^x+S^yS^y$ or $i(S^xS^y-S^yS^x)$. Without being bound by theory, in some embodiments, each term can be written as a product of individual pieces that transform as $F_{\mu k}$. For example, the three-body interaction $$i(S^XS^y - S^yS^x)S^z = i\sum_{\mu\nu\sigma} [\epsilon_{\mu\nu\sigma} F_{\mu k}(S_i^y S_j^\sigma - S_i^\sigma S_j^y)][F_{\mu k}S^\mu]$$  (35)

In some three-body interaction embodiments, the first step is to control decoupling.

Comparison of Sequence Performance

Figure 7A:
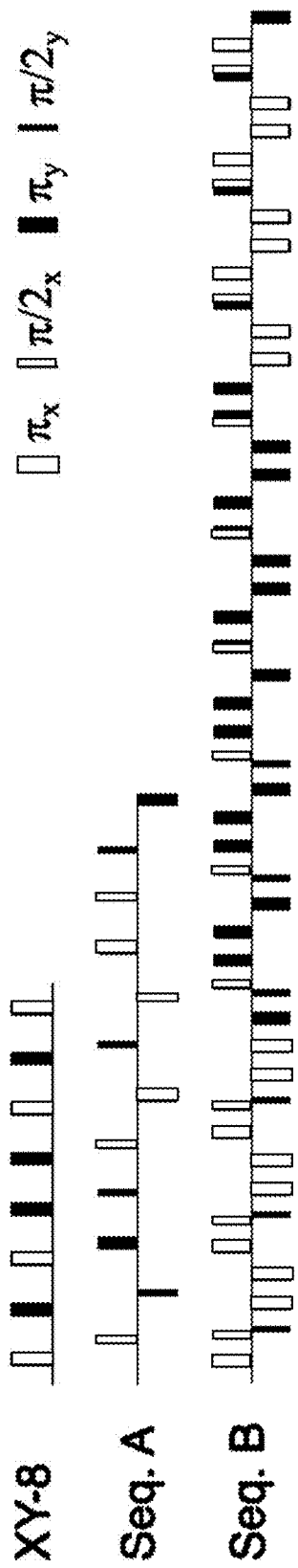
FIGS. 7A-7D show example dynamics and features of various pulse sequences, according to some embodiments.
Figure 7B:
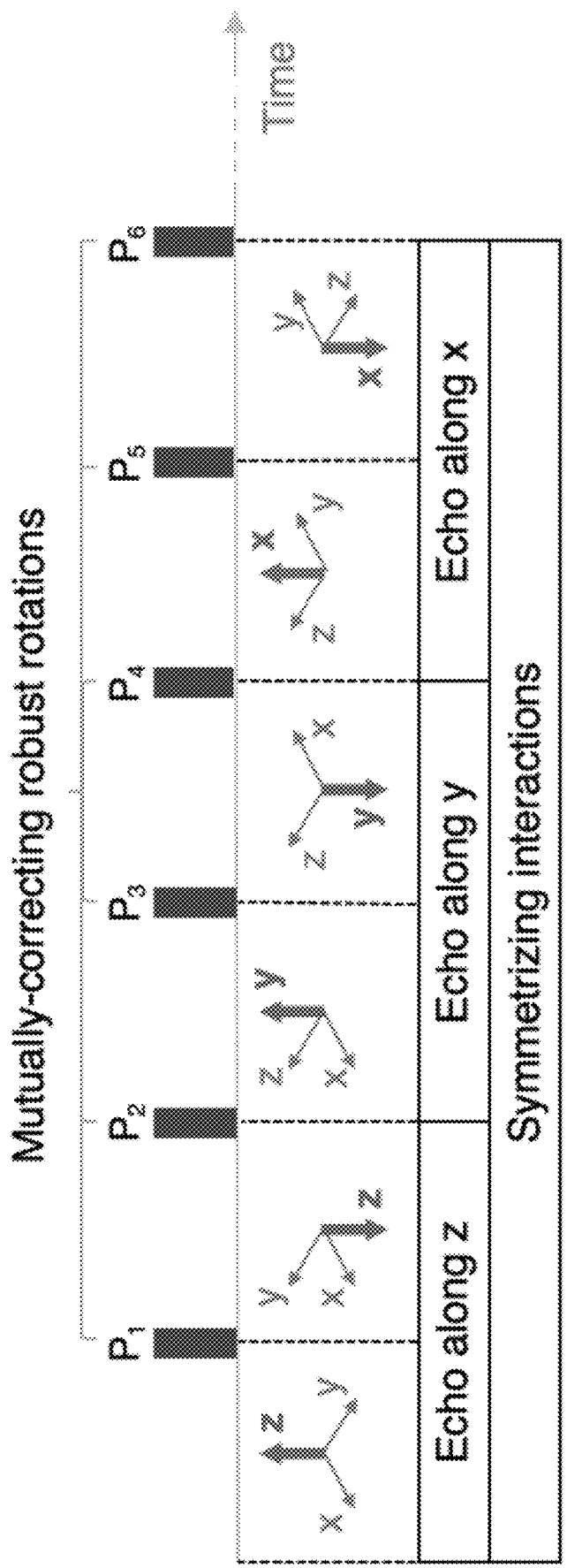
Figure 7C:
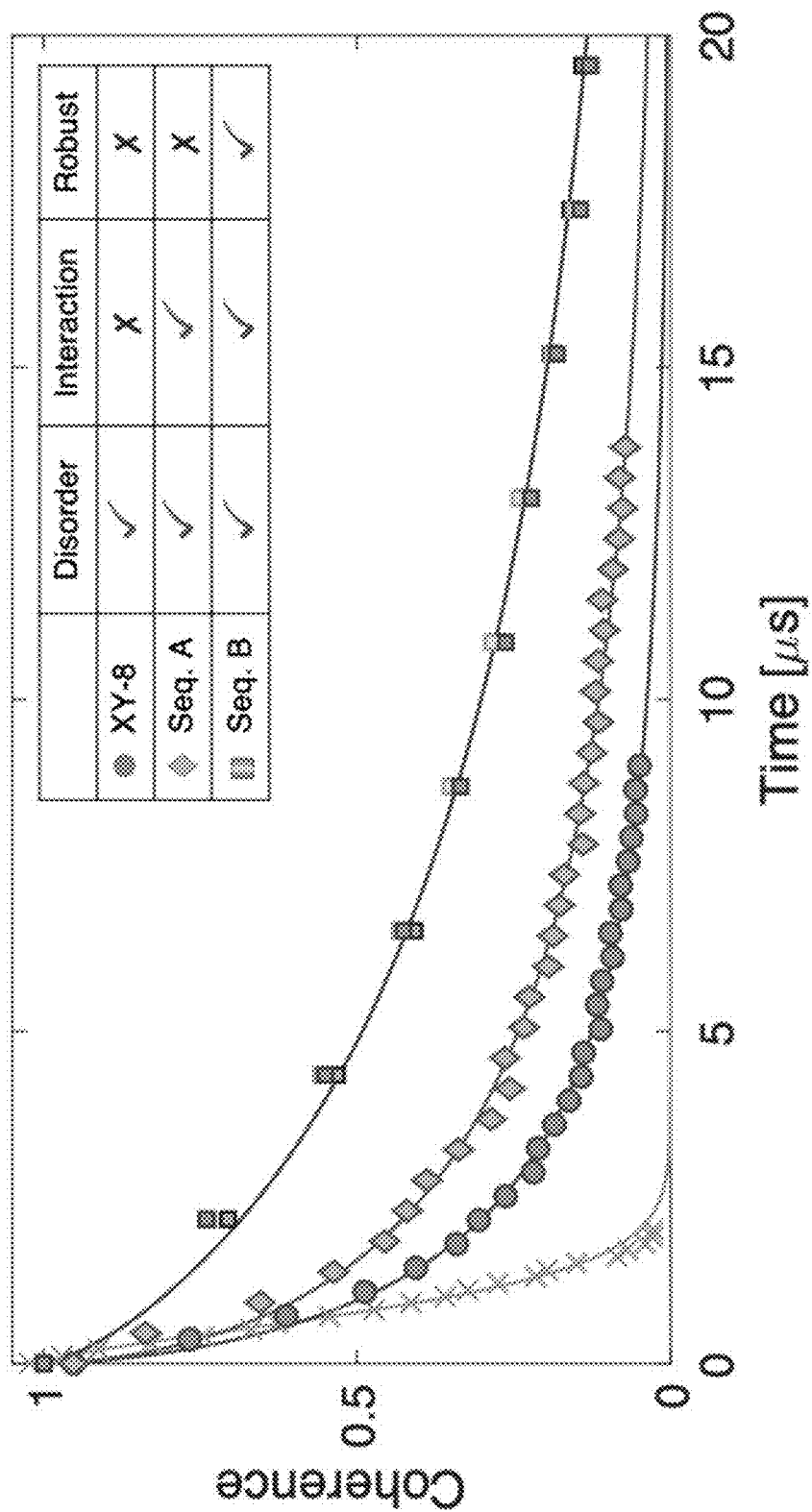
Figure 7D:
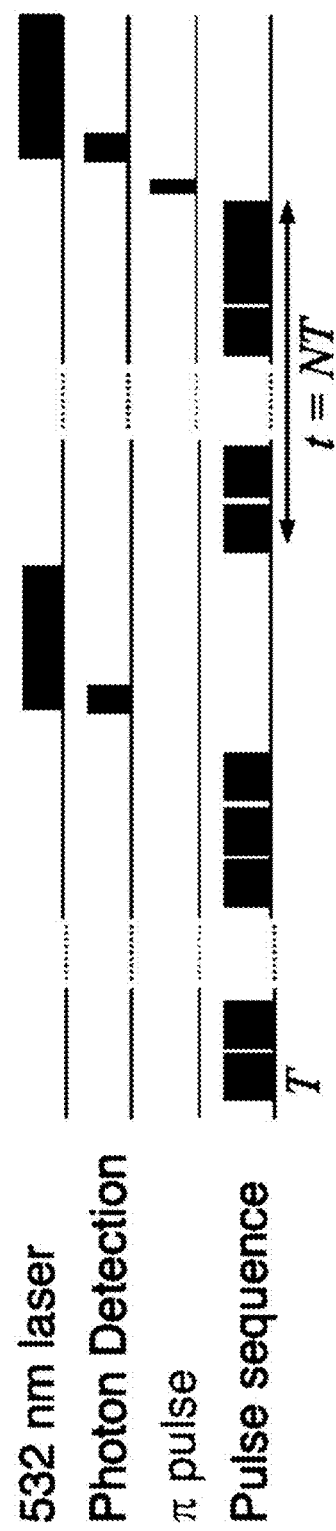

FIGS. 7A-7C show example dynamics of various decoupling sequences, according to some embodiments. The sensitivity to external fields of a spin-based sensor can scales with the coherence time, $T_2$, as $\eta_\nu \propto 1/\sqrt{T_2}$. Consequently, extending $T_2$ is one way to achieve the best performance in a device. The coherence time $T_2$ of the spin ensemble can be obtained by monitoring the dephasing of the total spin magnetization from a polarized initial state. FIG. 7D shows a differential measurement that can be used to probe the spin coherence, with an additional π pulse on the second repetition to reject common-mode noise. In particular, NVs are initialized using pulsed laser excitation at 532 nm (top trace) and read out through emitted photons detected by a single photon counting module (second trace from the top). N repetitions of a sensing sequence unit of length T (bottom trace) and repeat the same measurement with an additional π pulse (second trace from the bottom) acting on the NV centers for differential readout of the spin state.

FIG. 7A illustrates the details of different pulse sequences, XY-8, Sequation A and Sequation B, composed of π/2 and π rotations along 2 and 9 axes, according to some embodiments. In FIG. 7A, white and black bars in Sequation B indicate rotation pulses along the X and Y axis, respectively. The sequence can be described by pulses $P_i$ and the time-dependent frame transformation of the system between the pulses, as shown in FIG. 7B. The orientation of each rotated frame is highlighted by a bolded axis that points along the $\hat{z}$ axis of the fixed external reference frame. Decoupling sequences can be designed by imposing average Hamiltonian conditions on the evolution of the bolded axis. For example, the effects of disorder can be cancelled by implementing an echo-like evolution, $+\hat{\mu} \to -\hat{\mu}$ where $\mu$=x, y, z (top row), and interactions are symmetrized by equal evolution in each of the $\hat{x}$, $\hat{y}$, $\hat{z}$ and $\hat{z}$ axes in the transformed frames (bottom row). Additionally, the pulse sequence can be designed to mutually correct rotation angle errors and finite-pulse effects.

FIG. 7C shows the experimental performance of different sequences, according to some non-limiting experimental observations. In particular, FIG. 7C shows the coherence of an ensemble as a function of time. In addition, ensemble spin coherence is probed under different sequences designed to decouple various types of imperfections (table inset in FIG. 7C). The example decoherence profiles can be fit with a stretched exponential $e^{-(t/T_2)^\alpha}$ (solid curves) to extract the coherence time $T_2$ for each sequence. Simple spin-echo (crosses), XY-8 (circles) and Sequation A (diamonds) show $T_2$=0.98(2) μs, 1.6(1) μs, and 2.8(1) μs with α=1.5(1), 0.66(2), and 0.61(3), respectively. Sequation B (squares), designed to correct for leading order effects of interactions, disorder and control imperfections, performs best at $T_2$=7.9

(2) µs with α=0.75(2). The coherence time of Sequation B is independent of the initial state prepared along $\hat{x}$, $\hat{y}$ and $\hat{z}$ axes, as shown in FIG. 7B.

As shown in FIG. 7C, in some examples of observed dense NV ensemble, the spin echo $T_2$ can be limited to only 1.0 µs, as shown, for example, in FIG. 7C, plotted with X's. One method to extend $T_2$ beyond the spin echo is the XY-8 dynamical decoupling sequence, consisting of equally spaced π pulses along the 2 and 9 axes, as shown in the XY-8 pulse sequence in FIG. 7A. However, the XY-8 sequence only provides a small improvement, leading to $T_2$=1.6 µs (FIG. 7C, squares), despite its capability to decouple sensor spins from environment-induced disorder. Without being bound by theory, this can be explained by the fact that the π rotations in the XY-8 sequence, which globally flip all spins simultaneously, leave interactions between spins unchanged. Therefore, strong spin-spin interactions in a spin system limit the observed XY-8 coherence time.

Example Hamiltonian of a Spin Ensemble

Without being bound by theory, in some embodiments, a spin ensemble, including the applied control fields and the external sensing field, can described by the Hamiltonian $$H = H_0 + H_\Omega(t) + H_{AC}(t), \quad (36)$$

where the internal system Hamiltonian is $$H_0 = \Sigma_i h_i S_i^Z + \Sigma_{ij} \frac{J_{ij}}{r_{ij}^3}(S_i^x S_j^x + S_i^y S_j^y - S_i^Z S_j^Z),$$

containing both on-site disorder and long-range dipolar interactions between spins. Global time-dependent control pulses used for spin manipulations can be given by $H_\Omega(t) = \Sigma_i(\Omega_i^x(t) S_i^x + \Omega_i^y(t) S_i^y)$ and an external target signal by $H_{AC}(t) = \gamma_{NV} B_{AC} \cos(2\pi f_{AC} t - \phi) \Sigma_i S_i^z$. In this example embodiment, $S_i^\mu$ (µ=x, y, z) are spin-½ operators, $h_i$ is a random on-site disorder potential following a normal distribution with standard deviation W=(2π) 4.0 MHz, $J_{ij}/r_{ij}^3$ is the anisotropic dipolar interaction strength between two spins of the same crystallographic orientation at a distance $r_{ij}$ with an average strength of J=(2π) 0.1 MHz at a typical separation. The global control amplitudes, $\Omega_i^{x,y}(t)$, can be position-dependent due to spatial field inhomogeneities, $\gamma_{NV}$ is the gyromagnetic ratio of the NV center, and $B_{AC}$, $f_{AC}$ and $\phi$ are the amplitude, frequency and phase of the target AC signal, respectively.

Example Design Protocol for Designing Pulse Sequences

Without being bound by theory, in order to achieve a significant extension of the spin coherence time $T_2$ in the presence of interactions, a protocol can be used to design pulse sequences that can suppress interactions and disorder, and can be additionally fault-tolerant against rotation angle errors and finite pulse duration effects, according to some embodiments. For example, an average Hamiltonian theory can be applied to engineer the system Hamiltonian through pulsed periodic manipulation of the spins. In some embodiments, a sequence composed of n equidistant control pulses $\{P_k; k=1, 2, \ldots, n\}$ with spacing τ can define a unitary operator over a period T given by $U(T) = e^{-i\tilde{H}_k \tau} \ldots e^{-i\tilde{H}_2 \tau} e^{-i\tilde{H}_1 \tau}$. Here, $\tilde{H}_k = U_k^\dagger H_0 U_k$ are the transformed Hamiltonians in the interaction picture with $U_k = P_k \ldots P_2 P_1$ and $U_n = 1$. In some embodiments, if the pulse spacing τ is much shorter than the corresponding timescales of the system $$\left(\tau \ll \frac{1}{W}, \frac{1}{J},\right.$$

or the dynamics of the many-body state $|\psi(t)\rangle$ can be governed by an effective average Hamiltonian $$H_{ave} = \frac{1}{T}\sum_{k=1}^{n}\tilde{H}_k, \quad (37)$$

such that at $|\psi(t)\rangle = \mathcal{U}(T)^N|\psi(0)\rangle \approx e^{iH_{ave}t}|\psi(0)\rangle$ times t=NT with integer N.

In some embodiments, a pulse sequence can be developed that generates a desirable form of $H_{ave}$ from the original $H_0$ intrinsic to the system. In some embodiments, an ideal pulse sequence can be designed to yield $H_{ave}$=0 and thus preserve quantum coherence for all initial states. In some embodiments where interactions cannot be fully cancelled in the NV ensemble if the system is subject to global spin rotations only, $H_0$ can be engineered to transform into an average Hamiltonian of the Heisenberg interaction form, $$H_{ave} \propto \Sigma_{ij} \frac{J_{ij}}{r_{ij}^3}(\vec{S}_i \cdot \vec{S}_j).$$

Polarized states are eigenstates of this $H_{ave}$, and we therefore expect the coherence of our polarized initial states to be protected.

In some embodiments, without being bound by theory, Hamiltonian engineering can be understood as the result of frame transformations, which rotate the interaction-picture operators (FIG. 7B): for example, a π pulse flips $S_i^z \to -S_i^z$, while a π/2 pulse rotates $S_i^z \to \pm S_i^{x,y}$, with the final sign and axis direction determined by the rotation axis and sign of the pulse. In some embodiments, the average Hamiltonian is uniquely specified by the transformations of the $S^z$ operator in the interaction picture. Without being bound by theory, in some embodiments, using this technique to suppress the effects of disorder, a sequence can be designed such that the operator has an equal duration of evolution in the positive and negative direction for each axis, effectively producing a spin echo along all three axes. To transform the anisotropic dipolar interaction into an isotropic Heisenberg form, the $\hat{x}$, $\hat{y}$, $\hat{z}$ axis directions can be required to appear for an equal amount of time, leading to symmetrization. These two example conditions can allow the choice of decoupling prioritization that best suits the system properties: for spin ensemble where disorder is dominant (W>>J), the echo operation can be performed at a higher rate than interaction symmetrization.

Without being bound by theory, in some embodiments the Hamiltonian analysis presented in the three preceding paragraphs has assumed infinitely short pulses with no errors. In some example applications, such an ideal setting is unrealistic, as imperfections of the average Hamiltonian, $\delta H_{ave}$, can arise from control errors and the finite pulse width. However, the same description of the average Hamiltonian in terms of the interaction-picture $S^z$ operator also allows simple algebraic conditions to be written for suppressing the dominant effects of disorder and interactions during the finite pulses as well as the impact of rotation angle errors. Thus, pulse sequences can be systematically generated that are fault-tolerant to all of these imperfections, to yield a pure Heisenberg Hamiltonian with $\delta H_{ave}=0$.

Without being bound by theory, to illustrate the importance of embodiments of the disclosed robust sequence design, the decoupling efficiency of a pulse sequence (Sequation A in FIG. 7A) can be observed that decouples disorder and interactions in the ideal pulse limit, but does not suppress all pulse-related imperfections. This is a generalization of the WAHUHA sequence, where in addition to the existing interaction symmetrization, the effects of disorder can also be decoupled for finite pulse durations. In some applications, compared with XY-8, only a modest increase in coherence time is observed, $T_2=2.8$ µs (FIG. 7C, diamonds), indicating that the remaining imperfections play an important role. To address these imperfections, the formalism described throughout the present disclosure can be used to design Sequation B, as shown in FIG. 7A, which realizes pure Heisenberg interactions at the average Hamiltonian level. Without being bound by theory, in some embodiments, due to fault-tolerance of Sequation B against all leading-order effects, it shows a significant extension of coherence time compared to the sequences described above, reaching $T_2=7.9$ µs (FIG. 7C, squares). Moreover, the observed coherence time is independent of the initial state. Without being bound by theory, in some embodiments, while the leading-order errors are fully suppressed as designed, numerical simulations indicate that the $T_2$ reached here is limited by higher-order terms originating from the non-commuting nature of transformed Hamiltonians $\tilde{H}_k$ at different times.

Modulation Functions and Optimal Vector Sensing

Without being bound by theory, in some embodiments, the sensitivity of a sequence to an external signal field can be influenced by both by the achievable coherence time and the spectral response of the sequence. For AC magnetic field sensing, one approach to improving sensitivity is to implement a periodic inversion of the spin operator between $S^z$ and $-S^z$ in the interaction picture, driven by a train of equidistant $\pi$ pulses at a separation of $$\frac{1}{2f_{AC}}.$$

This modulation can allow for the cumulative precession of the sensor spin when the AC signal sign change coincides with the frame inversion, resulting in high sensitivity to a signal field at $f_{AC}$.

Without being bound by theory, example decoupling sequences developed using the disclosed protocol explore all three frame directions $S^x$, $S^y$, $S^z$. Similar techniques can be used to design a sensor resonance at the target frequency. In some example embodiments, the criterion for AC selectivity includes periodic frame inversions in each of the three axes. This can be satisfied while at the same time preserving the desired $H_{ave}$, which produces long coherence times through robustness to disorder, interactions and pulse imperfections.

Figure 8A:
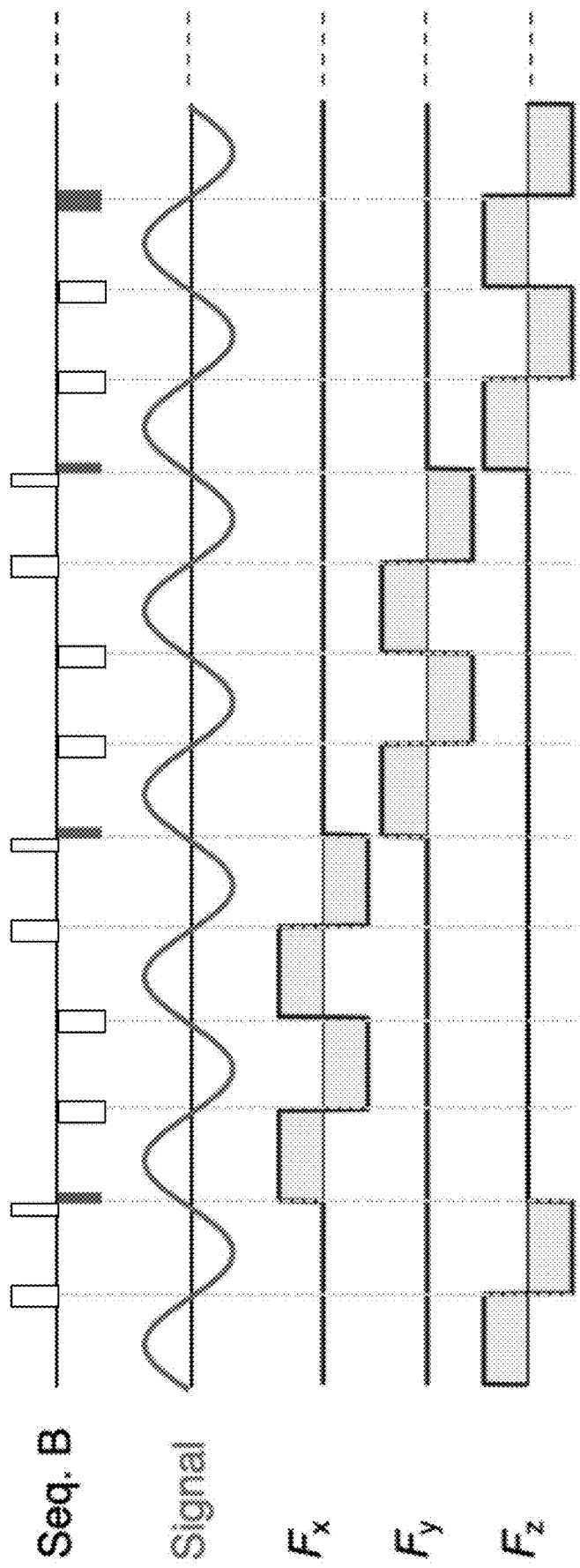
FIGS. 8A-8D show example aspects of an example pulse sequence developed using aspects of the disclosed protocol, according to some embodiments.

FIG. 8A is an illustration showing how to achieve periodic frame inversions while maintaining desired $H_{ave}$ for the example Sequation B described above. In particular, FIG. 8A shows a Pulse sequence (top row) and three-axis time-domain modulation functions (bottom curves) for the first 14 free evolution times of Sequation B. White and black bars in Sequation B indicate rotation pulses along the X and Y axis, respectively. In some embodiments, the modulation period along each axis is synchronized to an AC sensing signal (center sinusoidal curve). In some embodiments, the pulses lead to periodic changes in the sign and orientation of the interaction-picture $S^z$ operator, depicted by the time-domain modulation functions for each axis direction, $F_x$, $F_y$ and $F_z$. As shown in the example shown in FIG. 8A, all three functions exhibit a phase-locked periodic sign modulation, indicating that Sequation B can be resonant with an AC signal oscillating with the same modulation period. Performing the Fourier transforms of $F_\mu(\mu=x, y, z)$, obtains the detailed resonance characteristics of the pulse sequence:

$$\tilde{F}_\mu(f) = |\tilde{F}_\mu(f)|e^{i\tilde{\phi}_\mu(f)} = \frac{1}{NT}\int_0^{NT} e^{-i2\pi f t'} F_\mu(t')dt', \tag{38}$$

where N is the sequence repetition number, T is the duration of the Floquet period, and $\tilde{\phi}_\mu(f)$ is the spectral phase capturing the relative phase difference between different axes.

Figure 8B:
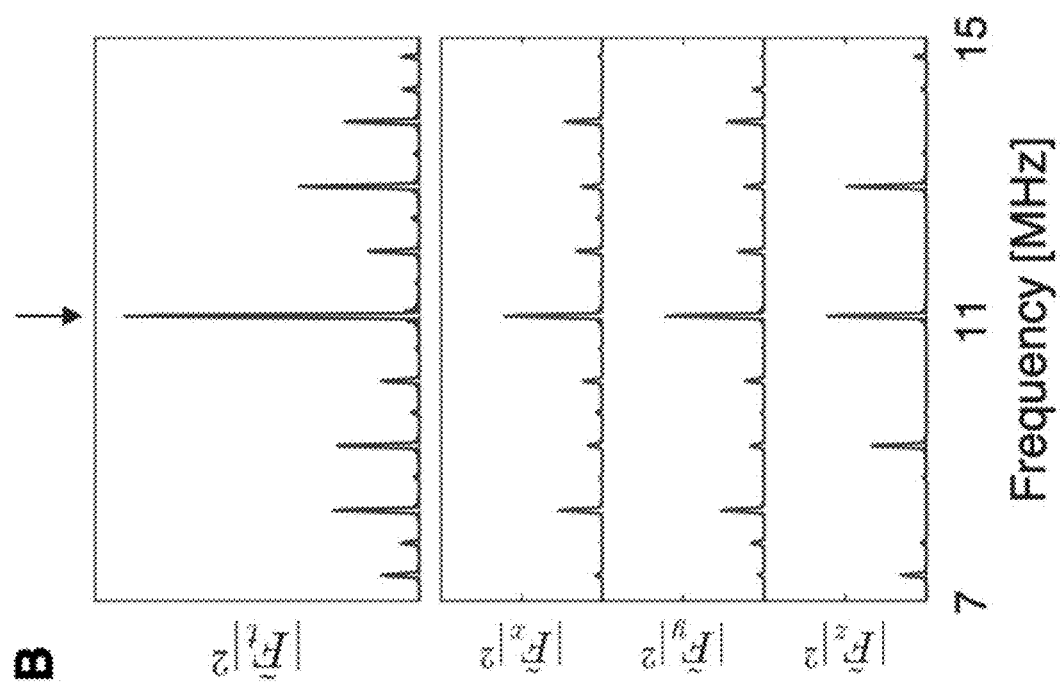

FIG. 8B shows the calculated spectral intensities along different axes, $|\tilde{F}_x(f)|^2$, $|\tilde{F}_y(f)|^2$ and $|\tilde{F}_z(f)|^2$ as well as the total intensity $|\tilde{F}_t(f)|^2$, according to some embodiments. In particular, FIG. 8B shows the frequency-domain modulation function $|\tilde{F}_{x,y,z}(f)|^2$ for Sequation B, with pulse spacing $\tau=25$ ns and $\pi/2$-pulse width $\tau_{\pi/2}=10$ ns. The total strength $|\tilde{F}_t(f)|^2$ is obtained, in the example of FIG. 8B from individual axis amplitudes $\tilde{F}_{x,y,z}(f)$ in consideration of their relative phases in the frequency domain. The principal resonance is highlighted by an arrow, yielding maximum sensitivity. At the dominant resonance of the total intensity (arrow in FIG. 8B), all three axes are phase-locked to each other, leading to constructive phase acquisition and high sensitivity.

Figure 8C:
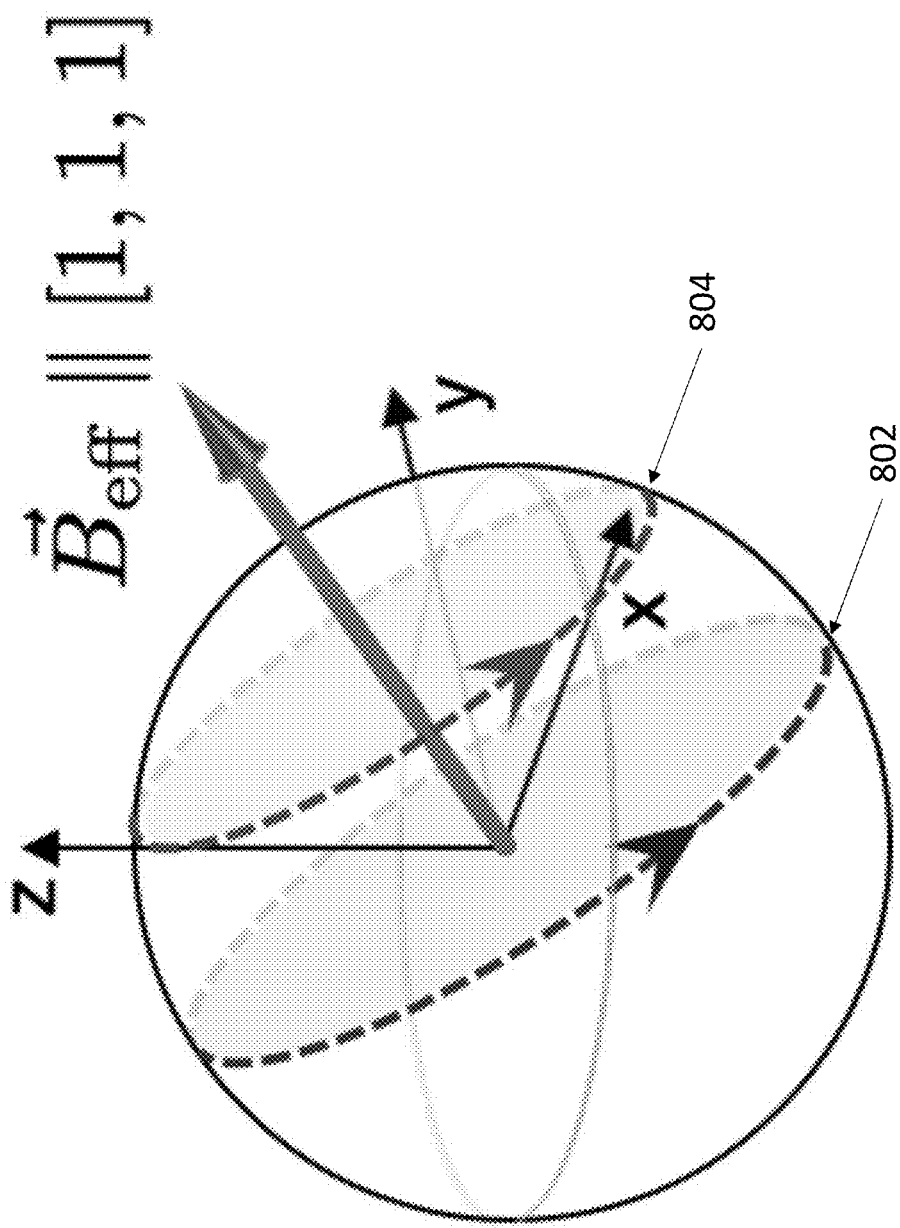

In addition to designing the frequency response of the sequence, in some embodiments optimal spin initialization and readout procedures that provide the best sensitivity can be developed. Without being bound by theory, generalizing the average Hamiltonian analysis to incorporate the AC signal field, the average sensing Hamiltonian can be given by:

$$H_{ave,AC} = \gamma_{NV} B_{AC} \sum_i Re\left[\sum_{\mu=x,y,z} \tilde{F}_\mu(f_{AC})S_i^\mu e^{i\phi}\right] = \gamma_{NV} \sum_i \vec{B}_{eff} \cdot \vec{S}_i, \tag{39}$$

where $\vec{B}_{eff}$ is an effective magnetic field vector in the interaction picture which appears static to the driven spins. In such an example, the spins undergo a precession around $\vec{B}_{eff}$, with the field orientation determined by the frequency-domain modulation functions $\tilde{F}_\mu$ and the strength by the total intensity $|\tilde{F}_t|$ value. For the XY-8 sequence, $\vec{B}_{eff} \propto ([0, 0, 1]$ with $|\tilde{F}_x|=|\tilde{F}_y|=0$ and $|\tilde{F}_z|\neq 0$. In this case, spin initialization into the $\hat{x}$ or $\hat{y}$ axis (perpendicular to $\vec{B}_{eff}$) provides best sensitivity. In some embodiments, implementing the disclosed interaction-symmetrization means that only ⅓ of the total sensing time can be spent along any given axis, resulting in $\vec{B}_{eff} \propto [0, 0, \frac{1}{3}]$ and a significant loss of sensitivity for any interaction decoupling sequence. This can be overcome by making use of the vector nature of $\vec{B}_{eff}$ to achieve optimal sensitivity. Without being bound by theory, in the example Sequation B, the signal at the principal resonance $f_{AC}$ gives rise to $|\tilde{F}_x|=|\tilde{F}_y|=|\tilde{F}_z|$ with $\tilde{\phi}_x=\tilde{\phi}_y=\tilde{\phi}_z$, leading to $\vec{B}_{eff} \propto [\frac{1}{3},\frac{1}{3},\frac{1}{3}]$. The resulting strength $|\vec{B}_{eff}|$ of Sequation B can be limited to $1/\sqrt{3}$ of the value reached in XY-8, due to interaction symmetrization. Under this constraint, sensitivity can be maximized by initializing the spins in a plane substantially perpendicular to the [⅓,⅓,⅓]-direction to allow the largest precession orbit, thereby optimally accumulating phase from the signal. This perpendicular direction is shown in FIG. 8C. In particular, FIG. 8C shows an illustration of the effective magnetic field created by Seq B at the principal resonance, according to some embodiments. In the average Hamiltonian picture, the ẑ-direction sensing field in the external reference frame transforms to the [1,1,1]-direction field $\vec{B}_{eff}$ in the effective spin frame with a reduced strength (18). Optimal sensitivity can be achieved, in some embodiments, by initializing the spins into the plane perpendicular to the effective magnetic field direction. This optimal state preparation can allow the spins to precess along the trajectory with the largest contrast (dashed line 102). For comparison, the precession evolution for initialization to the conventional x̂ axis is shown as dashed line 104.

Figure 8D:
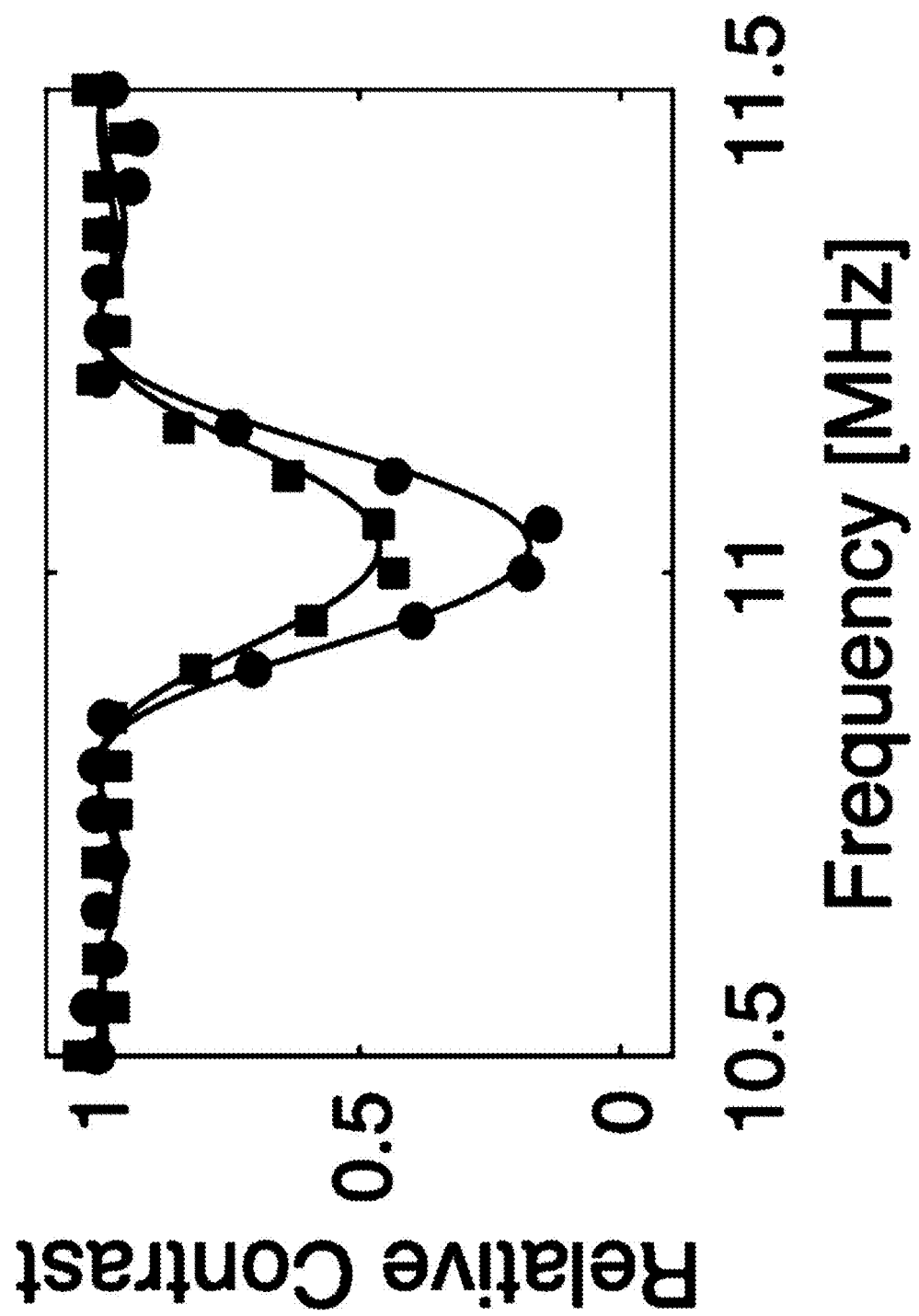

In some embodiments, for spin-state readout, a rotation axis [−1, 1, 0] and an angle of $\cos^{-1}(\sqrt{2/3})$ to rotate the precession plane parallel to the ẑ axis, which can provide maximal signal contrast. FIG. 8D shows sensing resonance spectra near the principal resonance. The optimal initialization (circles) shows greater contrast than the x̂-axis initialization (squares). Square and circular markers indicate experimental data and solid lines denote theoretical predictions calculated from the frequency-domain modulation functions. As shown in FIG. 8D, a larger contrast can be observed when spins are initialized in the optimal direction along [1, 1, −2] (orthogonal to [1, 1, 1]), compared to an initialization in the $\vec{x}$ direction.

EXAMPLE IMPLEMENTATIONS

As discussed above, in some embodiments, the disclosed Sequation B developed in accordance with the disclosed protocol can demonstrate long coherence times and optimal initialization and measurement conditions. Without being found by theory, this section characterizes the sensitivity of example implementations of Sequation B, and compares it to the XY-8 sequence.

Without being bound by theory, magnetic field sensitivity can be described as the minimum detectable signal amplitude per unit time, and can be given by $$\eta = \frac{\sigma_s}{|dS/dB_{AC}|}.$$

Here, S is the sensor signal contrast, $\sigma_s$ is the uncertainty of S for one second of averaging, and $|dS/dB_{AC}|$ is the gradient of S with respect to the field amplitude $B_{AC}$. For sensing non-limiting example measurements, the following parameter values can be selected: a green laser power of 75 μW, repolarization duration of 6 μs, and photon-counting period of 1.2 μs to optimize the absolute sensitivity. For a comparison of the nonlimiting example sensing performances of the two sequences (Sequation B and XY-8), the interrogation time can be independently optimized, the number of periods the sequence can be repeated, as well as the phase and frequency of the AC signal.

Figures 9A, 9B:
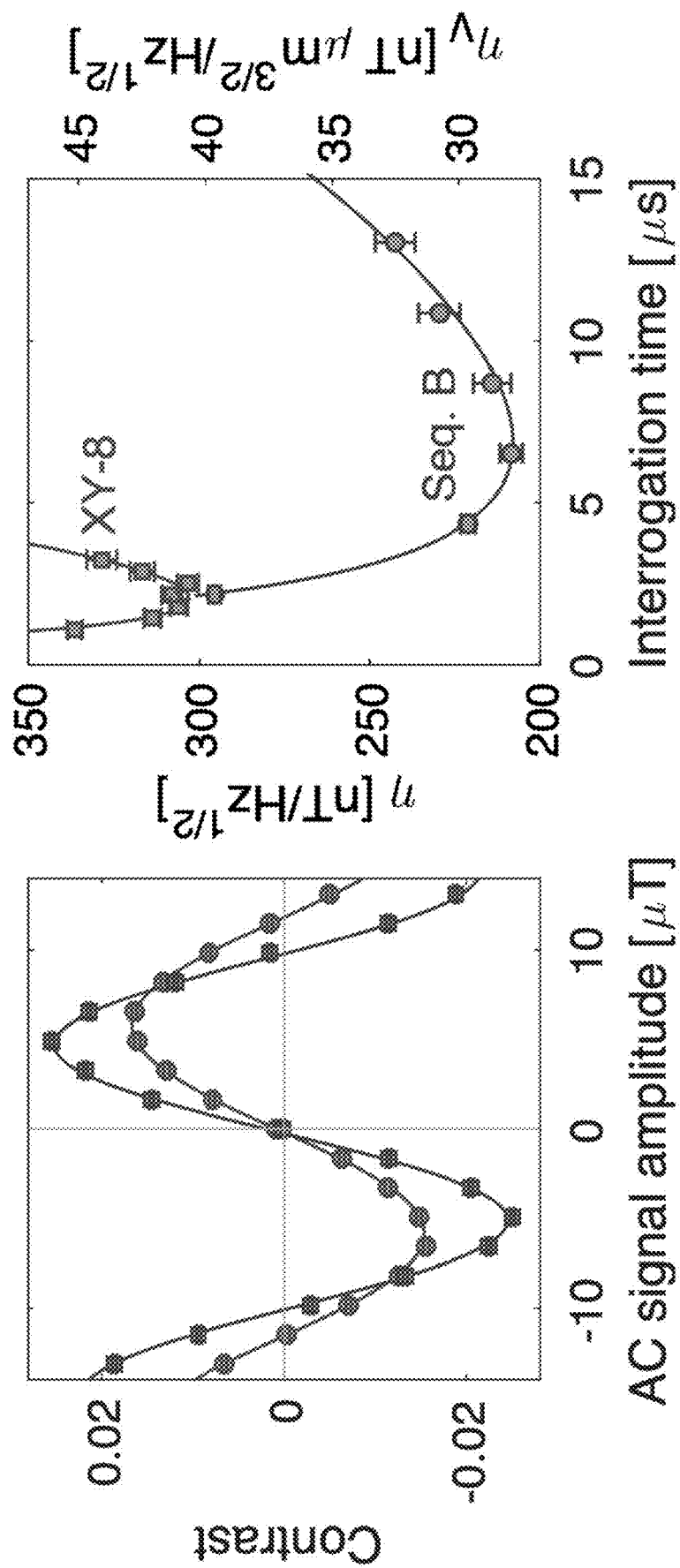
FIGS. 9A-9B show example aspects of XY-8 and Seq. B pulse sequences, according to some embodiments.

FIG. 9A shows the measured contrast S as a function of $B_{AC}$ under Sequation B and XY-8, according to some non-limiting example implementations of embodiments of the present disclosure. In particular, FIG. 9A shows example observed spin contrast as a function of AC magnetic field strength, for the XY-8 sequence (circles) and for an implementation of Sequation B (squares). The example fit is a sinusoidal oscillation with an exponentially decaying profile. As shown in FIG. 9A, this implementation of Seq B shows a steeper slope at zero field, indicating that it is more sensitive than XY-8 to the example sensed external field. The example difference observed in contrast modulation amplitude between the sequences can be associated with different interrogation times t that are independently optimized to achieve maximal sensitivity (with t=2.16 μs for XY-8 and t=6.52 μs for Sequation B). The resonant AC signal can induce a precession of the sensors pins, resulting in sinusoidal modulations of S as a function of $B_{AC}$. For the example initial states and readout directions, the maximum slope $|dS/dB_{AC}|$ is obtained, in this example, at zero signal field using sine magnetometry. This implementation of Sequation B shows a significantly steeper slope than XY-8, indicating that it is more sensitive to the external signal. The example higher contrast and faster oscillations of this implementation of Sequation B result from a combination of its significantly improved coherence time and optimal state preparation and readout schemes, despite a relative sensitivity penalty associated with the reduced strength of $|\vec{B}_{eff}|$.

FIG. 9B shows the sensitivity scaling with interrogation time, according to some embodiments. In particular, FIG. 9B shows extracted absolute sensitivity η and volume-normalized sensitivity $\eta_V = \eta \sqrt{V}$ with sensing volume V=0.018 μm³ as a function of interrogation time t, according to some example implementations. In FIG. 9B, squares indicate implementations of implementation of Sequation B, while circles indicate implementations of XYY-8. A comparison of the two sequences at their respective optimal sensing times reveals that Sequation B outperforms XY-8 by ~30%. Without being bound by theory, the example plotted in FIG. 9B has good agreement with the theoretical prediction $$\eta(t) \propto e^{(t/T_2)^\alpha} \frac{\sqrt{t+T_p}}{t},$$

where α is the exponent of the decoherence profile and $T_p$ is the preparation time needed for sensor initialization and readout.

In some embodiments, by identifying the minimum η value at an optimal sensing time, the example best volume-normalized sensitivity, $\eta_v = \eta\sqrt{V}$, can be extracted for each sequence. Example implementations of Sequation B, designed with the fault-tolerant optimal sensing approach described throughout the present disclosure, reaches more than 30% improvement in sensitivity over the XY-8 sequence. With these enhancements, example implementations demonstrate $\eta_V = 28(1)$ nT·μ.m³/²√Hz for Sequation B.

FIGS. 10A-10E show example implementations of fault-tolerant sequences using dense NV centers in diamond, according to some embodiments. This example implementation uses a DC external magnetic field to split the spin-1 ground state and address the |0⟩ and |−1⟩ levels (see FIG. 1B). The NV electronic spin state can be optically initialized and readout, and manipulated using microwave driving, for example, using the apparatus shown in FIG. 1A. A nano-beam sample is used to limit the probing volume and improve the homogeneity of control fields. The tested sample contains a high density (45 ppm) of NV centers, such that the magnetic dipolar interaction strength is significantly larger than extrinsic decoherence rates, and the coherence times for an XY-8 sequence are interaction limited. Without being bound by theory, in some embodiments this sample confirms various aspects of the disclosed design protocol. The sample has relatively large on-site disorder (~4 MHz) with modest interaction strengths (~100 kHz within a single NV lattice orientation), corresponding to the regime in FIG. 10B where Sequation B is expected to perform significantly better than Sequation A (Cory-48). This is confirmed in the example of FIG. 10A, where Sequation B shows a significantly longer coherence time compared to Sequation A.

Figure 10A:
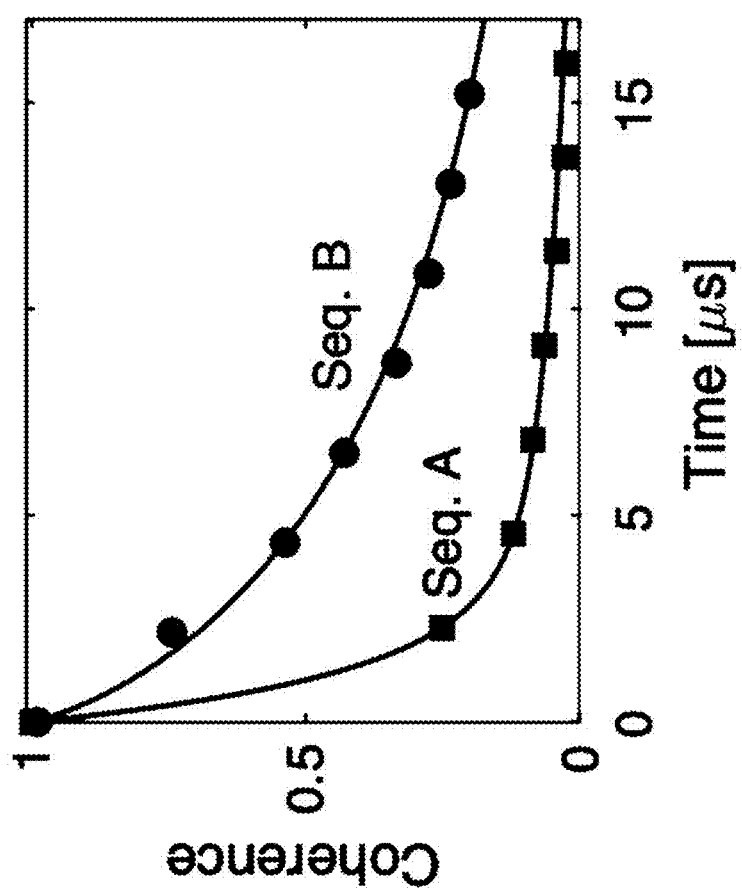
FIGS. 10A-10E show example aspects of implementations of fault-tolerant sequences using dense NV centers in diamond, according to some embodiments.

FIG. 10A is a graph showing a comparison of spin coherence decay under the application of Sequation A (Cory-48, squares) and Sequation B (circles), according to some embodiments. Sequation B, tailored for disorder-dominated systems, outperforms Sequation A in the black diamond system.

Figure 10B:
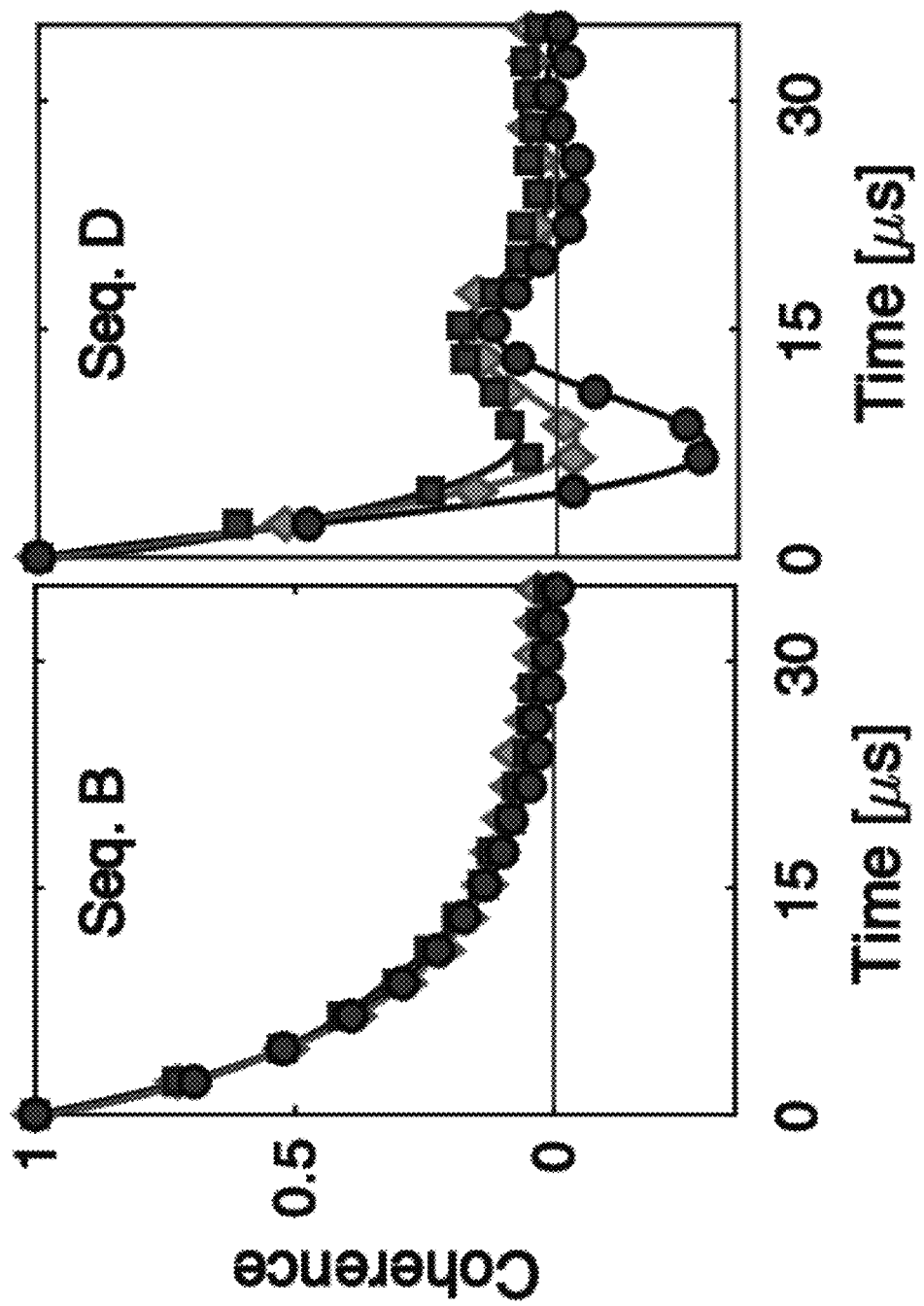
Figure 10C:
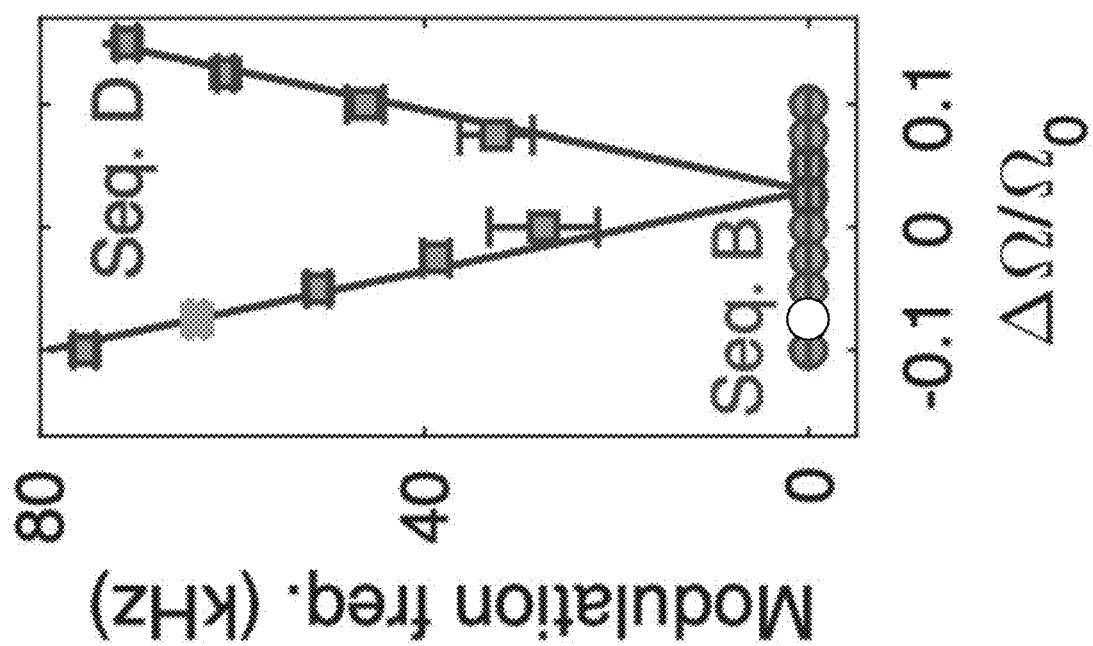

FIG. 10B shows graphs showing sequence robustness conditions with Sequation B (left view) and a slightly modified counterpart Sequation D (right view), which only differs in patching frames and no longer cancels rotation angle errors, according to some embodiments. FIG. 10C is a graph showing modulation frequency for the two sequences B and D as a result of spin rotation errors, as a function of relative rotation angle error, according to some embodiments. FIGS. 10B and 10C can be used to compare the robustness of two different sequences B and D against systematic rotation angle deviations to illustrate the decoupling criteria in the disclosed protocol. Here, Sequation B suppresses rotation angle errors, while Sequation D is almost identical to Sequation B, except the patching frames are permuted in a way to result in a residual rotation angle error. FIG. 10B illustrates the decay profile of the sequence when the rotation angle is chosen to be 92.5% of the correct rotation angle (white circle in FIG. 10C); Sequation B does not show any oscillations, while Sequation D shows pronounced oscillations over time. This behavior is further confirmed in FIG. 10C, the effective rotation frequency of the spin coherence as a function of the systematic rotation angle deviation is extracted. While Sequation B does not show any oscillations, Sequation D shows a linear dependence of modulation frequency as the rotation angle deviation is increased, indicating that it is not robust against such perturbations.

Figure 10D:
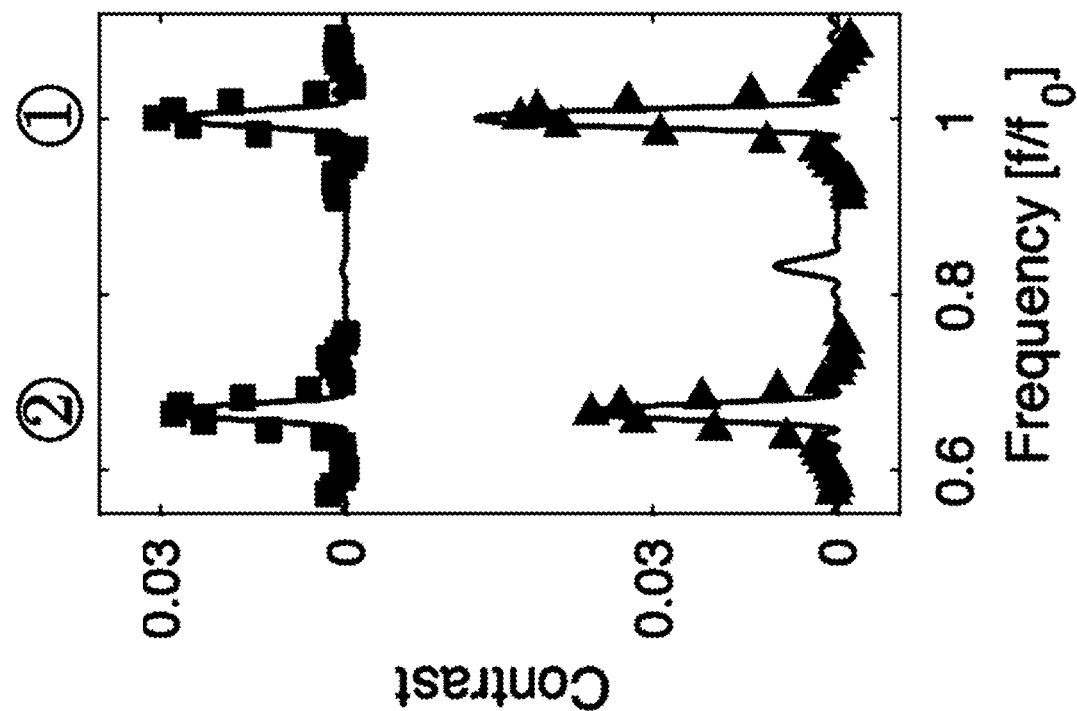

Sequation D shows pronounced oscillations, while Sequation B is much more robust. FIG. 10D shows graphs showing the frequency response of sensing Sequation C for initial states $\vec{x}$: (1, 0, 0) and optimal: (−1, −1, 2)/√6 in squares and triangles, respectively, according to some embodiments. In particular, FIG. 10D shows the contrast change under the presence of an AC magnetic field with varying frequency, for Sequation C discussed throughout the present disclosure. As confirmed by FIG. 10D, the resonances ① and ② have comparable field strengths along each axis, but due to the fact that resonance ① has aligned phases while resonance ② does not, the total field strength is larger for the former. For example, as shown in FIG. 10D, the top view shows the contrast change due to the sensing signal for an $\vec{x}$ initial state, where the two resonances have comparable amplitude. However, as can be seen in the bottom view, the sensing signal induces a much larger change in contrast for the [1,1,1] initialization direction for resonance ①.

Figure 10E:
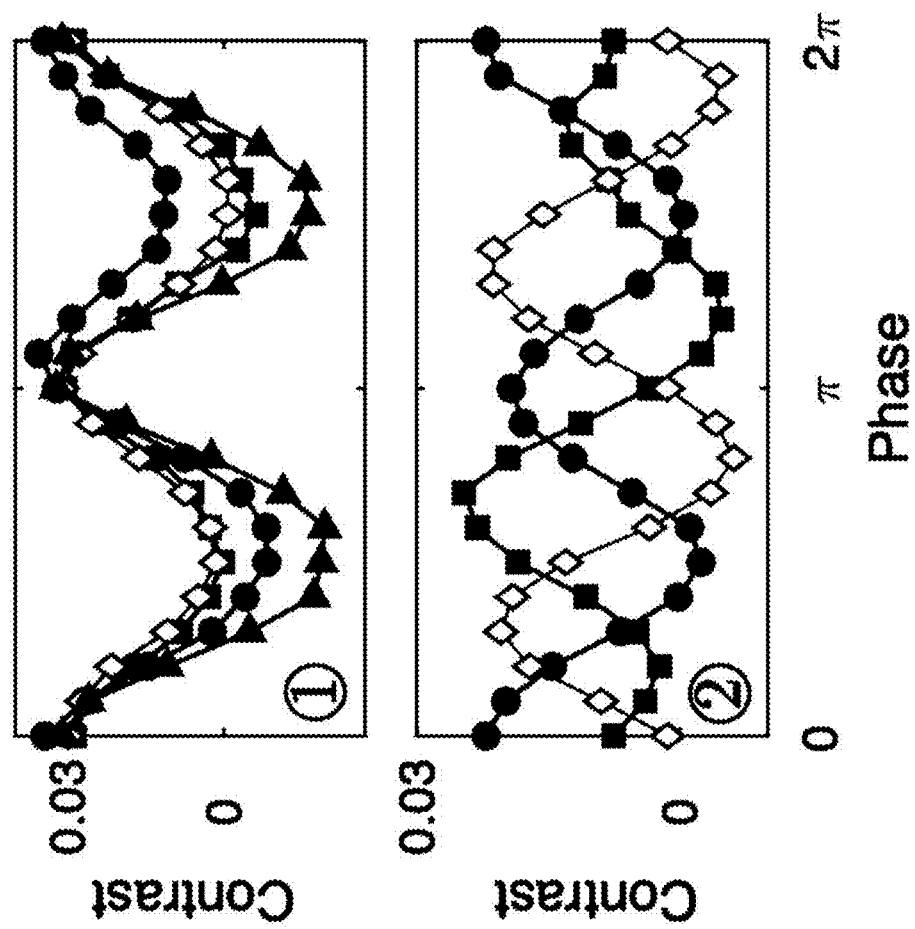

The phase dependence of different axes is further highlighted in FIG. 10E, where the contrast is examined as a function of the phase of the sensing signal. FIG. 10E shows graphs showing the phase response of the sensing signal for Sequation C resonance ① (top) and resonance ② (bottom), with initial states x, y, z and optimal shown in circles, squares, diamonds, and triangles, respectively, according to some embodiments. A 120 degree phase shift between individual initial states can be seen for resonance ② and in-phase response at resonance ①, where the optimal initial state provides highest contrast. For resonance ①, the phase is aligned between the resonances, while for ②, the curves are out-of-phase from each other in terms of their oscillation behavior. Thus, without being bound by theory, to obtain optimal sensitivity, it is desirable to align not just the resonance frequency, but also the relative phase of the contributions from each axis.

Limitations on Sensitivity

One measure of a quantum sensor is the sensor's sensitivity, which can refer to how well the quantum sensor responds to (i.e., picks up) faint or small signals. In order to improve the sensitivity of a quantum sensor, a dense ensemble of individual sensors can be used to take advantage of parallel averaging. For example, without being bound by theory, the sensitivity enhancement with increasing sensor density can be described in some example implementations by the standard quantum limit (SQL) which can take the form $\eta v \propto 1/\sqrt{pT_2}$, where $\eta v$ is the volume-normalized field sensitivity, p is the sensor density and $T_2$ is the relevant coherence time. However, the SQL does not always hold across all densities. For example, in some applications at high densities, the interactions between sensors can increase, which can lead to a decrease in the spin-spin relaxation time $T_2$, which is a measure of the coherence time of a quantum spin. This limit on $T_2$ can arise from interactions that drive thermalization, a process that can lead to a system losing its coherence over time. Consequently, the sensitivity of conventional quantum sensor applications, which often neglect interactions between sensors, can deviate from the SQL beyond a certain critical density and become limited by spin-spin interactions.

Example Application: Efficient Dynamical Decoupling Design

The performance of example applications of pulse sequences designed using the disclosed protocol are described below. A first example application applies the disclosed protocol to design different dynamical decoupling pulse sequences that are targeted towards the suppression of different types of dominant effects. Without being bound by theory, the timescales in which disorder and interaction are decoupled ($T_w$, $T_J$) are compared for different sequences. In some embodiments, these timescales have an effect on the decoupling properties.

FIG. 6, views A-C show aspects of designing pulsed decoupling sequences with robustness to different types of dominant energy scales. FIG. 6, view A is a diagram showing a pulse representation of Sequation A (Cory-48), where axis permutation is performed on the fastest timescale, prioritizing the cancellation of interaction effects. FIG. 6, view B is a diagram showing a pulse representation of Sequation B, where spin echoes are performed on the fastest timescale, prioritizing disorder decoupling. Frame representations for the first 12 free precession intervals of each sequence are shown between view A and view B, including the time-scales for interaction decoupling ($T_J$) and disorder decoupling ($T_W$). FIG. 6, view C is a graph showing $T_2$-decay time for the sequences in view A (Sequation A) and view B (Sequation B) as a function of disorder and interaction strength, where a clear crossover of performance is observed. Pulses are assumed to be infinitesimally short and $\tau=20$ ns.

In the example of FIG. 6, the decoupling performance of the Cory-48 pulse sequence (denoted Sequation A in FIG. 6 view A) is compared to sequence (denoted Sequation B in FIG. 6 view B) design based on the disclosed protocol, over a range of interaction and disorder strengths. The Cory-48 pulse sequence utilizes the solid-echo pulse block, and may be viewed as an example in which interactions are cancelled on a rapid timescale, and disorder is suppressed on a slower timescale ($T_W$ is much longer than $T_J$ in FIG. 6, view A). Additional symmetrization can also be performed to suppress higher-order effects. The example Sequation B shown in FIG. 6 incorporates π pulses to echo out disorder on a rapid timescale ($T_W$ is short in FIG. 6, view B), while also using composite π/2 pulses to suppress all average Hamiltonian effects in the presence of pulse imperfections. It is designed such that the effects of disorder due to the finite pulse duration are also echoed out on the fastest timescale, further improving the robustness against on-site disorder.

Without being bound by theory, given these design considerations, example implementations of the Cory-48 pulse sequence perform better in the regime of large interaction strengths (e.g. NMR), while example implementations of Sequation B to performs better for disorder-dominated systems (e.g. electronic spin ensembles).

This is verified in an example application by performing exact diagonalization simulations of a disordered, interacting ensemble of 12 spins, under a variety of disorder and interaction strengths, with each parameter set averaged over 100 disorder realizations, according to some embodiments. The pulse duration is chosen to be infinitesimally short and $\tau=20$ ns, so that $J\tau$ and $W\tau$ are the only dimensionless parameters of the system. The results are shown in FIG. 6, view C, where a crossover in performance as measured by $T_2$ can be observed as the disorder and interaction strengths are tuned in the system. For the range of interaction strengths chosen, for small disorder values (<1 MHz), Cory-48 (Sequation A) has a longer coherence time. However, as the disorder strength increases, a crossover occurs in which Sequation B starts to perform better. Overall, Sequation B has a fairly stable performance within the range of parameters shown in FIG. 6, view C, while Cory-48 shows a strong susceptibility to disorder. This example illustrates how embodiments of the disclosed protocol enable the systematic design of pulse sequences that are suited for different systems, where the pulse sequence design can be adapted based on the dominant energy scales in the system. With previous approaches that avoid the use of π pulses, a sequence that is designed to dominantly address disorder would not have been possible.

Example Application: Quantum Sensing

Embodiments of the disclosed protocol can also facilitate the design of pulse sequences for quantum sensing in the presence of interactions, disorder, and control inhomogeneities. Without being bound by theory, the sensing properties of a sequence can be captured by the Fourier transform of the first three rows of the frame matrix F. This can also be conceptualized as a generalization of the usual sensing modulation function to the vector case. In embodiments of this disclosed application, the generalized modulation function describes an effective vector magnetic field induced by the sensing signal, and highlights the impact of both the magnitude and relative phase alignment between the components in different directions.

Incorporating AC Sensing Fields into the Protocol:

without being bound by theory, AC sensing can be incorporated into the disclosed protocol by adding an additional Hamiltonian term $$H_s(t) = B(t; \omega, \alpha) S^z, \quad (40)$$

with the target AC sensing magnetic field chosen to be $B(t; \omega, \alpha) = \text{Re}[B_0 \exp(-i\omega t + i\alpha)]$, where Re denotes taking the real part, and $B_0$, $\omega$, $\alpha$ are the amplitude, frequency and phase of the magnetic field. The average Hamiltonian contribution corresponding to the sensing field can be given by $$\bar{H}_s = \frac{1}{T} \int_0^T dt B(t; \omega, \alpha) \sum_\mu F_\mu(t) S^\mu = B_0 \text{Re} \left[ \sum_\mu \tilde{F}_\mu(\omega, \alpha) S^\mu \right], \quad (41)$$

where $F_\mu(t)$ can satisfies $U_c^\dagger(t) S^z U_c(t) = \Sigma_\mu F_\mu(t) S^\mu$, corresponding to the frame matrix $F_{\mu,i}$ combined with intermediate connecting pieces due to finite pulse durations, and $$\tilde{F}_\mu(\omega, \alpha) = |\tilde{F}_\mu(\omega, \alpha)| e^{i(\alpha - \phi_\mu)} = \frac{1}{T} \int_0^T e^{-1(\omega t - \alpha)} F_\mu(t) dt \quad (42)$$

is the frequency domain modulation function, which characterizes the frequency response of a pulse sequence, according to some embodiments.

Without being bound by theory, the resulting Hamiltonian Equation (40) corresponds to a precession around an effective magnetic field specified by $(\text{Re}[\tilde{F}_x(\omega, \alpha)], \text{Re}[\tilde{F}_y(\omega, \alpha)], \text{Re}[\tilde{F}_z(\omega, \alpha)])$, as illustrated in FIG. C, with total magnitude $$|\vec{B}_{eff}(\omega,\alpha)| = B_0 |\tilde{F}_t|^2, = B_0 \sqrt{\sum_\mu |\tilde{F}_\mu(\omega, a)|^2 \cos^2(\alpha - \phi_\mu)} = \quad (43)$$

$$B_0 \sqrt{\sum_\mu |\tilde{F}_\mu(\omega, a)|^2 \frac{1 + \cos[2(\alpha - \phi_\mu)]}{2}} =$$

$$B_0 \sqrt{\frac{1}{2} \left[ \sum_\mu |\tilde{F}_\mu(\omega, a)|^2 + \sum_\mu \text{Re}[\tilde{F}_\mu(\omega, a)]^2 \right]}.$$

Since $\tilde{F}_\mu(\omega, \alpha)^2$ has the complex phase dependence $e^{2i\alpha}$, for a given target field frequency, the preceding field strength has maximum value $$\frac{\max_\alpha |\vec{B}_{eff}(\omega, \alpha)|}{B_0} = \sqrt{\frac{1}{2} \left[ \sum_\mu |F_\mu(\omega, a)|^2 + \left| \sum_\mu F_\mu(\omega)^2 \right| \right]}. \quad (44)$$

Without being bound by theory, the magnetic field sensitivity will then be inversely proportional to the effective field strength.

Figure 11A:
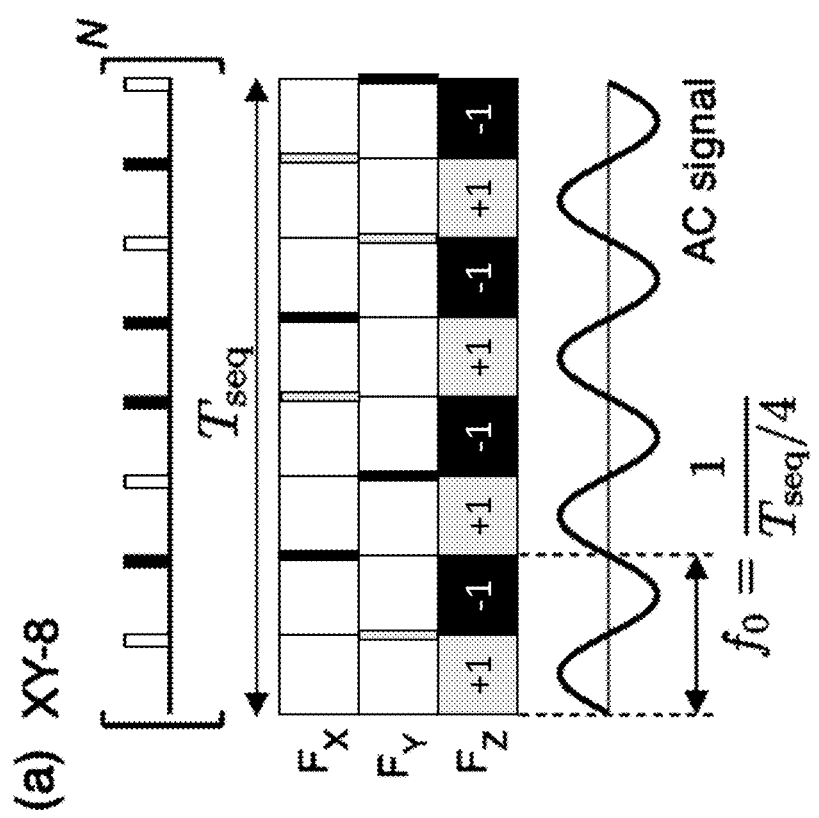
FIGS. 11A-11E show example aspects of XY-8 and Seq. C pulse sequences, according to some embodiments.
Figure 11B:
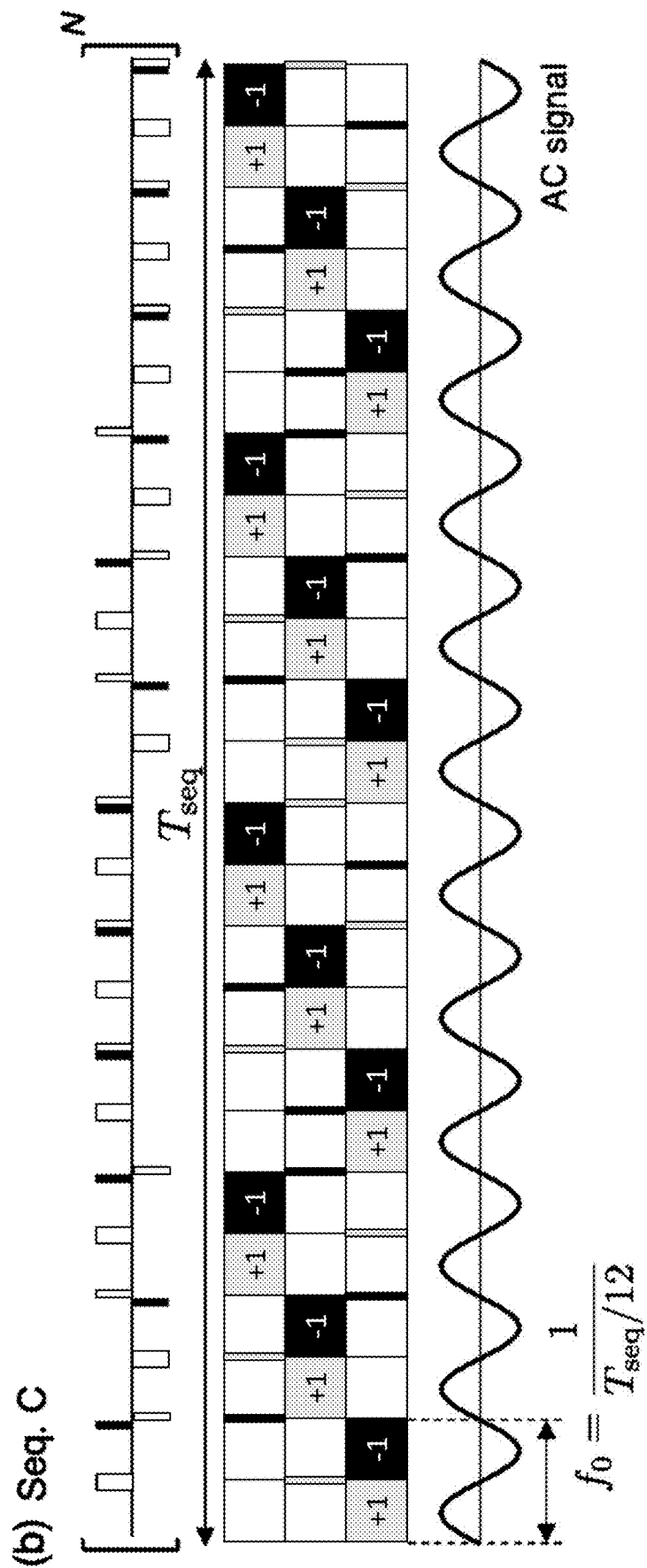

Analysis of Sensing Pulse Sequences:

FIGS. 11A-11E shows example applications of the disclosed protocol for optimal sensing sequence design. FIGS. 11A and 11B are pulse and frame representations of the XY-8 sequence and the fault-tolerant sensing sequence, Sequation C, respectively, according to some embodiments.

Figure 11C:
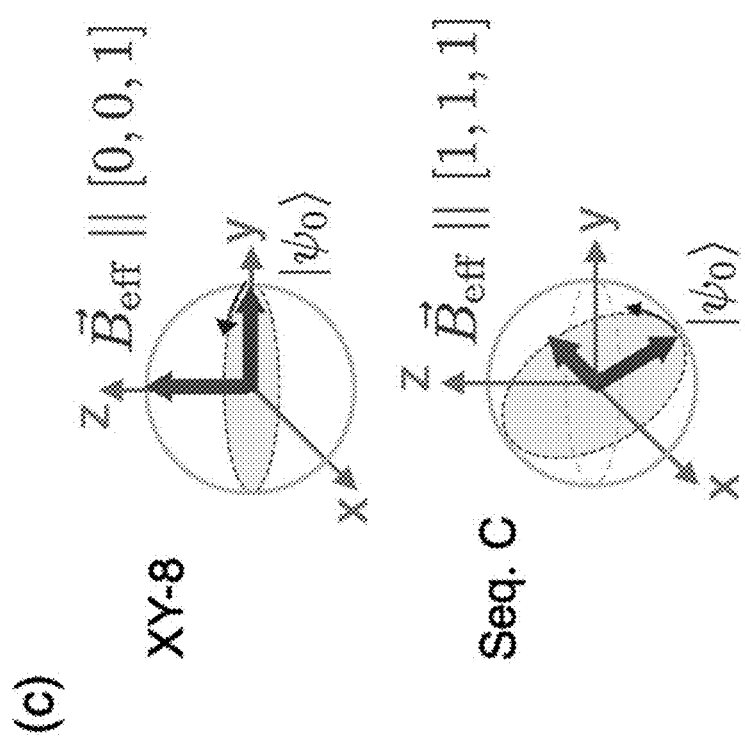
Figure 11D:
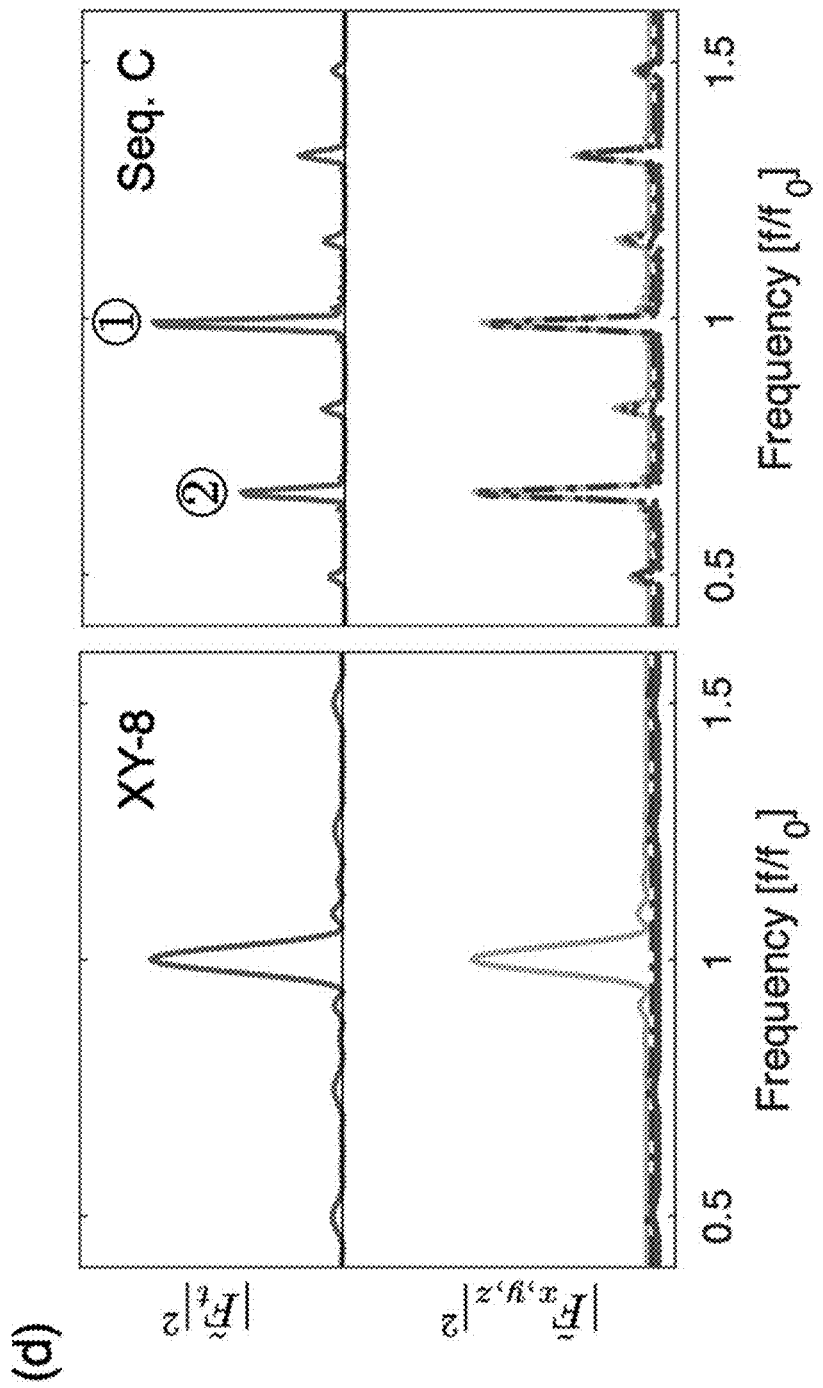
Figure 11E:
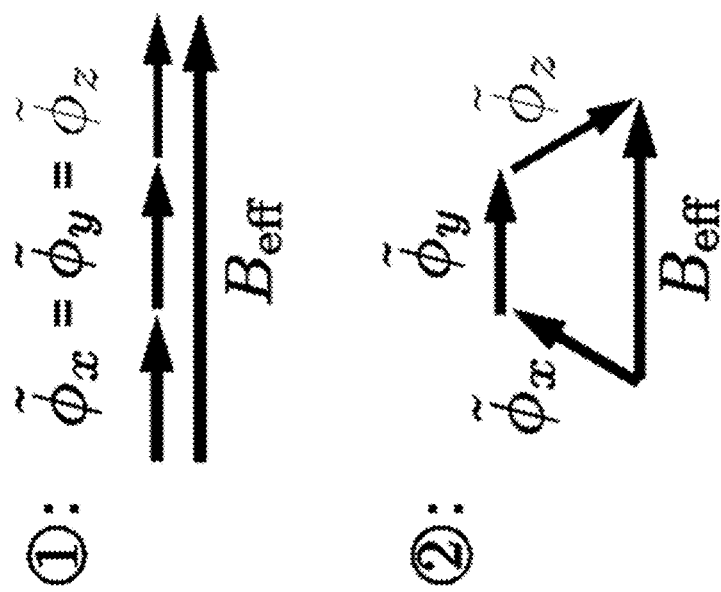

An AC sensing signal with frequency $f_0$ is shown below each sequence. FIG. 11C shows the effective magnetic field Bar generated by the sensing signal for a single-axis sequence (XY-8, top) and a three-axis sensing sequence (Sequation C, bottom), according to some embodiments. Without being bound by theory, the direction of $B_{\it eff}$ determines the optimal initial state for best sensitivity, in some embodiments. FIG. 11D shows a frequency domain filter function for XY-8 (left view) and Sequation C (right view), with total intensity response (upper view) and intensity for each axis x (blue), y (red) and z (yellow), according to some embodiments. In some embodiments, the optimal sensitivity for Sequation C can be achieved when all three axes act in phase (resonance ① at $f=f_0$). If the phase is mismatched, the overall sensitivity can be reduced despite a high individual axis response (resonance ②). FIG. 11E is an illustration of in-phase addition of the response at resonance ①, and out-of-phase response at resonance ②, according to some embodiments.

First, considering the example XY-8 sequence, employed for AC magnetic field sensing with non-interacting spins, as illustrated in FIG. 11A. Without being bound by theory, in the ideal pulse limit, $F_x(t)=F_y(t)=0$; meanwhile, the frame modulations in the z-direction can be well synchronized with an AC signal of frequency $$f_0 = \frac{1}{2\tau},$$

resulting in an effective magnetic field that is pointing in the [0, 0, 1] direction, as shown in the upper view of FIG. 11C, with the maximum possible amplitude $B_M$. This is also directly illustrated in the resonance spectra of the XY-8 sequence (left view of FIG. 11D), where the frequency domain modulation function only has a nonzero $\tilde{F}_z(\omega)$ component (line with a peak around 1), and the other components are zero.

Without being bound by theory, this type of structure where all of the sensing phase accumulation is concentrated along one axis (Z in FIG. 11D left view) can be incompatible with interaction-decoupling, which can require an equal evolution duration along each of the three axes. Redistribution of phase accumulation can be performed to address this problem, which can limit the effective magnetic field strength along any axis to be only approximately $B_M/3$.

In some embodiments of pulse sequences designed using the disclosed protocol, utilizing all three directions of the effective field can make it is possible to make the reduction factor only $\sqrt{3}$ instead, as illustrated in FIG. 11A-11E for Sequation C. In order to improve sensitivity, this sequence can be designed with a synchronous periodic structure along all three axes, such that an AC signal of frequency $$f_0 = \frac{1}{2\tau}$$

can be aligned to efficiently accumulate phase for each of the three axes, as shown in FIG. 11B, in some embodiments. This can results in the frequency domain modulation functions satisfying $|\tilde{F}_x|^2=|\tilde{F}_y|^2=|\tilde{F}_z|^2$ (shown in the right panel of FIG. 11D), and that the resonance peak ① has a total intensity $|\tilde{F}_t|^2$ that is the coherent addition of the individual intensities along each axis (shown as peak ① in FIG. 11E).

Thus, although the field strength in each direction can be limited to around $B_M/3$, use of an effective magnetic field pointing along the (1,1,1)-direction can result in a total field strength of $B_M/\sqrt{3}$. This effective field direction can also use an unconventional spin initialization and readout direction, as illustrated in the lower view of FIG. 11C: instead of preparing the spin in the usual $\vec{x}$ or $\hat{y}$ axis directions, achieving high (e.g., maximal) precession requires preparing the spin in a plane orthogonal to the effective field direction, in some embodiments. Moreover, in some embodiments, to maximize contrast during readout, the precession plane can be rotated to contain the z-axis, which can be equivalent to rotating the precession axis into the $\hat{x}$–$\hat{y}$ plane. Therefore, a rotation around the (1, −1,0) direction of angle arccos $$\left(\sqrt{\frac{2}{3}}\right)$$

can be employed for the readout pulse, while for the initialization pulse, the spin can be rotated around (−1, 1, 0) by arccos $$\left(\sqrt{\frac{2}{3}}\right)$$

into the (−1, −1, 2)/√6 direction for cosine magnetometry, or the spin can be rotated around (1, 1, 0) by π/2 into the (1, −1, 0) direction for sine magnetometry.

Without being bound by theory, in some embodiments, in addition to the amplitude of the frequency domain modulation function, the relative phases can also play a role in determining the resulting sensitivity. This can be the case, for example, for the two different resonance peaks in the right view of FIG. 11D. Unlike resonance ① with frequency $$f = \frac{1}{2\tau}$$

that is illustrated in FIG. 11B, resonance ② has frequency $$f = \frac{1}{3\tau}.$$

At this frequency, the phase of the sensing signal at which precession is maximized can be different for each of the three axes. Consequently, even though the magnitude of the example resonance peaks in each of the three directions is the same, the terms $\tilde{F}_x(\omega, \alpha), \tilde{F}_y(\omega, \alpha), \tilde{F}_z(\omega, \alpha)$ can be 120° out-of-phase from each other, and in Equation (44), the contribution of the second term is not maximized for resonance ②, as also illustrated pictorially in the bottom view of FIG. 11E. In contrast, for resonance ①, the signal phase that gives rise to maximal phase accumulation along each of the three axis directions is identical, and the contributions will coherently add up.

As a result, in some embodiments, although the resonance peak heights for each axis direction can be slightly lower for resonance ① compared to resonance ②, the total field sensitivity can be higher for the former. Consideration of both the amplitude and the phase of the frequency domain modulation functions can therefore have an effect on sensitivity.

Without being bound by theory, in some embodiments, the preceding analysis demonstrates that the disclosed protocol can serve as a tool for the design of quantum sensing pulse sequences in the presence of interactions, disorder, and control imperfections. In addition to the scenarios explicitly described in the present disclosure, the average Hamiltonian approach can provide a characterization of other effects such as spurious harmonics, which cab show up as additional undesired spectral resonances in the total modulation function.

These results can also be applicable to gradient-based magnetic resonance imaging experiments with oscillating gradients. One limitation of some implementations of this approach is that at large target sensing field amplitudes, the rotations induced by the sensing field may not commute with the rotations designed to achieve decoupling and cancellations, and can result in a reduction of the disorder and interaction decoupling efficiencies. The disclosed protocol can be used to design pulse sequences that combat such issues.

Algebraic Constraints and Optimality:

Without being bound by theory, in some embodiments, optimizing for magnetic field sensitivity can also impose new algebraic constraints. The techniques described throughout the present disclosure can be used to explore constraints on the structure of pulse sequences, as well as optimality of sensing sequences.

First, without being bound by theory, maintaining high sensitivity for AC magnetic field sensing can be incompatible with some embodiments of the algebraic rules above for any pulse sequence that uses a single pulse for $\pi/2$ rotations, and require the use of composite pulse rotations to overcome. For sensing purposes and in order to decouple on-site disorder as rapidly as possible, it can be desirable to have a periodic structure in which the free evolution periods have frame directions that alternate between +1, −1, as shown in the example of sequence C in FIG. 11B. However, this can imply that any interface between two frame orientations can have a fixed parity, and which can lead to interaction cross terms for the case of a simple $\pi/2$ transformation. Thus, in some embodiments, a composite pulse structure, in which each $\pi/2$ rotation is realized by a combination of two $\pi/2$ pulses, can be utilized as shown in FIG. 6, view B.

In addition, without being bound by theory, the maximum possible effective field strength in the limit of ideal pulses can be determined, in some embodiments. While the effective field direction [1,1,1] can be close to optimal, it can in fact be further improved slightly by adding an imbalance between the phase accumulation along each axis, in some embodiments. While the sum of the phase accumulation along all axes can be fixed, the effective field strength can depend on the sum of squares of the phase accumulation. Thus, the effective field strength can be increased when the phase accumulation is different along the three axes, which can be achieved by choosing the frame along one of the axes to be at the troughs of the sinusoidal signal, such that there is more phase accumulation, in some embodiments. In the case of finite pulse durations, unequal free evolution times along each axis can be chosen to further increase the imbalance and improve sensitivity.

Example Application: Quantum Simulation

While embodiments of the disclosed protocol can enable the design of effective dynamical decoupling sequences and optimal sensing sequences, in which the effects of disorder and interaction terms are suppressed, it can also be readily adapted to engineer various Hamiltonians.

For example, without being bound by theory, in some embodiments, when the conditions equations (15, 16) for decoupling different disorder and interaction effects are not satisfied, the magnitude of the residual term can precisely correspond to the remaining average Hamiltonian of the system. For example, if all other conditions are satisfied, but, $\Sigma_k F_{x,k}=a\neq 0$ then the average Hamiltonian will be $$\tilde{H}_{eff} = \frac{a}{N}\Sigma_i \Delta_i S_i^x.$$

Similarly, uniform single-body terms can be engineered via, for example, intentional detuning or systematic rotation angle deviations, disordered single-body terms via incomplete cancellation of onsite fields, disordered Ising interactions along each axis via incomplete symmetrization between the three axes, and/or disordered XY-type interactions via incomplete cancellation of cross terms.

Without being bound by theory, a few constraints can exist on the form of the two-body interaction Hamiltonian. For example, the Heisenberg component of the interaction can remain invariant, since it is not transformed under global rotations. In another example, some of the Hamiltonian terms can transform in the same way (for instance disorder and imaginary spin exchange), and consequently cannot be independently engineered. In another example, the resultant Hamiltonian can experience a rescaling in magnitude, due to the finite projection of the initial Hamiltonian onto the final Hamiltonian. Eventually, contributions from higher-order terms in the Magnus expansion can also become important, but in the presence of a relatively strong target engineered Hamiltonian, higher-order terms that do not commute with the target Hamiltonian can be largely suppressed.

As a nonlimiting example of the range of Hamiltonians that may be engineered, the different possible interactions that a native interaction of the form $H_{int}$=XX+YY−ZZ (for example, as realized in the spin-½ subspace of interacting spin-1 NV centers) can be transformed. Without being bound by theory, in some embodiments, by evolving for a duration $(1-c)T$ under this original Hamiltonian, and using $\pi/2$ pulses to transform the Hamiltonian and evolve under ZZ+XX−YY and YY+ZZ−XX for duration $cT/2$ each, the average Hamiltonian can be written as $$\tilde{H}_{eff}=(1-c)(XX+YY)+(2c-1)ZZ, \quad (45)$$

which depending on the value of c, can be continuously varied between an integrable Ising interaction (c=1), a Heisenberg interaction (c=⅔), and an XY interaction (c=½). Combined with the techniques for robust engineering of other terms in the Hamiltonian, such that imperfections are suppressed, this facilitates access a broad range of interacting, disordered Hamiltonians, with different thermalization properties. Thus, the disclosed protocol can also serve as a powerful tool for the robust Floquet engineering of many-body Hamiltonians, for example, for quantum simulation.

The invention claimed is:
1. A method of reducing disorder and interaction effects in a spin system, the method comprising:
applying a sequence of electromagnetic pulses to the spin system, the spin system having a frame orientation in an evolution period $\tau_0$ before a first pulse k=1 of the sequence of electromagnetic pulses; and altering the frame orientation of the spin system with each electromagnetic pulse in the sequence of pulses, each electromagnetic pulse being one or more of a $\pi/2$ rotation or a $\pi$ rotation, the frame orientations during the sequence conforming to the following relations:

$$\sum_k F_{\mu k} \tau_k = 0, \text{ and}$$

$$\sum_k |F_{xk}|\tau_k = \sum_k |F_{yk}|\tau_k = \sum_k |F_{zk}|\tau_k,$$

where $F_{\mu k}$ represents the frame orientation of the spin system in a respective evolution period of duration $\tau_k$ after pulse k for each spin direction $\mu$=x, y, z, and where k=0 corresponds to the frame orientation $F_{\mu 0}$ in the evolution period before the first pulse k=1.

2. The method of claim 1, wherein the sequence of electromagnetic pulses is periodic, and the pulses are equally spaced.

3. The method of claim 1, wherein at least one electromagnetic pulse of the sequence of electromagnetic pulses includes two or more $\pi/2$ rotations, and the spin system further comprises intermediary frame orientations representing the frame orientation of the spin system after each but a final $\pi/2$ rotation, the intermediary frame orientations conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction $\mu$=x, y, z.

4. The method of claim 1, wherein for each $\pi$ rotation, the frame orientation of the spin system further comprises an intermediary frame orientation representing the frame orientation of the spin system after the first $\pi/2$ rotation of the $\pi$ rotation, intermediary frame orientations together conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction $\mu$=x, y, z.

5. The method of claim 1, wherein for each pair of axes $\mu,\mu$=x, y, z, the parity of frame changes sums to zero such that $$\sum_k F_{\mu,k} F_{v,k+1} + F_{\mu,k+1} F_{v,k} = 0,$$

for $(\mu, v)$=(x, y), (x, z), (y, z).

6. The method of claim 1, wherein the chirality of frame changes sums to zero such that the cyclic sum $$\sum_k \vec{F}_k \times \vec{F}_{k+1} = \vec{0},$$

where $\hat{F}_k = \Sigma_\mu F_{\mu,k} \vec{e}_\mu$ and $\vec{e}_\mu$ are the unit vectors along axis directions.

7. The method of claim 1, further comprising:
generating an effective magnetic field $\vec{B}_{eff}$ as seen by the driven spins; and
initializing the frame orientation of the spin system to be perpendicular to the effective magnetic field.

8. The method of claim 1, wherein the sequence of electromagnetic pulses is used to increase the coherence time of an ensemble of nitrogen-vacancy (NV) centers in diamond beyond a spin-spin interaction sensitivity limit.

9. The method of claim 1, wherein the sequence of electromagnetic pulses is used to increase the coherence time of a magnetic field sensing ensemble of nitrogen-vacancy (NV) centers in diamond such that a sensitivity of the magnetic field sensing ensemble of NV centers overcomes a spin-spin interaction sensitivity limit.

10. A system, comprising:
a quantum sensor comprising an ensemble of spins in solid state, the ensemble of spins having a density in which the interactions between the spins limit a coherence time of the ensemble of spins in solid state; and
a pulse generator configured to apply electromagnetic radiation to the quantum sensor, the electromagnetic radiation decoupling the interactions between the spins to increase the coherence time beyond a spin-spin interaction sensitivity limit of the ensemble of spins when measuring a target signal.

11. The system of claim 10, wherein the quantum sensor comprising an ensemble of NV centers in diamond of density r ppm, and the coherence time is increased to be longer than a value of 72/r us (as determined from the scaling of the interaction limit), up to 1 ms.

12. The system of claim 10, wherein the pulse generator applies electromagnetic radiation to the quantum sensor according to the method of claim 1.

13. A system comprising:
a spin system; and
a pulse generator configured to a sequence of electromagnetic pulses to the spin system, the spin system having a frame orientation in an evolution period $\tau_0$ before a first pulse k=1 of the sequence of electromagnetic pulses, each electromagnetic pulse corresponding to a frame of the sequence of pulses, and each electromagnetic pulse being one or more of a $\pi/2$ rotation or a $\pi$ rotation, the frame orientations during the sequence conforming to the following relations:

$$\sum_k F_{\mu k} \tau_k = 0, \text{ and}$$

$$\sum_k |F_{xk}|\tau_k = \sum_k |F_{yk}|\tau_k = \sum_k |F_{zk}|\tau_k,$$

where $F_{\mu k}$ represents the frame orientation of the spin system in a respective evolution period of duration $\tau_k$ after pulse k for each spin direction $\mu$=x, y, z, and where k=0 corresponds to the frame orientation $F_{\mu 0}$ in the evolution period before the first pulse k=1.

14. The system of claim 13, wherein the sequence of electromagnetic pulses is periodic, and the pulses are equally spaced.

15. The system of claim 13, wherein at least one electromagnetic pulse of the sequence of electromagnetic pulses includes two or more $\pi/2$ rotations, and the spin system further comprises intermediary frame orientations representing the frame orientation of the spin system after each but a final $\pi/2$ rotation, the intermediary frame orientations conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction $\mu$=x, y, z.

16. The system of claim 13, wherein for each $\pi$ rotation, the frame orientation of the spin system further comprises an intermediary frame orientation representing the frame orientation of the spin system after the first $\pi/2$ rotation of the $\pi$ rotation, intermediary frame orientations together conforming to the following relations:

$$\sum_k F_{\mu v} = 0,$$

$$\sum_k |F_{xv}| = \sum_k |F_{yv}| = \sum_k |F_{zv}|$$

where $F_{\mu v}$ represents the frame orientation of the spin system for each intermediary frame v for each spin direction $\mu$=x, y, z.

17. The system of claim 13, wherein for each pair of axes $\mu,\mu$=x, y, z, parity of frame changes experienced by the spin system sums to zero such that $$\sum_k F_{\mu,k} F_{v,k+1} + F_{\mu,k+1} F_{v,k} = 0,$$

for $(\mu, v)$=(x, y), (x, z), (y, z).

18. The system of claim 13, wherein chirality of frame changes experienced by the spin system sums to zero such that the cyclic sum $$\sum_k \vec{F}_k \times \vec{F}_{k+1} = \vec{0},$$

where $\hat{F}_k = \Sigma_\mu F_{\mu,k} \vec{e}_\mu$ and $\vec{e}_\mu$ are the unit vectors along axis directions.

* * * * *